United States Patent
Fujii

(10) Patent No.: US 7,800,204 B2
(45) Date of Patent: Sep. 21, 2010

(54) SEMICONDUCTOR DEVICE AND METHOD OF FABRICATING THE SAME

(75) Inventor: Hidenori Fujii, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/329,987

(22) Filed: Dec. 8, 2008

(65) Prior Publication Data
US 2010/0025827 A1     Feb. 4, 2010

(30) Foreign Application Priority Data
Jul. 31, 2008   (JP) .............................. 2008-198338

(51) Int. Cl.
*H01L 29/868*   (2006.01)
(52) U.S. Cl. .............. 257/656; 257/657; 257/E29.336
(58) Field of Classification Search ............... 257/655, 257/656, 657, 596, E29.327, E29.344
See application file for complete search history.

(56) References Cited

U.S. PATENT DOCUMENTS

| | | | | |
|---|---|---|---|---|
| 5,627,402 A | * | 5/1997 | Takemura | 257/596 |
| 5,811,873 A | * | 9/1998 | Soejima | 257/655 |
| 5,977,611 A | * | 11/1999 | Sittig et al. | 257/603 |
| 6,737,731 B1 | * | 5/2004 | Shenoy | 257/656 |

FOREIGN PATENT DOCUMENTS

| | | |
|---|---|---|
| EP | 1 030 375 A1 * | 8/2000 |
| JP | 58-162071 * | 9/1983 |
| JP | 60-27175 | 2/1985 |
| JP | 1-501030 | 4/1989 |
| JP | 02-044717 | 2/1990 |
| JP | 03-049232 | 3/1991 |
| JP | 03-261180 | 11/1991 |
| JP | 5-335600 | 12/1993 |
| JP | 08-316500 | 11/1996 |
| JP | 09-321320 | 12/1997 |
| JP | 10-200132 | 7/1998 |
| JP | 2003-224281 | 8/2003 |
| JP | 2005-64429 | 3/2005 |
| JP | 2007-59801 | 3/2007 |
| JP | 2007-158320 | 6/2007 |
| JP | 2008-251679 | 10/2008 |
| WO | WO 00/16408 | 3/2000 |

* cited by examiner

*Primary Examiner*—Mary Wilczewski
(74) *Attorney, Agent, or Firm*—Oblon, Spivak, McClelland, Maier & Neustadt, L.L.P.

(57) ABSTRACT

A semiconductor device includes a stepwise impurity layer provided at one of an anode portion and a cathode portion of the semiconductor device by introducing an impurity of a predetermined conduction type from a major surface of the semiconductor substrate through to a first depth to provide a first region of the semiconductor substrate having the impurity of the predetermined conduction type introduced therein. The predetermined conduction type is a same conduction type as a conduction type of the one of the anode portion and the cathode portion. The stepwise impurity layer is further provided by melting a second, predetermined region of the semiconductor substrate having a second depth deeper than the first depth and including the first region to make uniform the impurity of the predetermined conduction type in a concentration from the major surface through to the second depth to provide a uniform stepwise impurity concentration profile.

15 Claims, 50 Drawing Sheets

T2. WHEN RECOVERY STARTS

SEMICONDUCTOR DEVICE AND METHOD OF FABRICATING THE SAME

BACKGROUND OF THE INVENTION

1. Field of the Invention

The present invention relates generally to semiconductor devices and methods of fabricating the same, and particularly to semiconductor devices having diodes and methods of fabricating the same.

2. Description of the Background Art

In recent years, inverter devices used for example in the field of industrial electric power devices employ an insulated gate bipolar transistor (IGBT) or a similar switching element with a freewheeling diode connected thereto in parallel. One such freewheeling diode is a PIN diode. Conventionally, as such PIN diodes, there exist a diffusion diode and an epitaxial diode.

A diffusion diode has an n buffer layer formed by diffusing an n type impurity from a surface of an n type semiconductor substrate. The diffused impurity forms the n buffer layer with an impurity concentration profile having a gentle slope. Accordingly, when the PIN diode switches from an on state to an off state, or at recovery, a reverse recovery current flowing through the PIN diode in an opposite direction gradually decreases. Such recovery is referred to as soft recovery.

Furthermore, an epitaxial diode has an $n^-$ epitaxial layer formed on a surface of an n type semiconductor substrate by epitaxial growth to serve as a drift layer. In the epitaxial diode, the semiconductor substrate serving as a cathode has a high n type impurity concentration. As such, it is believed that a modulation level causing conductivity modulation increases and forward voltage can be decreased. A document disclosing a diffusion diode is for example Japanese Patent Laying-open No. 2007-059801.

However, conventional semiconductor devices have disadvantages, as follows: First, a diffusion diode has an n buffer layer having an impurity concentration profile gently decreasing as seen from a cathode toward an anode. This provides a nature that hardly increases the modulation level and provides an increased on resistance, and cannot decrease forward voltage. Furthermore, the n buffer layer is relatively large in thickness, and this provides a nature providing an increased total amount of carriers that are discharged at recovery, resulting in increased switching loss (or recovery loss).

Furthermore, an epitaxial diode has an impurity concentration profile rising steeply from an $n^-$ epitaxial layer to an n type semiconductor substrate, and this provides a nature decreasing electrons that have been injected in the on state at recovery rapidly so that oscillation is facilitated.

On the other hand, semiconductor devices applied to some inverter circuits are required to reduce forward voltage, rather than recovery loss, or vice versa.

SUMMARY OF THE INVENTION

One object of the present invention is to provide a semiconductor device that can provide with precision a desired characteristic accommodating the product applied, and another object of the present invention is to provide a method of fabricating such semiconductor device.

The present semiconductor device comprises a semiconductor substrate of a first conduction type, an anode portion of a second conduction type, and a cathode portion of the first conduction type. The semiconductor substrate of the first conduction type has a first major surface and a second major surface opposite to each other. The anode portion of the second conduction type is adjacent to the first major surface of the semiconductor substrate. The cathode portion of the first conduction type is adjacent to the second major surface of the semiconductor substrate. A stepwise impurity layer is provided at at least one of the anode portion and the cathode portion by introducing an impurity of a corresponding predetermined conduction type from a surface of the semiconductor substrate through to a first depth to provide a first region of the semiconductor substrate having the impurity of the predetermined conduction type introduced therein and by melting a second, predetermined region having a second depth deeper than the first depth and including the first region to uniform the impurity of the predetermined conduction type in concentration from the surface through to the second depth to provide a stepwise impurity concentration profile.

The present method of fabricating a semiconductor device includes the steps of: providing an anode portion at a first major surface of a semiconductor substrate of a first conduction type; and providing a cathode portion at a second major surface of the semiconductor substrate opposite to the first major surface, and at least one of the steps of providing the anode portion and providing the cathode portion includes: introducing an impurity of a corresponding predetermined conduction type at a surface of the semiconductor substrate from the surface to a first depth to provide a first region of the semiconductor substrate having the impurity of the predetermined conduction type introduced therein; and melting a second, predetermined region having a second depth deeper than the first depth and including the first region to uniform the impurity of the predetermined conduction type in concentration from the surface through to the second depth to provide a stepwise impurity layer having a stepwise impurity concentration profile.

EFFECT OF THE INVENTION

The present semiconductor device including a stepwise impurity layer having a stepwise impurity concentration profile allows a modulation level, recovery loss and the like to be modified with precision to accommodate the product applied.

The present method of fabricating a semiconductor device introduces an impurity of a corresponding predetermined conduction type at a surface of a semiconductor substrate from the surface to a first depth to provide a first region of the semiconductor substrate having the impurity of the predetermined conduction type introduced therein, and melts a second, predetermined region having a second depth deeper than the first depth and including the first region to uniform the impurity of the predetermined conduction type in concentration from the surface through to the second depth to provide a stepwise impurity layer having a stepwise impurity concentration profile. The stepwise impurity layer, which can be varied in concentration and in which region the layer is provided, allows a modulation level, recovery loss and the like to be modified with precision to accommodate the product applied.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Hereinafter will be described a PIN diode having at a cathode an n$^+$ layer having a stepwise impurity concentration profile.

Figure 1:
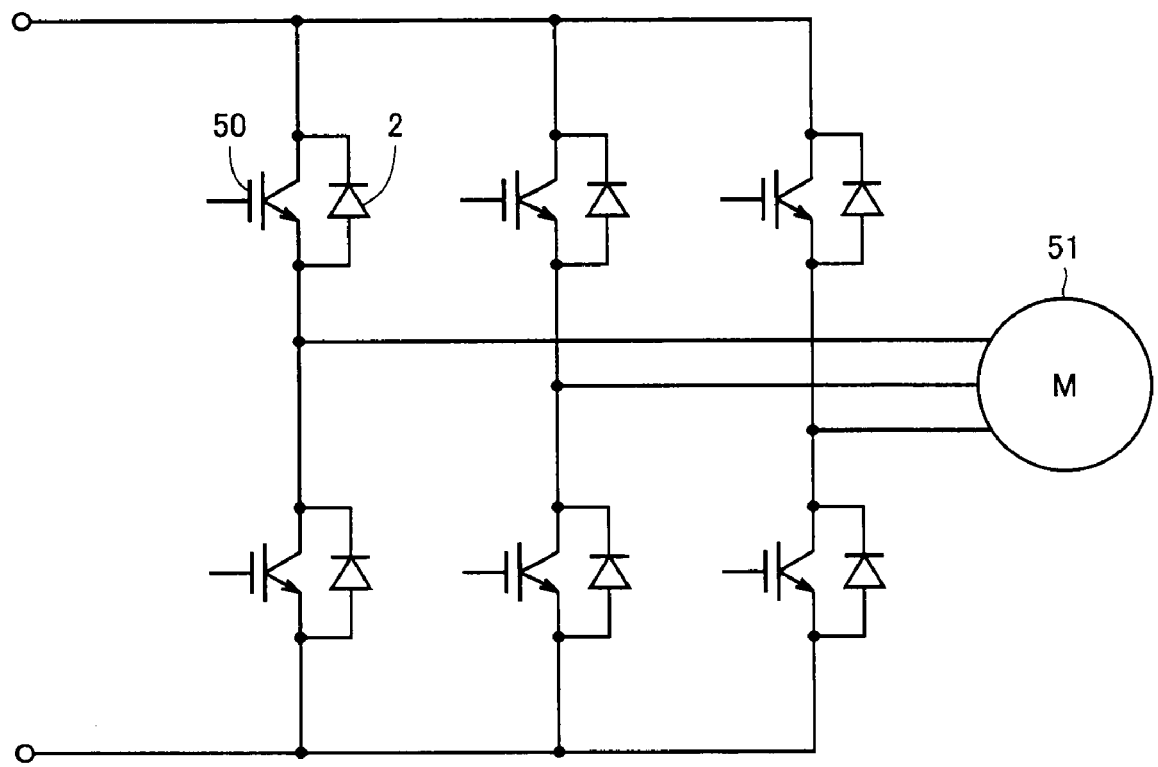
FIG. 1 is a circuit diagram showing one example of an inverter circuit of an inverter device having a PIN diode of each embodiment of the present invention applied thereto.

Initially, FIG. 1 shows an inverter circuit of an inverter device controlling an inductive load, that has the PIN diode applied thereto. As shown in FIG. 1, the inverter device is provided with an IGBT 50 controlling electric power supplied to an inductive load 51, and a PIN diode 2 serving as a path for a freewheeling current provided from inductive load 51.

Figure 2:
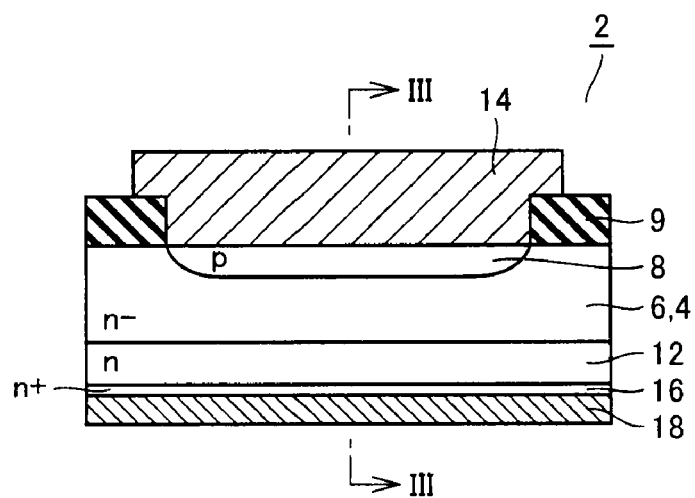
FIG. 2 is a cross section of a PIN diode of a first embodiment of the present invention.

As shown in FIG. 2, PIN diode 2 has an n$^-$ drift layer 6, a p anode layer 8, an n buffer layer 12, an n$^+$ layer 16, a front surface electrode 14, and a back surface electrode 18. P anode layer 8 is provided at an n type semiconductor substrate 4 from a first major surface of the substrate to a predetermined depth of the substrate. P anode 8 is surrounded on the first major surface by a silicon oxide film 9. Front surface electrode 14 is provided on a surface of p anode layer 8 in contact with the surface of p anode layer 8.

N$^+$ layer 16 is provided at semiconductor substrate 4 from a second major surface of the substrate to a predetermined depth of the substrate. N buffer layer 12 is in contact with n$^+$ layer 16 and has a further deeper region. N$^-$ drift layer 6 is provided in the semiconductor substrate at a region located between p anode layer 8 and n buffer layer 12. Back surface electrode 18 is provided on a surface of n$^+$ layer 16 in contact with n$^+$ layer 16.

Figure 3:
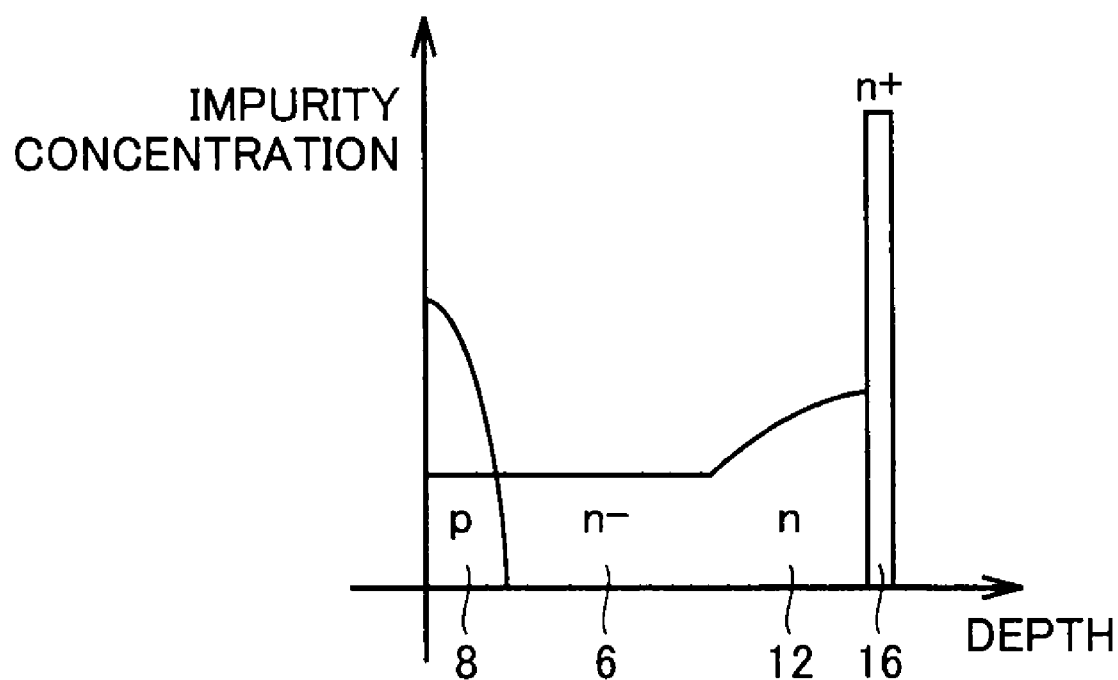
FIG. 3 shows an impurity concentration profile in the first embodiment at a cross sectional line III-III shown in FIG. 2.

PIN diode 2 has an impurity concentration, as will be described hereinafter. As shown in FIG. 3, n$^+$ layer 16 has an impurity concentration having a stepwise profile substantially fixed for a predetermined depth measured from the second major surface. N buffer layer 12 has an impurity concentration gently decreasing as seen at n$^+$ layer 16 toward n$^-$ drift layer 6. N$^-$ drift layer 6 has an impurity concentration reflecting that of semiconductor substrate 4 and thus substantially fixed depthwise. P anode layer 8 has an impurity concentration relatively steeply decreasing as seen at the first major surface toward n$^-$ drift layer 6.

The present PIN diode having n$^+$ layer 16 having a stepwise impurity concentration profile allows electrons to be injected from n$^+$ layer 16 more efficiently to achieve an increased modulation level, as will be described hereinafter.

Figure 4:
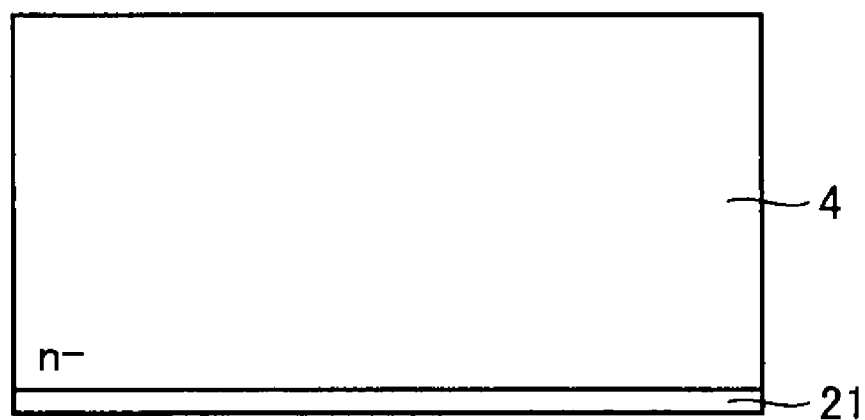
FIG. 4 is a cross section for illustrating a step of a method of fabricating the FIG. 2 PIN diode in the first embodiment.

The PIN diode described above is fabricated in a method, as will be described hereinafter. Initially, as shown in FIG. 4, semiconductor substrate 4 is provided at a surface (the second major surface) with a phosphorus diffusion source 21 to diffuse phosphorus into semiconductor substrate 4 for example to a depth of approximately 250 μm to provide n buffer layer 12 (see FIG. 5). Subsequently on a surface (the first major surface) of semiconductor substrate 4 a silicon oxide film (not shown) is deposited. On the silicon oxide film a predetermined resist pattern (not shown) is deposited for providing the p anode layer.

Figure 5:
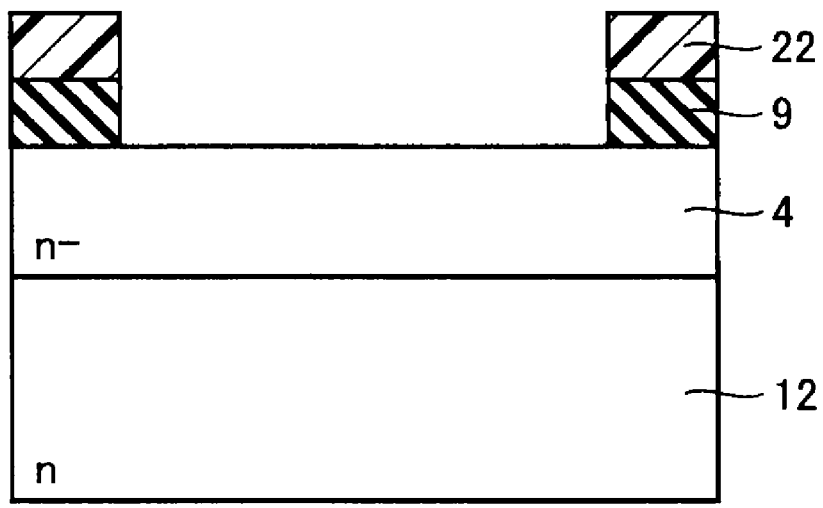
FIGS. 5-12 are cross sections for illustrating steps following those shown in FIGS. 4-11, respectively.
Figure 6:
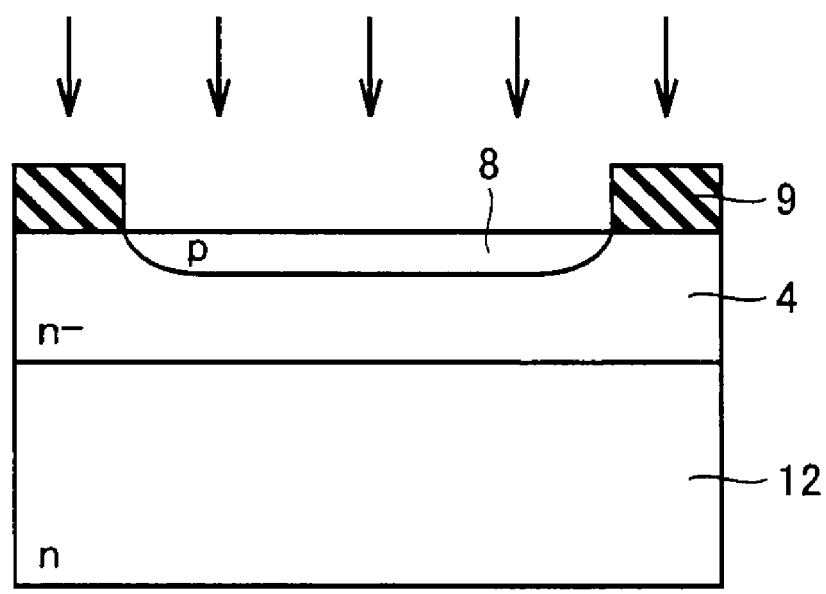
Figure 7:
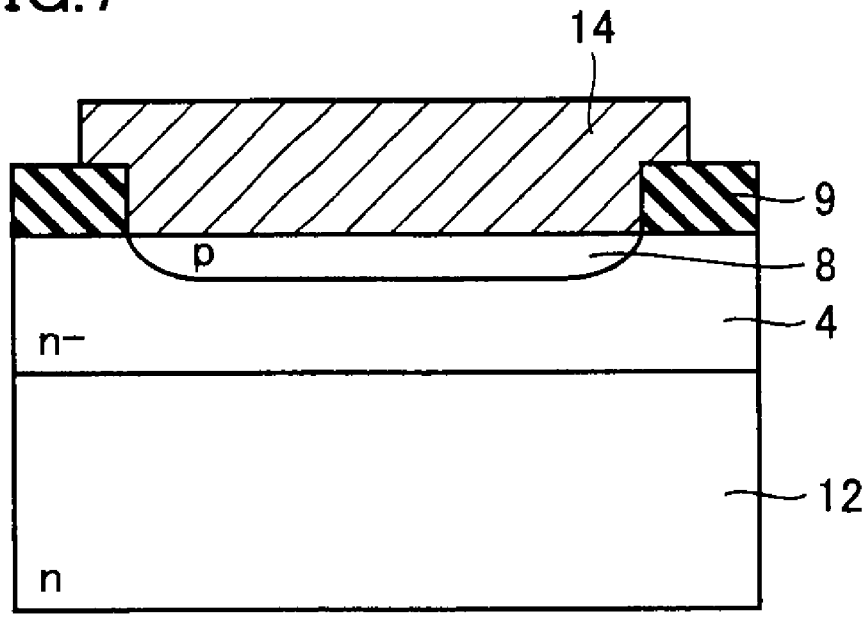

Subsequently, as shown in FIG. 5, with resist pattern 22 used as a mask, silicon oxide film 9 is anisotropically etched to provide an opening exposing a surface of semiconductor substrate 4. Subsequently, resist pattern 22 is removed. Then, thermal oxidation is performed to provide an underlying oxide film (not shown) at a surface of semiconductor substrate 4. Then, as shown in FIG. 6, with injection energy of 50 KeV and a dose of $1\times10^{12}/cm^2$, boron is injected into a surface of semiconductor substrate 4 and the intermediate product undergoes a heat treatment at 1,200° C. for approximately two hours to provide p anode 8 activated. Subsequently, aluminum film (not shown) is deposited on semiconductor substrate 4 to cover p anode 8. The aluminum film undergoes photolithography, as predetermined, and is etched to provide front surface electrode 14, as shown in FIG. 7.

Figure 8:
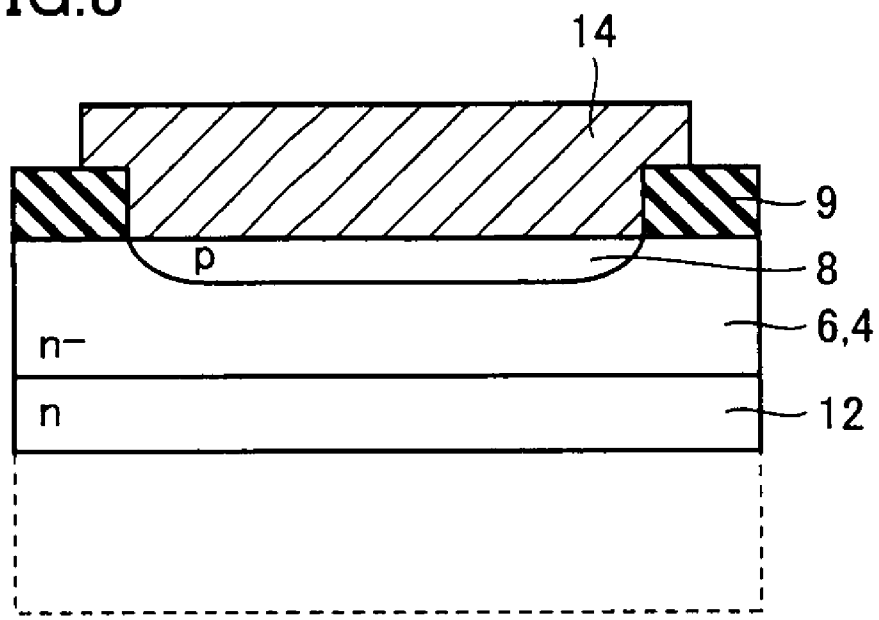
Figure 9:
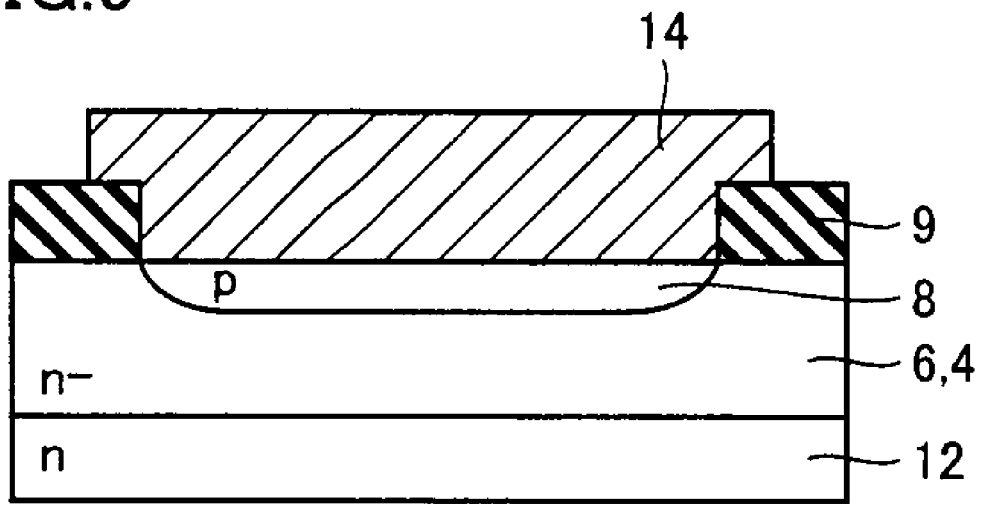

Then, as shown in FIG. 8, semiconductor substrate 4 has the second major surface ground to have a desired thickness. Subsequently, the intermediate product is wet etched to remove a layer that has been damaged (not shown) as it was ground. Semiconductor substrate 4 thus has a clean surface exposed, as shown in FIG. 9.

Figure 10:
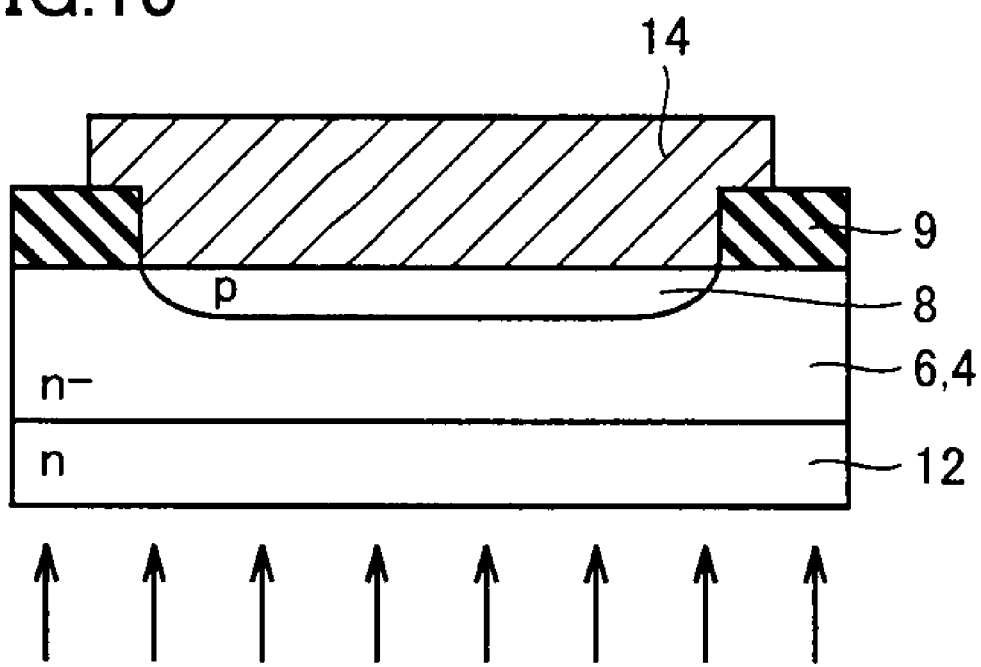
Figure 11:
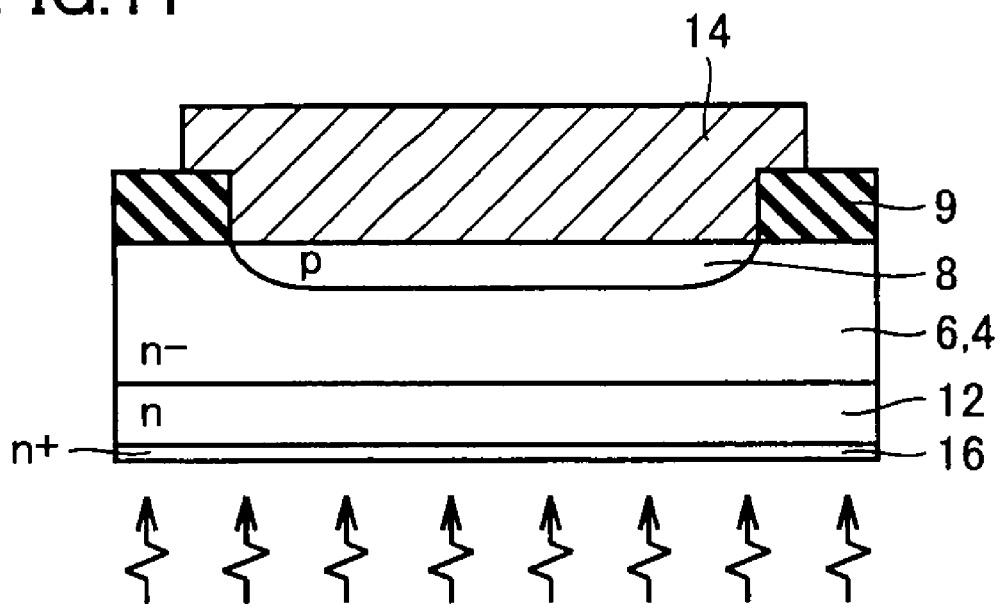

Then, as shown in FIG. 10, with injection energy of 50 KeV and a dose of $5\times10^{15}/cm^2$, phosphorus is injected into a surface of semiconductor substrate 4. Then, as shown in FIG. 11, a laser annealing step is performed. More specifically, for example, the semiconductor substrate's second major surface having phosphorus injected therein is exposed to at least tens W of YAG laser light to melt a region having a predetermined depth from the second major surface to include the phosphorus-injected region to provide a uniform concentration of phosphorus as seen depthwise. N$^+$ layer 16 having a stepwise impurity concentration profile is thus provided.

Figure 12:
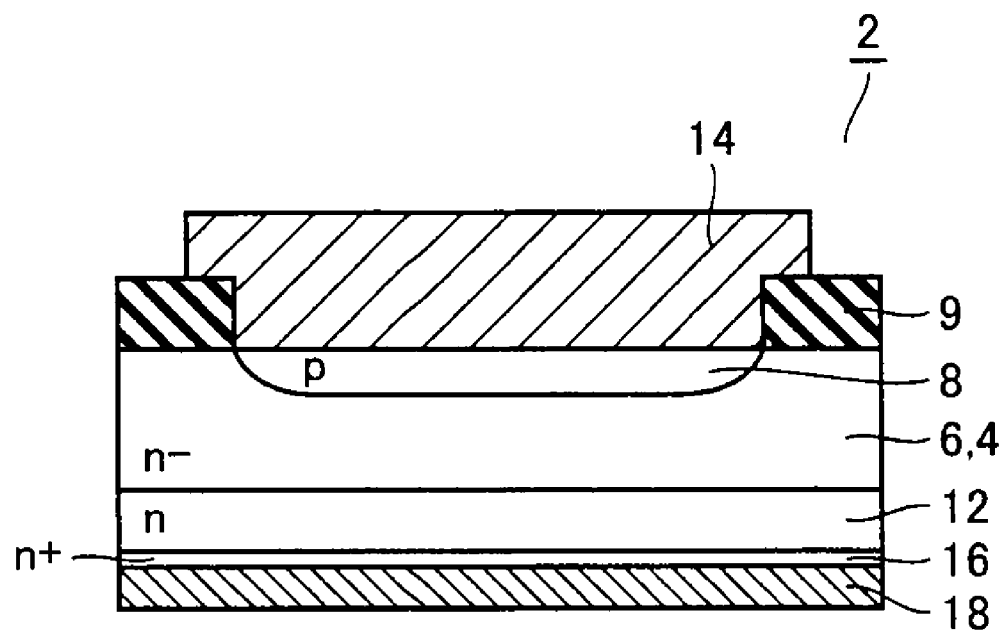

Subsequently, the intermediate product undergoes a heat treatment at a relatively low temperature (of approximately 350° C.) for approximately two hours to recover crystal defect. Then, as shown in FIG. 12, titanium, nickel and gold (Ti—Ni—Au) are deposited on a surface of n$^+$ layer 16 to deposit back surface electrode 18. PIN diode 2 thus completes.

The present PIN diode 2 can have n$^+$ layer 16 having a stepwise impurity concentration profile and n$^+$ layer 16 can have the impurity concentration varied to adjust forward voltage, recovery loss, and the like to accommodate the product applied. This will more specifically be described with a diffusion diode and an epitaxial diode as comparative examples.

Figure 13:
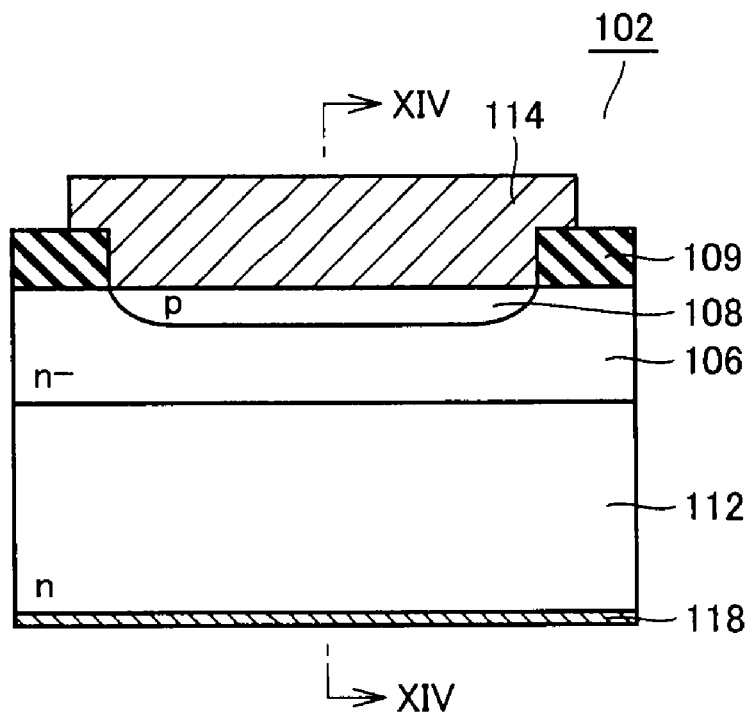
FIG. 13 is a cross section of a diffusion diode according to a first comparative example.
Figure 14:
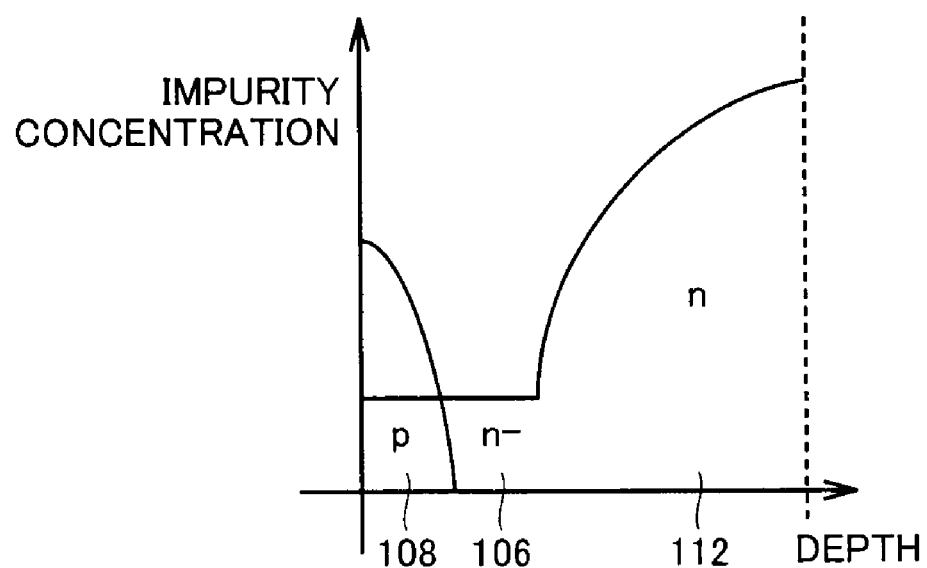
FIG. 14 shows an impurity concentration profile at a cross sectional line XIV-XIV shown in FIG. 13.

Initially as a first comparative example a diffusion diode will be described. As shown in FIG. 13, a diffusion diode 102 includes an n$^-$ drift layer 106, a p anode layer 108, an n buffer layer 112, a front surface electrode 114, and a back surface electrode 118. N buffer layer 112 is provided by diffusing an n type impurity from a second major surface of an n type semiconductor substrate, and, as shown in FIG. 14, has an impurity concentration profile gently decreasing as seen at the second major surface of the semiconductor substrate toward n$^-$ drift layer 106.

Figure 15:
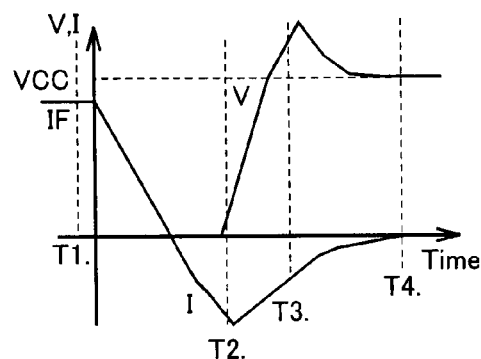
FIG. 15 is a graph representing how the diffusion diode's current and voltage vary at recovery with time.
Figure 16:
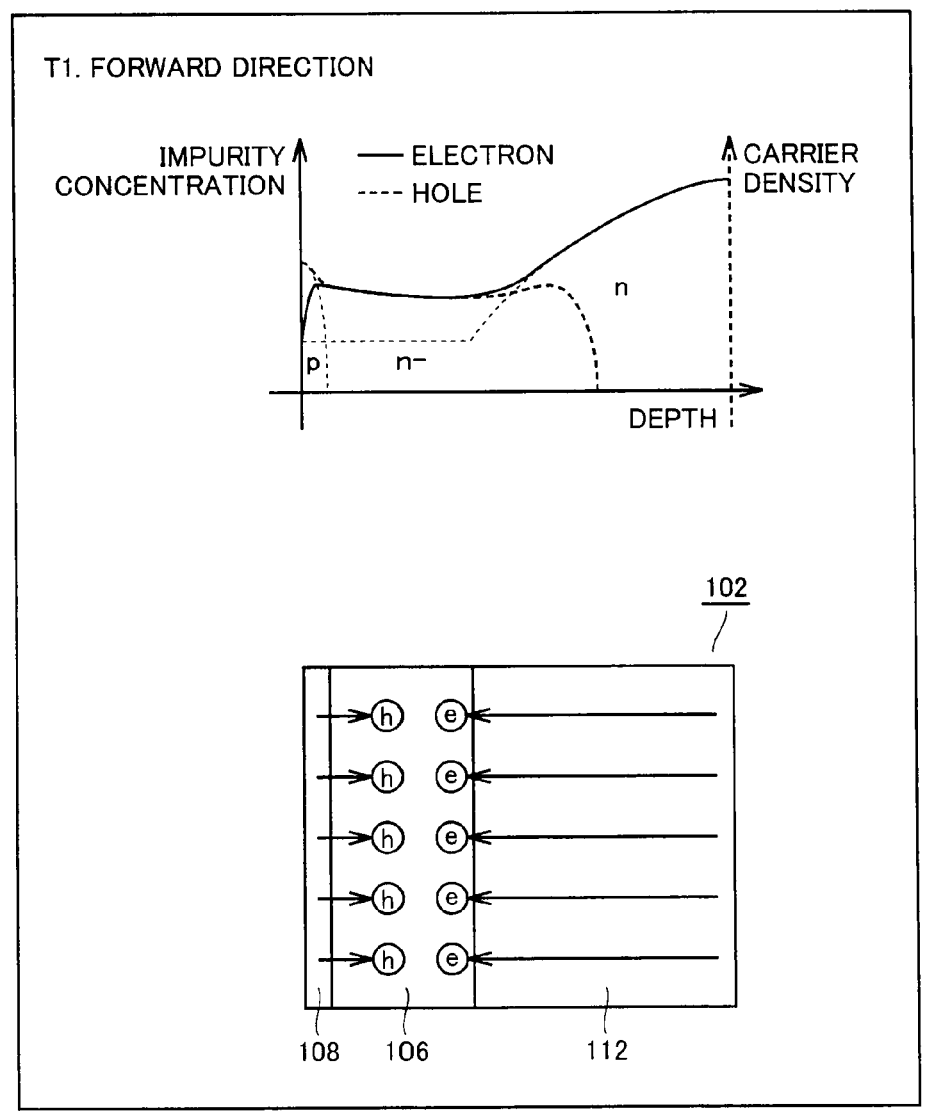
FIG. 16 represents the diffusion diode's carrier concentration profile and behavior at recovery in a first state.

Diffusion diode 102 at recovery has carriers behaving, as will be described hereinafter. FIG. 15 shows how a current passing through and a voltage of diffusion diode 102 at recovery vary with time. Initially, at point T1, diffusion diode 102 has a freewheeling current passing therethrough, or is forward biased. In this condition, as shown in FIG. 16, electrons are injected from a cathode toward n$^-$ drift layer 106 and holes are injected from an anode toward n$^-$ drift layer 106.

Figure 17:
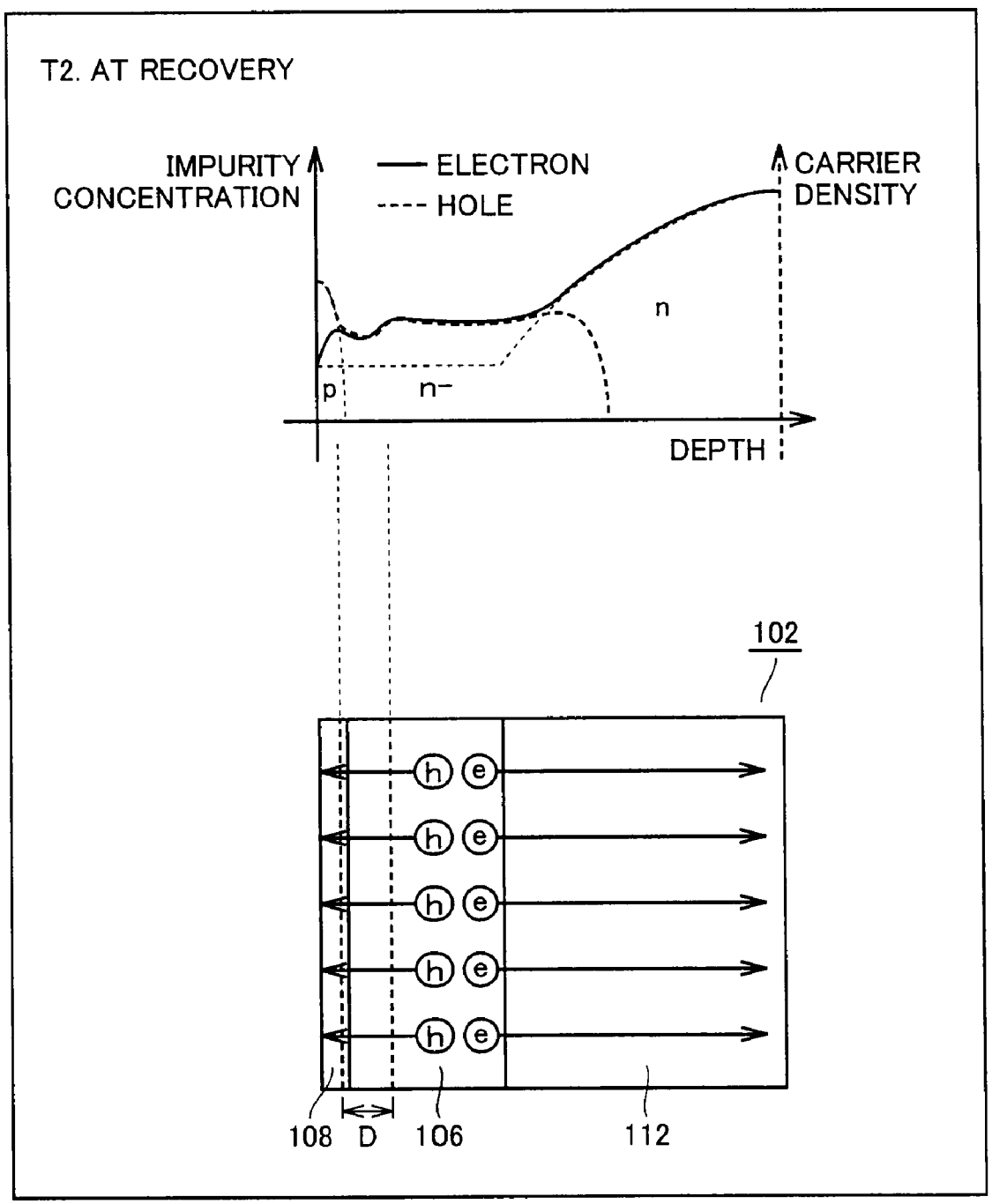
FIGS. 17-20 represent the diffusion diode's carrier concentration profile and behavior at recovery in second to fifth states following the first to fourth states, respectively.

Then, at point T2, diffusion diode 102 forward biased is reverse biased, and the current flowing through diffusion diode 102 gradually decreases and a depletion layer D expands from an interface between p anode layer 108 and n⁻ drift layer 106. In this condition, of carriers stored in diffusion diode 102, electrons are discharged toward the cathode and holes are discharged toward the anode, as shown in FIG. 17, and diffusion diode 102 will have a reverse recovery current passing therethrough.

Figure 18:
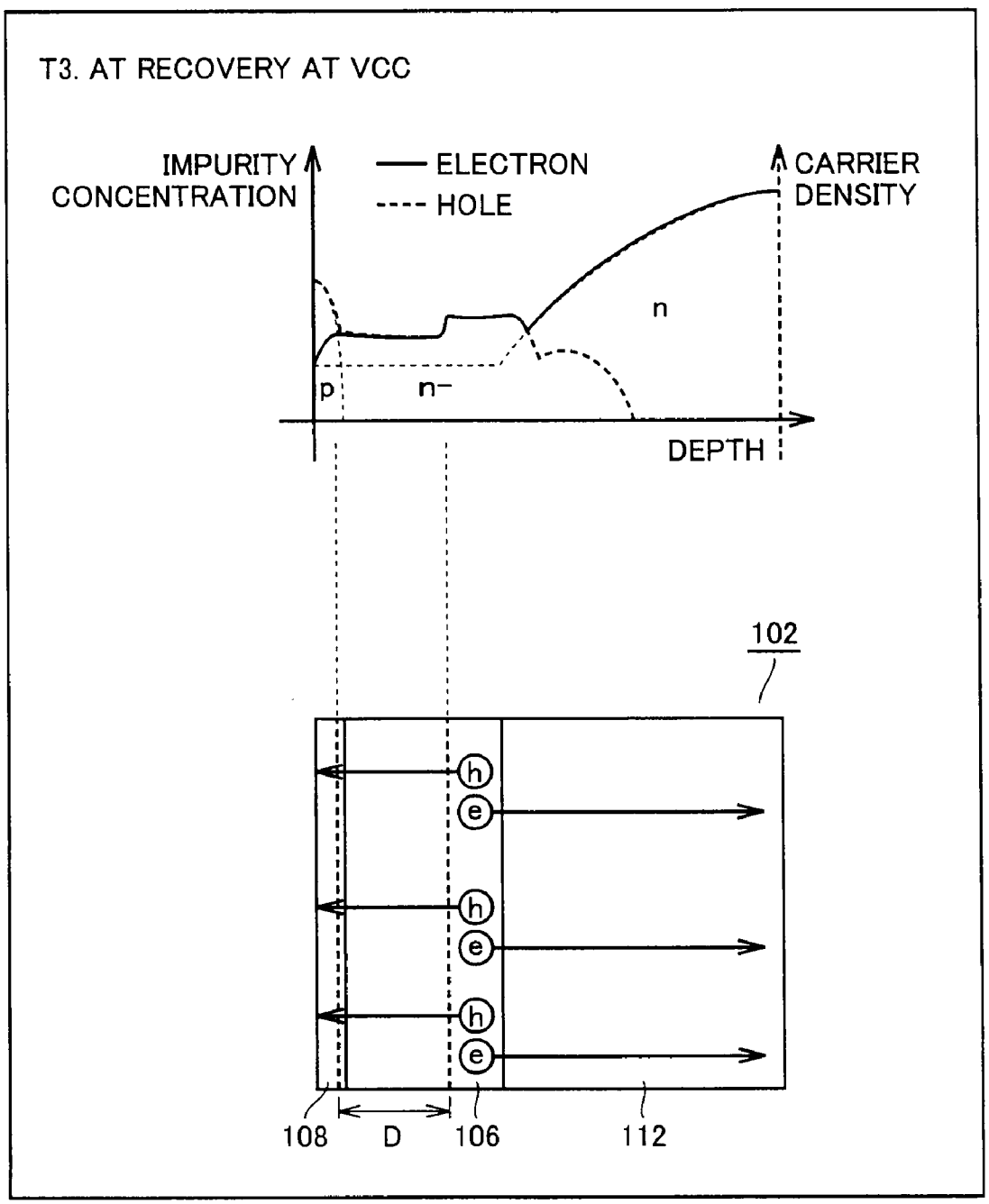
Figure 19:
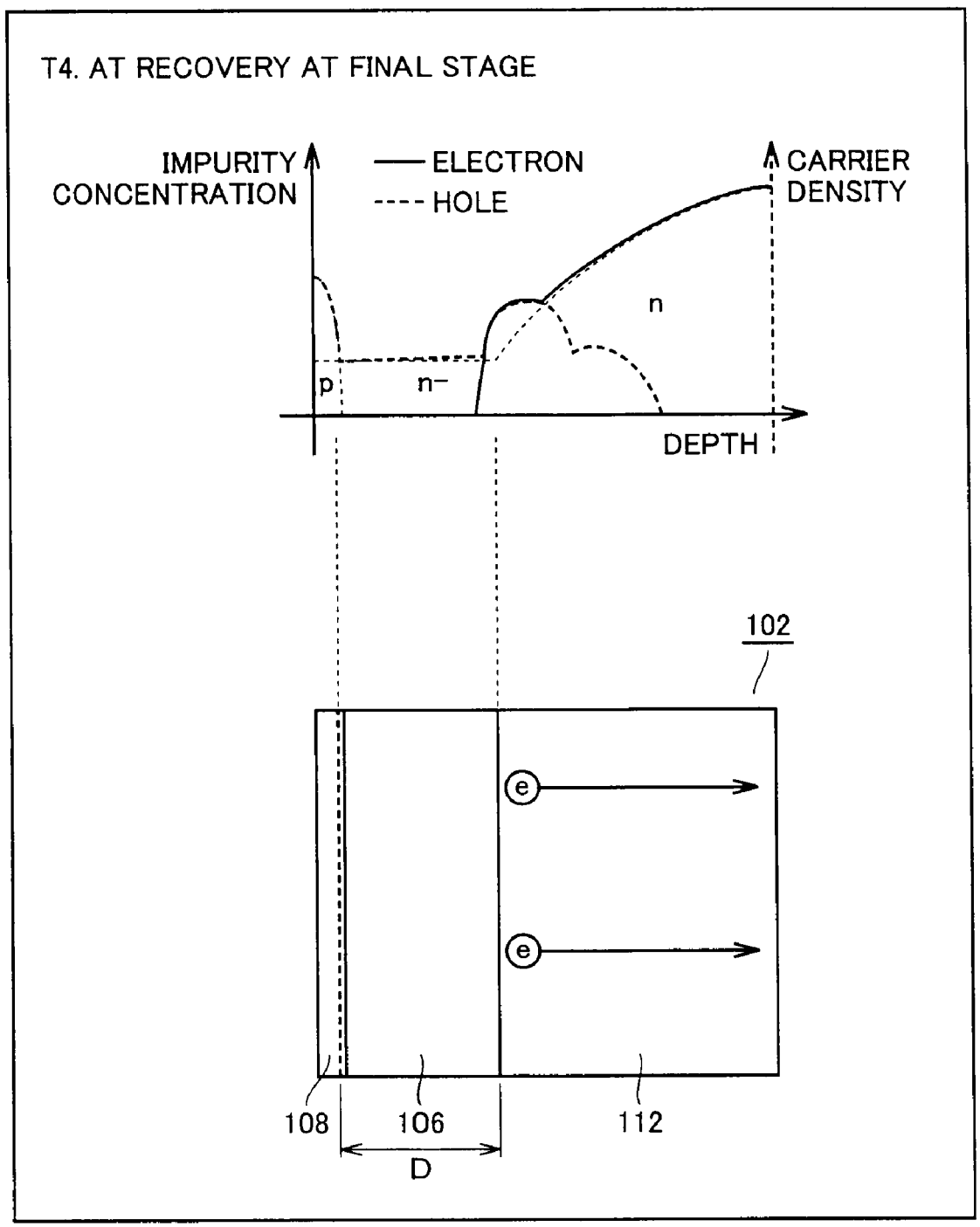
Figure 20:
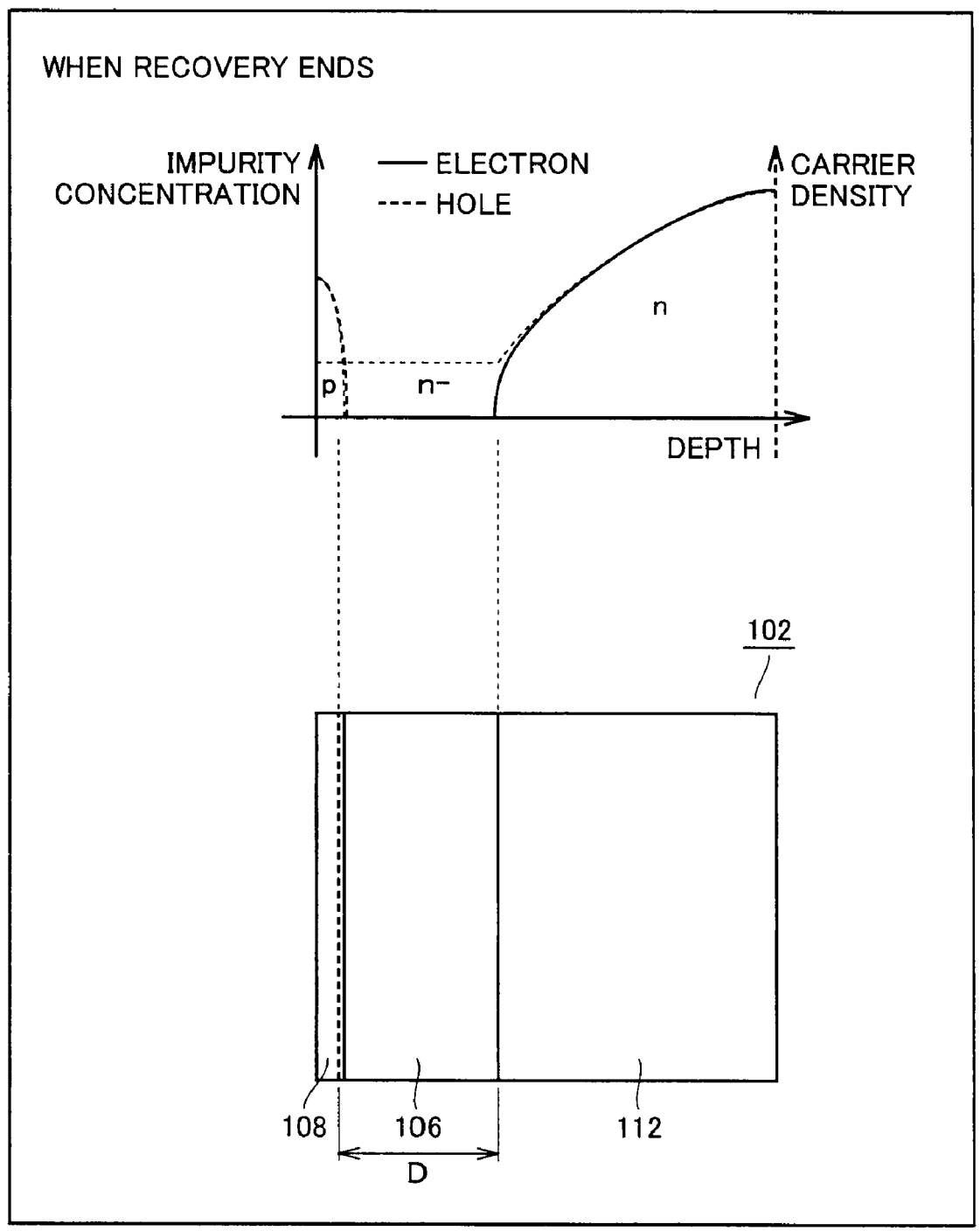

Then, at point T3, as shown in FIG. 18, depletion layer D further expands as time elapses, and electrons and holes discharged decrease in number and the reverse recovery current decreases. Then, at point T4, which corresponds to a state immediately before recovery ends, depletion layer D further expands, as shown in FIG. 19, and carriers remaining in a vicinity of a boundary between n⁻ drift layer 106 and n buffer layer 112 are discharged. When recovery ends, depletion layer D expands to a vicinity of a boundary between n⁻ drift layer 106 and n buffer layer 112, as shown in FIG. 20, and stored carriers are discharged or recombine and thus disappear and the diode is turned off.

Diffusion diode 102 has n buffer layer 112 having an impurity concentration gently decreasing as seen at a cathode toward an anode. As such, electrons injected from the cathode are injected less efficiently. As such, the modulation level is hardly increased, and increased on resistance is provided, and forward voltage cannot be reduced.

Furthermore, n buffer layer 112 is provided by thermally diffusing an impurity to a depth of approximately a half of the thickness of the semiconductor substrate. As such, n buffer layer 112 has an impurity concentration (or slope) that readily varies, disadvantageously providing a modulation level readily varying with respect to a predetermined current. Furthermore, as n buffer layer 112 is relatively large in thickness, a total amount of carriers discharged at recovery increases, resulting in increased switching loss (or recovery loss). It should be noted that recovery loss refers to a loss caused as a reverse recovery current flows, and it is represented by a product of an integral of a current by an integral of a voltage that are obtained for a period of time that starts when the reverse recovery current starts to flow and then attains a maximum value (in absolute value) and that ends when the reverse recovery current attains a value of 1/10 of the maximum value.

Figure 21:
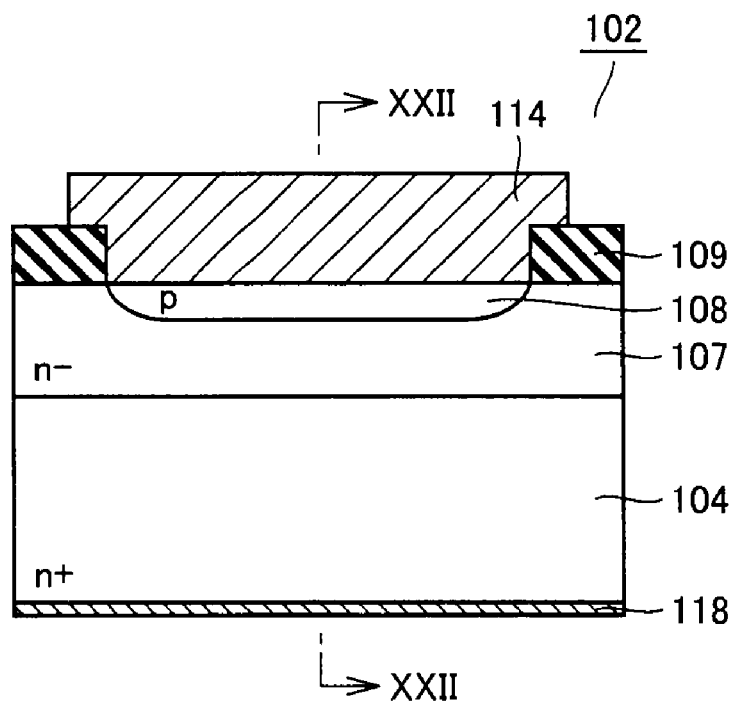
FIG. 21 is a cross section of an epitaxial diode according to a second comparative example.
Figure 22:
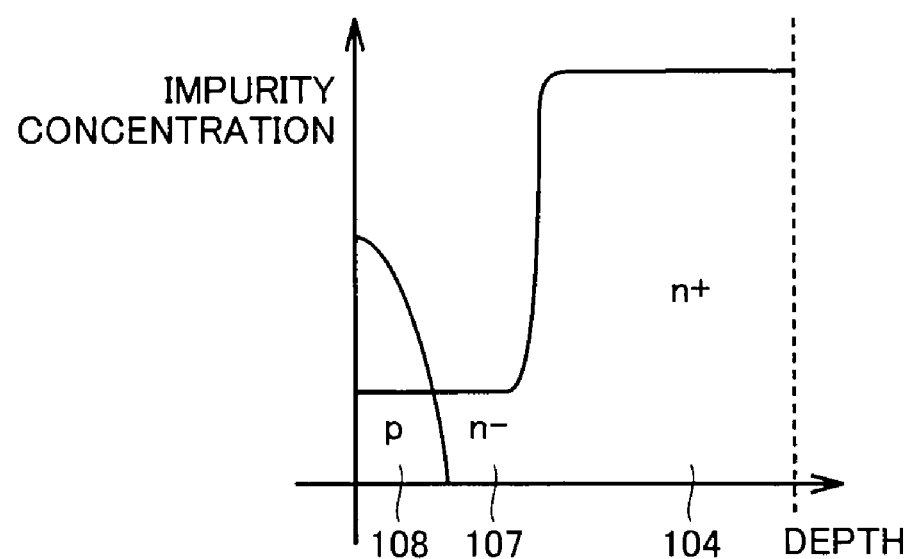
FIG. 22 shows an impurity concentration profile at a cross sectional line XXII-XXII shown in FIG. 21.

As a second comparative example an epitaxial diode will be described. As shown in FIG. 21, an epitaxial diode 102 includes an n type semiconductor substrate 104, an n⁻ epitaxial layer 107, p anode layer 108, front surface electrode 114 and back surface electrode 118. N⁻ epitaxial layer 107, which serves as a drift layer, is epitaxially grown on a surface of semiconductor substrate 104. Accordingly, as shown in FIG. 22, an impurity concentration profile is provided that indicates an impurity concentration rapidly decreasing as seen from semiconductor substrate 104 toward n⁻ epitaxial layer 107.

Figure 23:
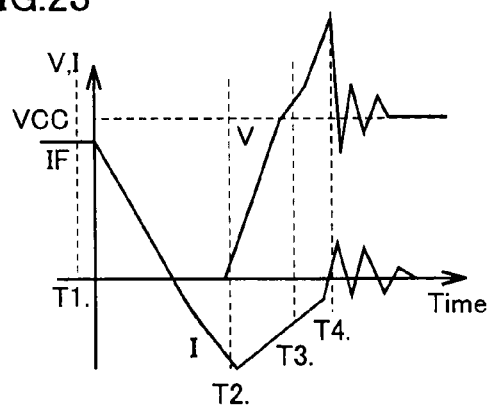
FIG. 23 is a graph representing how the epitaxial diode's current and voltage vary at recovery with time.
Figure 24:
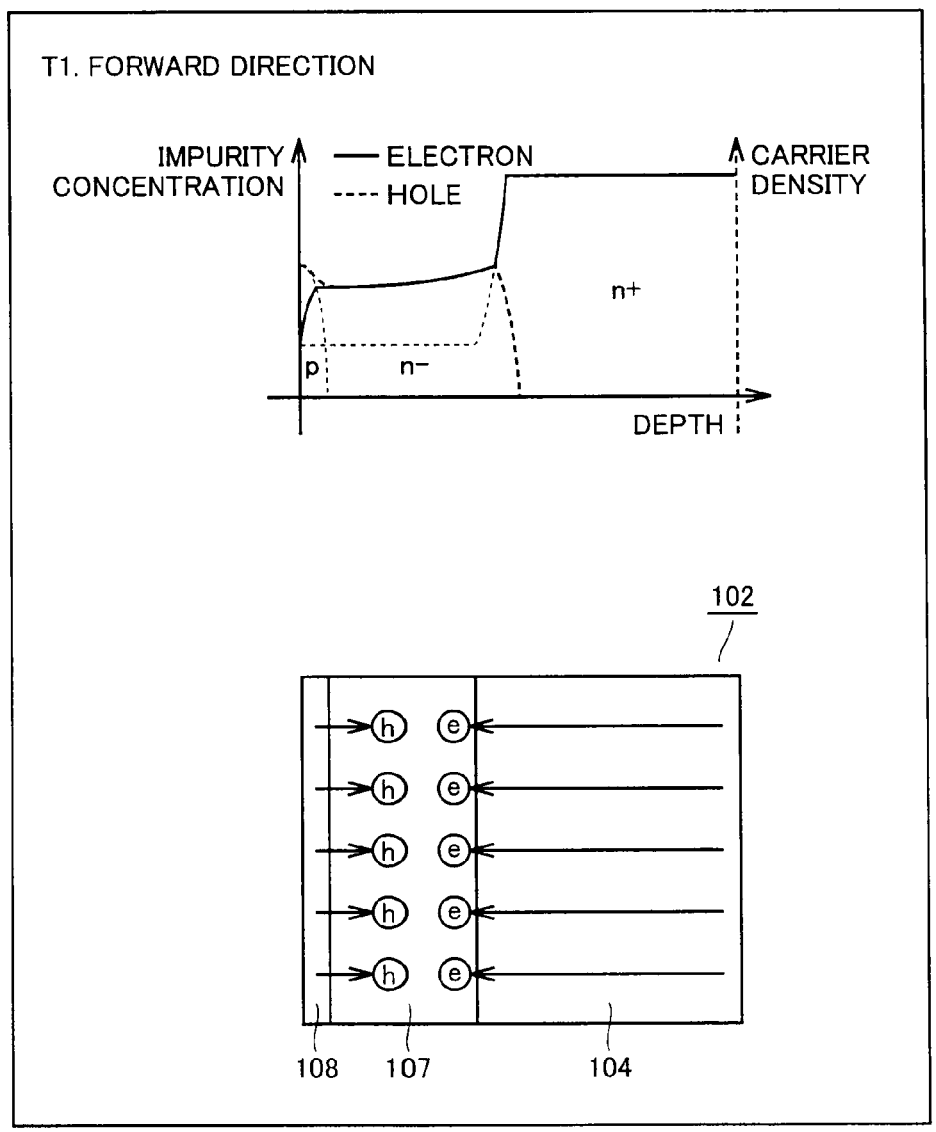
FIG. 24 represents the epitaxial diode's carrier concentration profile and behavior at recovery in a first state.

Epitaxial diode 102 at recovery has carriers behaving, as will be described hereinafter. FIG. 23 shows how a current passing through and a voltage of epitaxial diode 102 at recovery vary with time. Initially, at point T1, epitaxial diode 102 has a freewheeling current passing therethrough, or is forward biased. In this condition, as shown in FIG. 24, electrons are injected from a cathode toward n⁻ epitaxial layer 107 and holes are injected from an anode toward n⁻ epitaxial layer 107.

Figure 25:
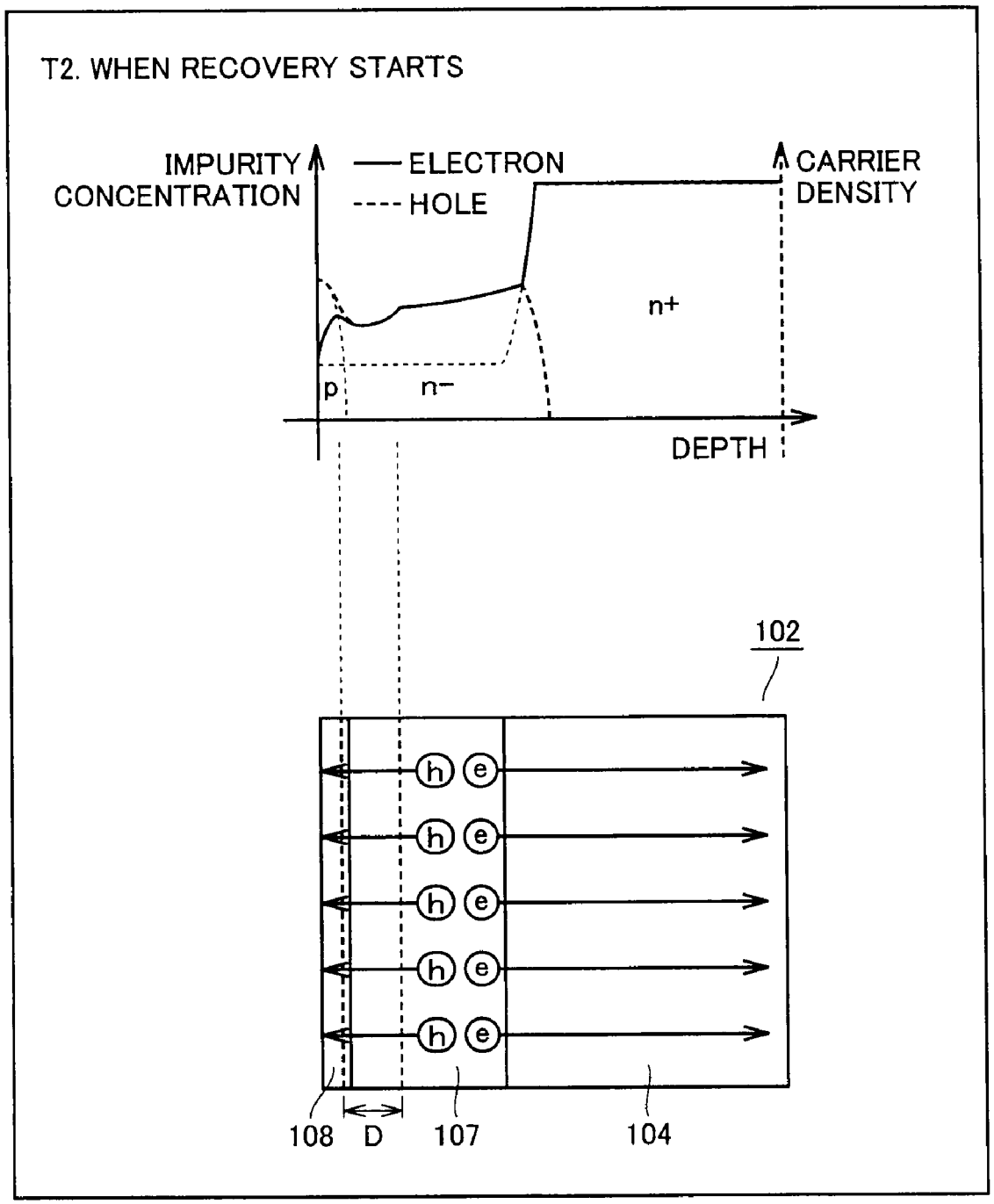
FIGS. 25-27 represent the epitaxial diode's carrier concentration profile and behavior at recovery in second to fourth states following the first to third states, respectively.

Then, at point T2, epitaxial diode 102 forward biased is reverse biased, and the current flowing through epitaxial diode 102 gradually decreases and depletion layer D expands from an interface between p anode layer 108 and n⁻ epitaxial layer 107. In this condition, of carriers stored in epitaxial diode 102, electrons are discharged toward the cathode and holes are discharged toward the anode, as shown in FIG. 25, and epitaxial diode 102 will have a reverse recovery current passing therethrough.

Figure 26:
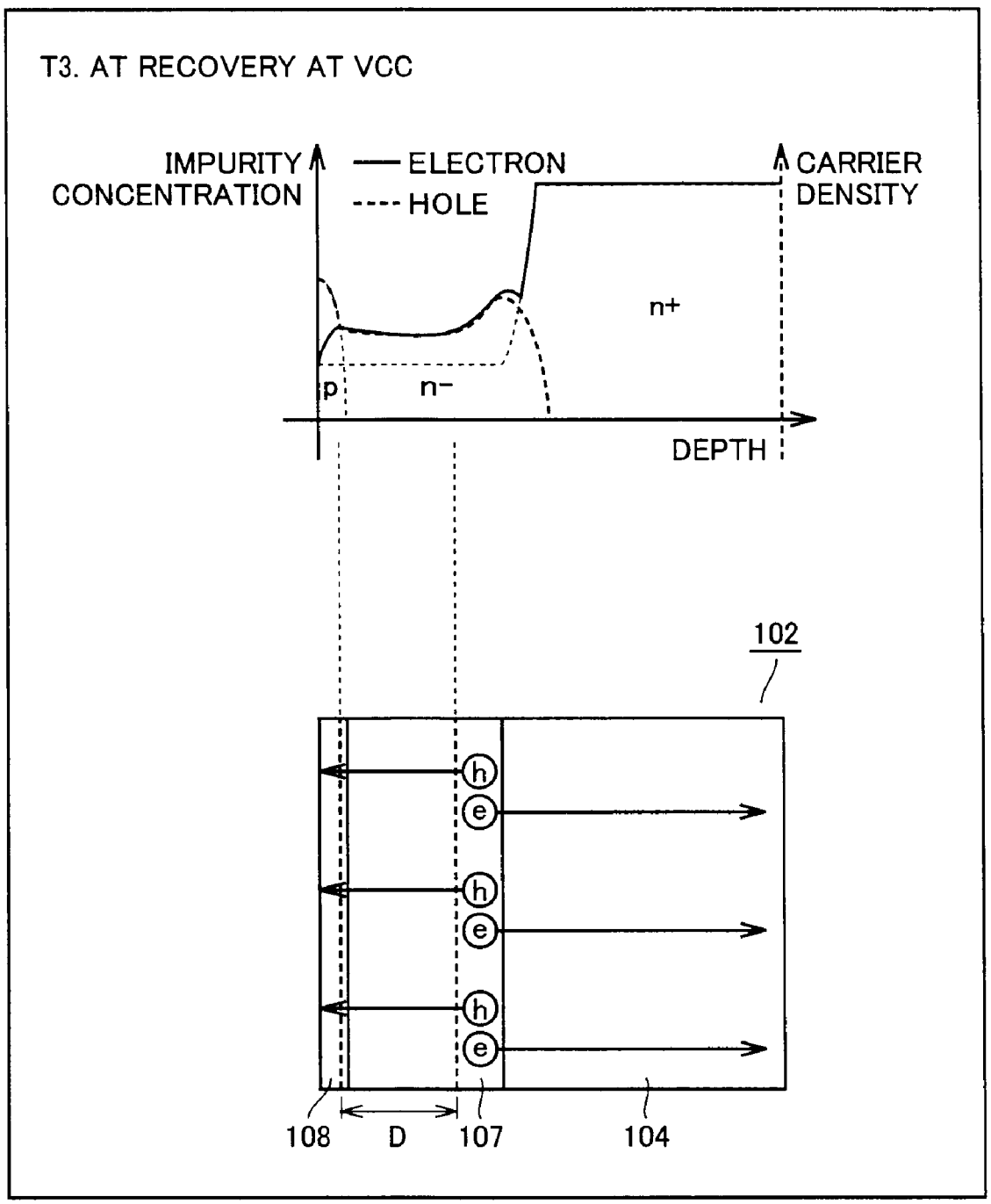
Figure 27:
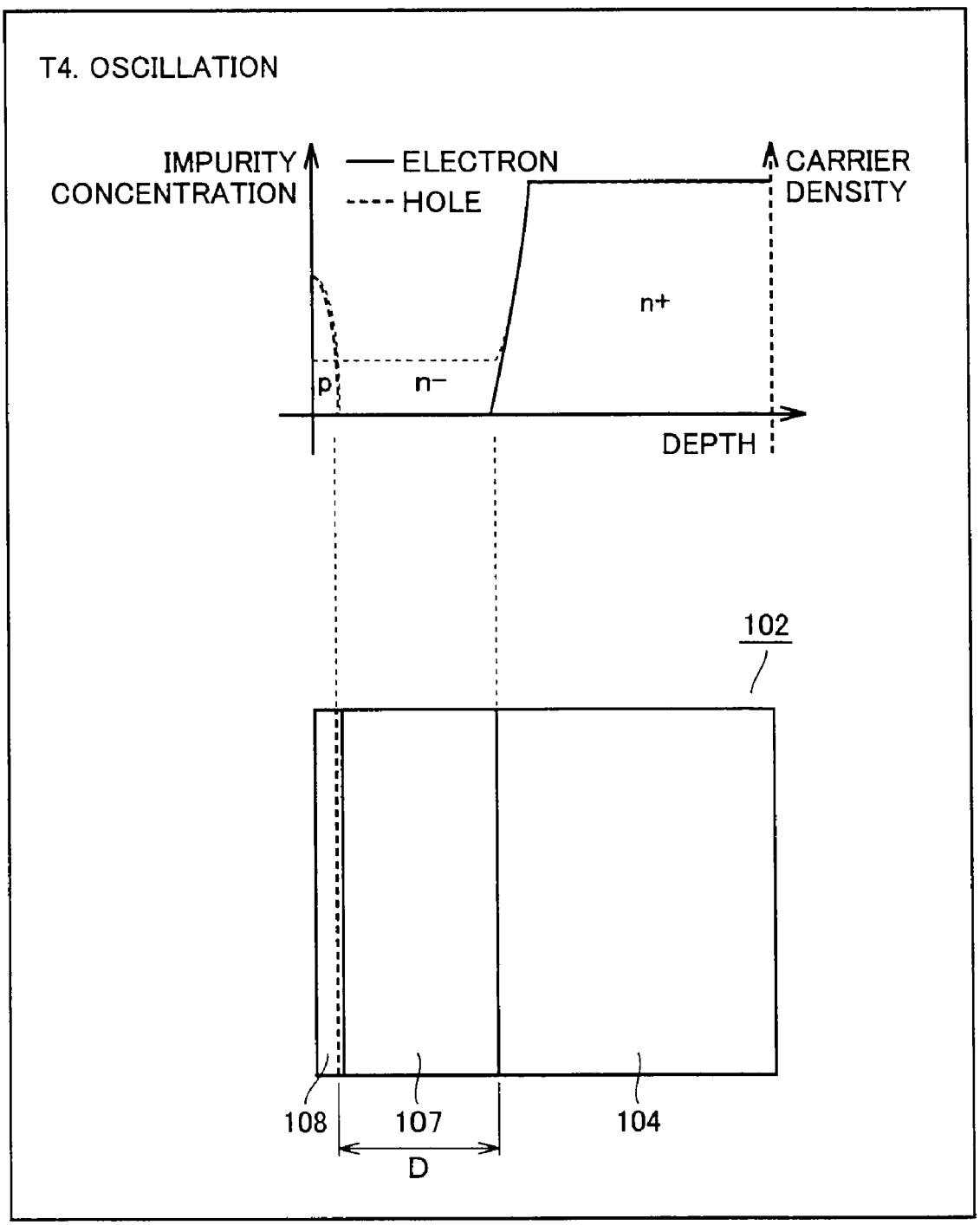

Then, at point T3, as shown in FIG. 26, depletion layer D further expands as time elapses, and electrons and holes discharged decrease in number and the reverse recovery current decreases. Then, at point T4, which corresponds to a state immediately before recovery ends, depletion layer D expands to a vicinity of a boundary between n⁻ epitaxial layer 107 and semiconductor substrate 104, as shown in FIG. 27, and stored carriers are discharged or recombine and thus disappear and the diode is turned off.

Epitaxial diode 102 has an impurity concentration steeply rising from n⁻ epitaxial layer 107 to semiconductor substrate 104. Accordingly, carriers injected in the on state will rapidly decrease at recovery. Accordingly, epitaxial diode 102 becomes a capacitor, and because of a relationship with a circuit to which the epitaxial diode is connected, oscillation disadvantageously readily occurs, as seen in a waveform indicated in FIG. 23.

Figure 28:
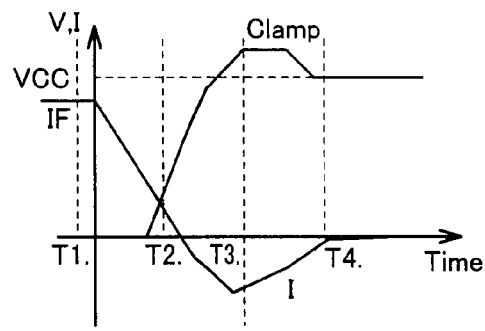
FIG. 28 is a graph representing how the PIN diode's current and voltage vary at recovery with time in the first embodiment.
Figure 29:
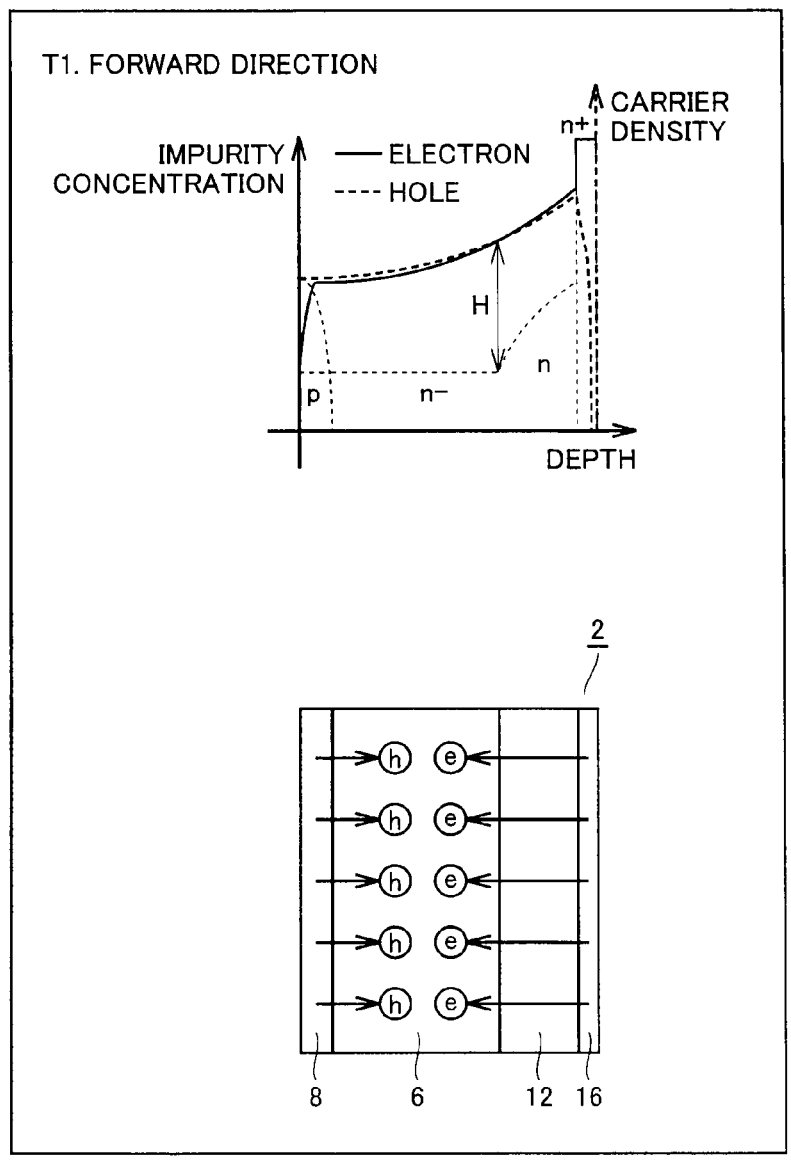
FIG. 29 represents the PIN diode's carrier concentration profile and behavior in the first embodiment at recovery in a first state.

The present PIN diode at recovery has carriers behaving, as will be described hereinafter. FIG. 28 shows how a current passing through and a voltage of PIN diode 2 at recovery vary with time. Initially, at point T1, PIN diode 2 has a freewheeling current passing therethrough, or is forward biased. In this condition, as shown in FIG. 29, electrons are injected from n⁺ layer 16 toward n⁻ drift layer 6 and holes are injected from p anode layer 8 toward n⁻ drift layer 6.

Figure 30:
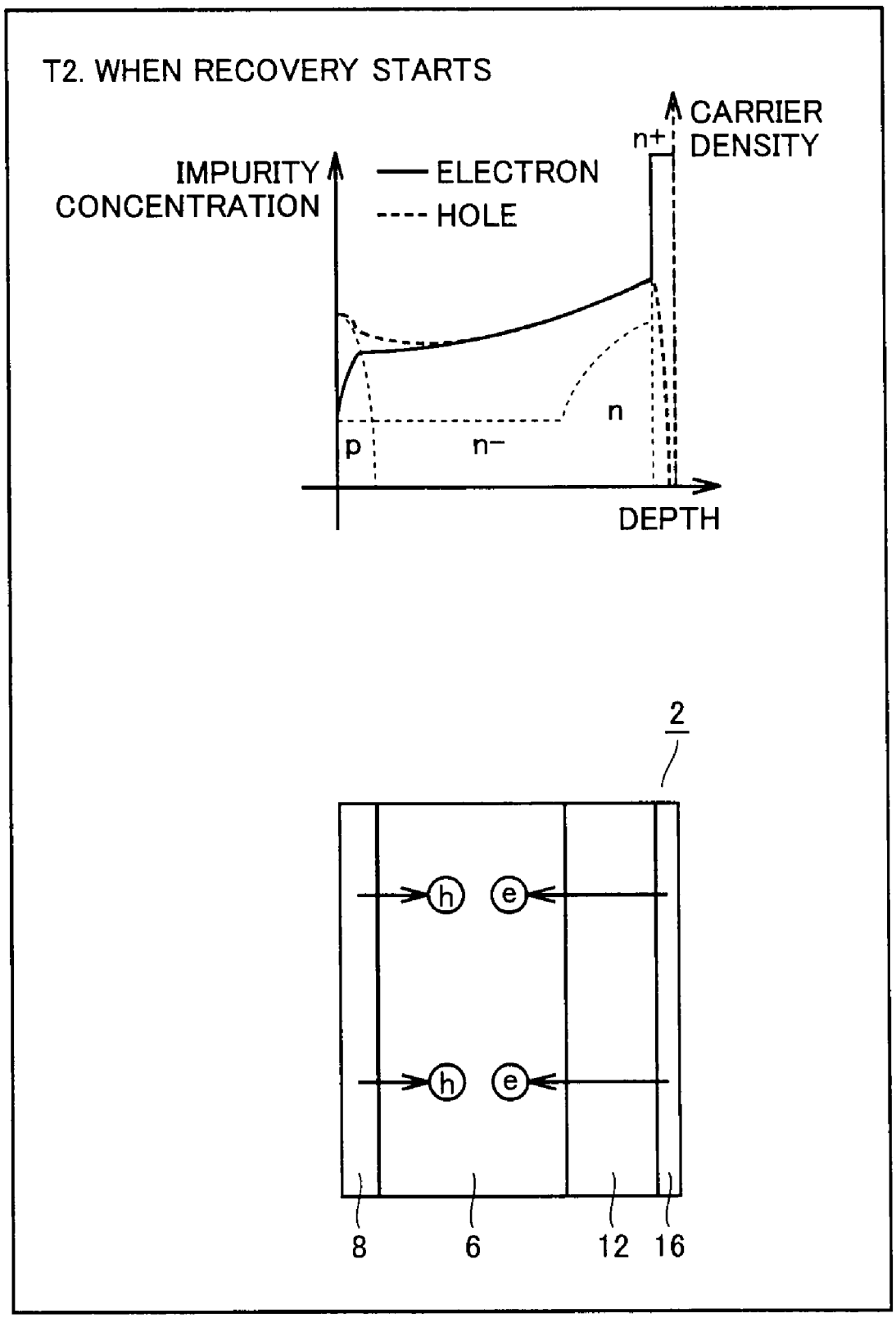
FIGS. 30-32 represent the PIN diode's carrier concentration profile and behavior in the first embodiment at recovery in second to fourth states following the first to third states, respectively.

Then, at point T2, PIN diode 2 forward biased is reverse biased, and the current flowing through PIN diode 2 gradually decreases. In this condition, as shown in FIG. 30, electrons injected from n⁺ layer 16 toward n⁻ drift layer 6 decrease in number and holes injected from p anode layer 8 toward n⁻ drift layer 6 also decrease in number.

Then, as time elapses, depletion layer D expands from an interface between p anode layer 8 and n⁻ drift layer 6, and of carriers stored in PIN diode 2, electrons are discharged toward the cathode and holes are discharged toward the anode and PIN diode 2 will have a reverse recovery current passing therethrough.

Figure 31:
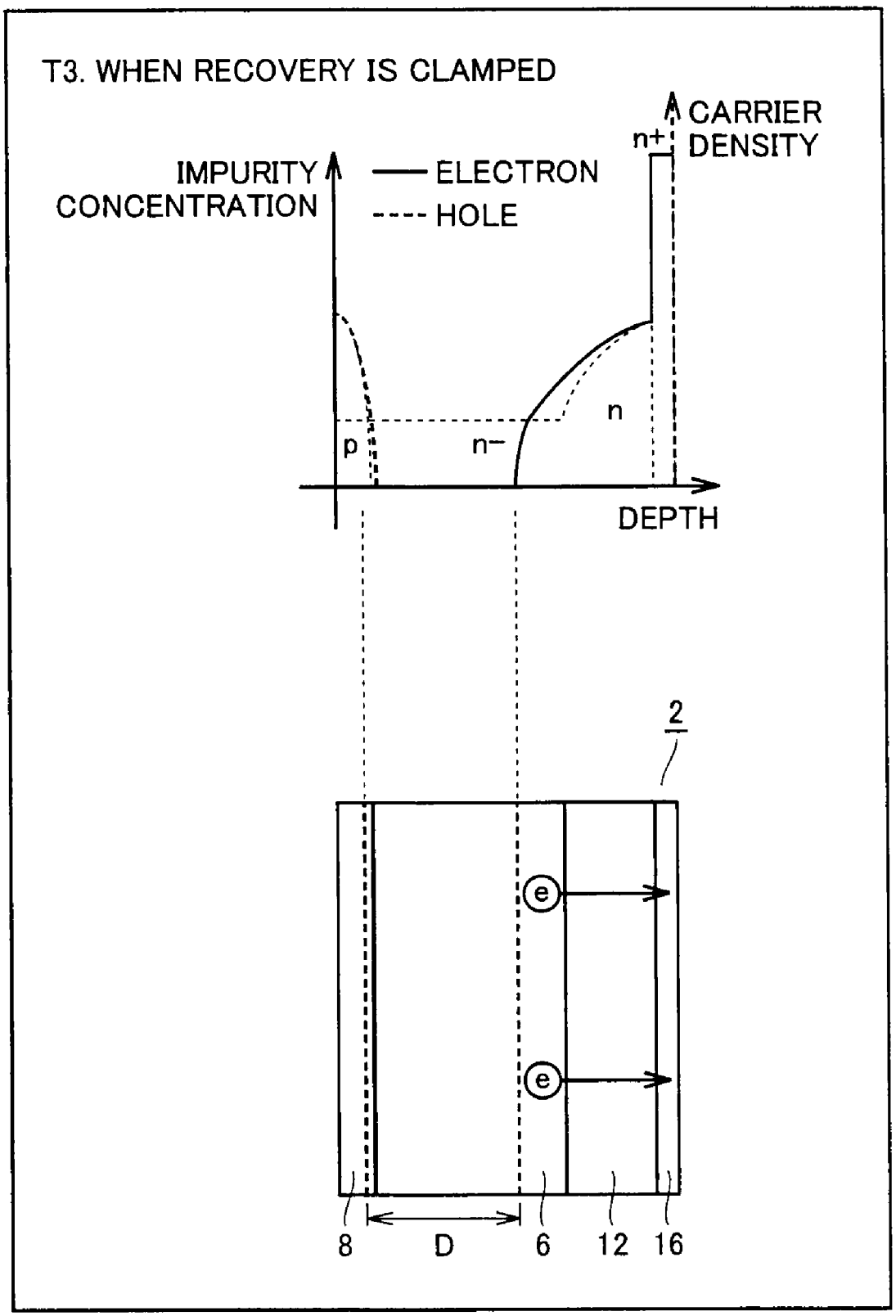
Figure 32:
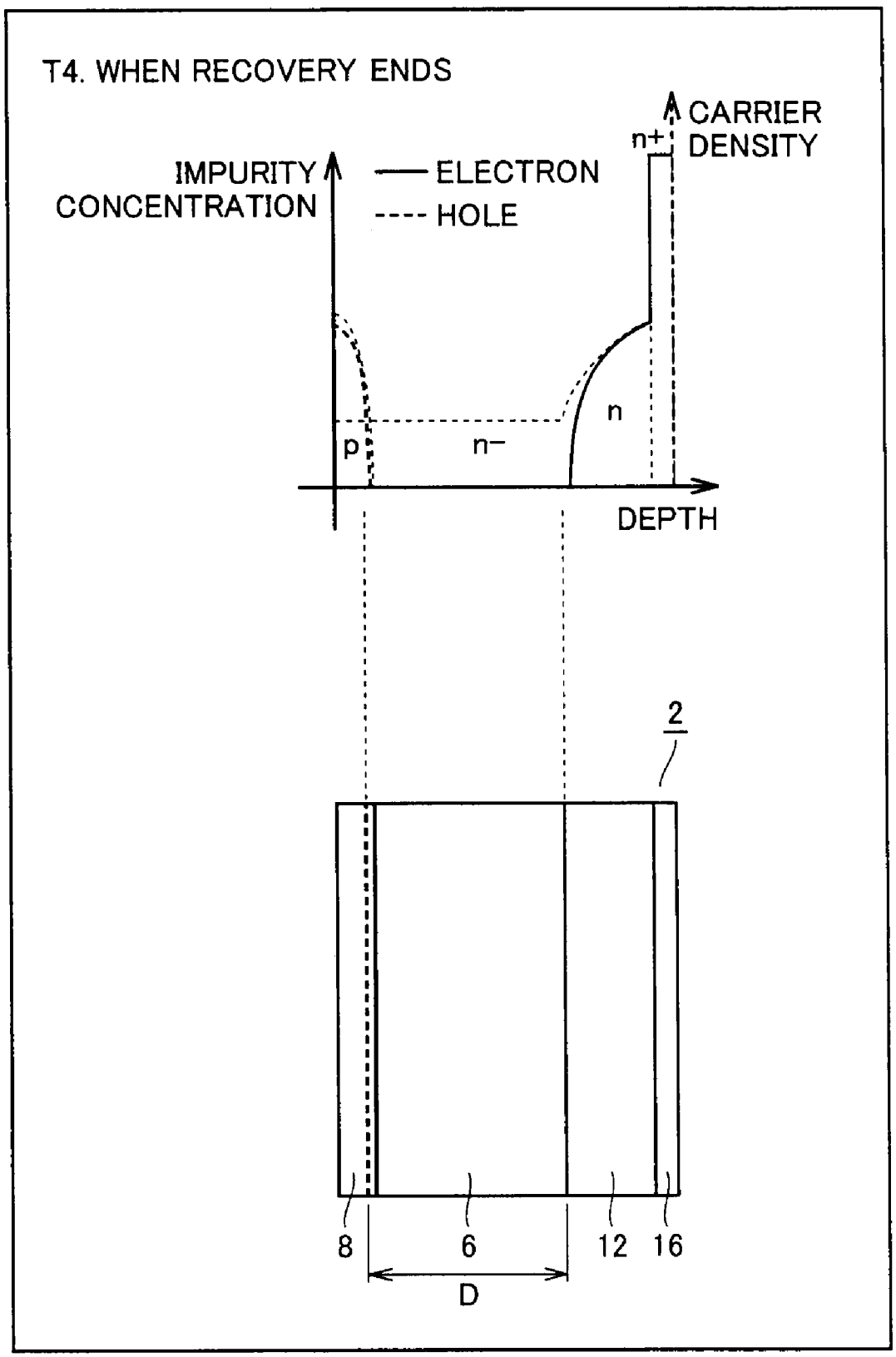

Then, at point T3, or when recovery is clamped, as shown in FIG. 31, carriers remaining in a vicinity of a boundary between n buffer layer 12 and n⁻ drift layer 6 are discharged or recombine and disappear. Then, at point T4, recovery ends, and, as shown in FIG. 32, depletion layer D expands to a vicinity of the boundary between n⁻ drift layer 6 and n buffer layer 12 and remaining carriers mainly recombine and disappear, and the diode is turned off.

The present PIN diode 2 has n⁺ layer 16 at a cathode, that has an impurity concentration for example at least 100 times higher than that of n⁻ drift layer 6. This can provide an increased ratio of the impurity concentration of n⁺ layer 16 to that of n⁻ drift layer 6. Accordingly, electrons can be injected from n⁺ layer 16 more efficiently and PIN diode 2's modulation level can be increased.

Furthermore, in the forward biased state, injected carriers have a density having a profile bridging p anode layer 8 and n⁺ layer 16. This allows an amount of carriers that are injected to be varied depending on the impurity concentration of p anode layer 8 and that of n⁺ layer 16 to precisely adjust forward voltage (or a modulation level), as desired, to accommodate the inverter device to which the PIN diode is applied.

Furthermore, n⁺ layer 16, with a stepwise impurity concentration profile, can reduce variation in modulation level for a predetermined current in comparison with a sloping impurity concentration profile. The present PIN diode 2 can thus resolve a disadvantage observed in a diffusion diode.

Furthermore, as p anode layer 8 has an impurity concentration profile relatively steeply decreasing from a surface, stored carriers' density and n⁻ drift layer 6's impurity concentration have a difference H (see FIG. 29) in the forward biased state, maximized in a vicinity of a boundary between n buffer layer 12 and n⁻ drift layer 6. Thus at recovery when the depletion layer has one end reaching a vicinity of the boundary between n buffer layer 12 and n⁻ drift layer 6, carriers remain in the vicinity of the boundary, and the carriers are discharged and accordingly a reverse recovery current will gradually decrease. As a result, oscillation can be prevented. The present PIN diode 2 can thus resolve a disadvantage observed in an epitaxial diode.

Thus, the present PIN diode 2 is characterized by having $n^+$ layer 16 having a stepwise impurity concentration profile. Hereinafter, $n^+$ layer 16 will be described more specifically. As has been described previously, $n^+$ layer 16 is provided by injecting phosphorus from the second major surface of semiconductor substrate 4 (see FIG. 10) and performing a laser annealing step (see FIG. 11).

Figure 33:
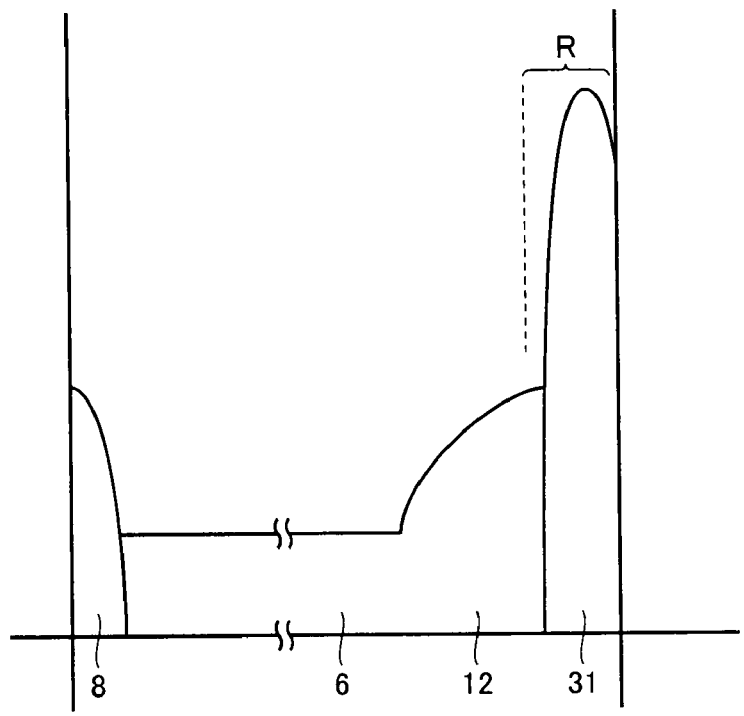
FIG. 33 represents an impurity concentration profile in the first embodiment immediately after injection for illustrating an impurity concentration profile of an $n^+$ layer of the PIN diode.
Figure 34:
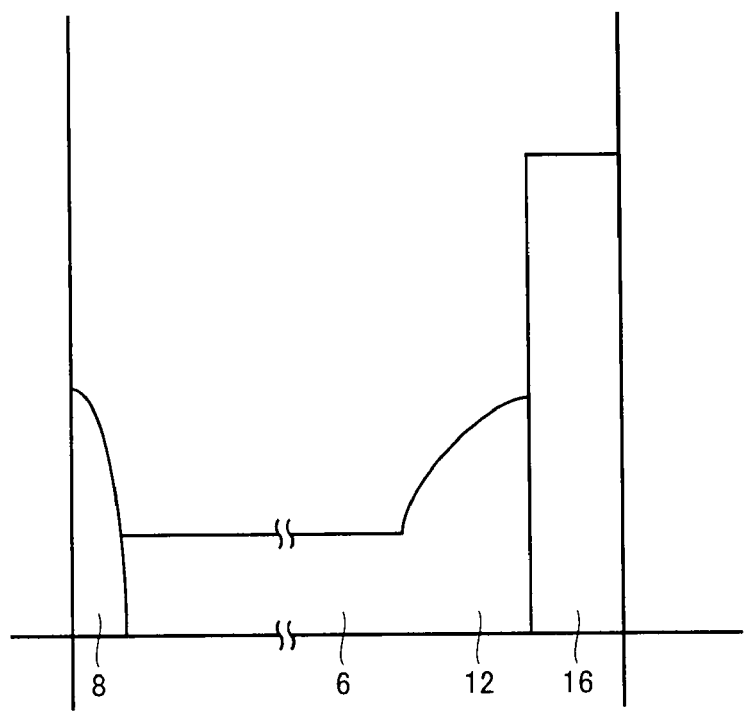
FIG. 34 represents an impurity concentration profile in the first embodiment after laser-annealing for illustrating an impurity concentration profile of the $n^+$ layer of the PIN diode.

Initially, as shown in FIG. 33, when phosphorus is injected, an impurity layer 31 has an impurity concentration profile having a peak at a predetermined depth as measured from a surface of the semiconductor substrate. A laser annealing step is then performed in a manner melting a region R having a predetermined depth from the surface of the semiconductor substrate to include impurity layer 31 having phosphorus injected therein. This diffuses the phosphorus within region R melted, and as shown in FIG. 34, uniforms the phosphorus in concentration in region R depthwise. Note that the impurity hardly diffuses to allow the impurity concentration profile to flare from $n^+$ layer 16 to n buffer layer 12. $N^+$ layer 16 having a stepwise impurity concentration profile will thus be provided.

Figure 35:
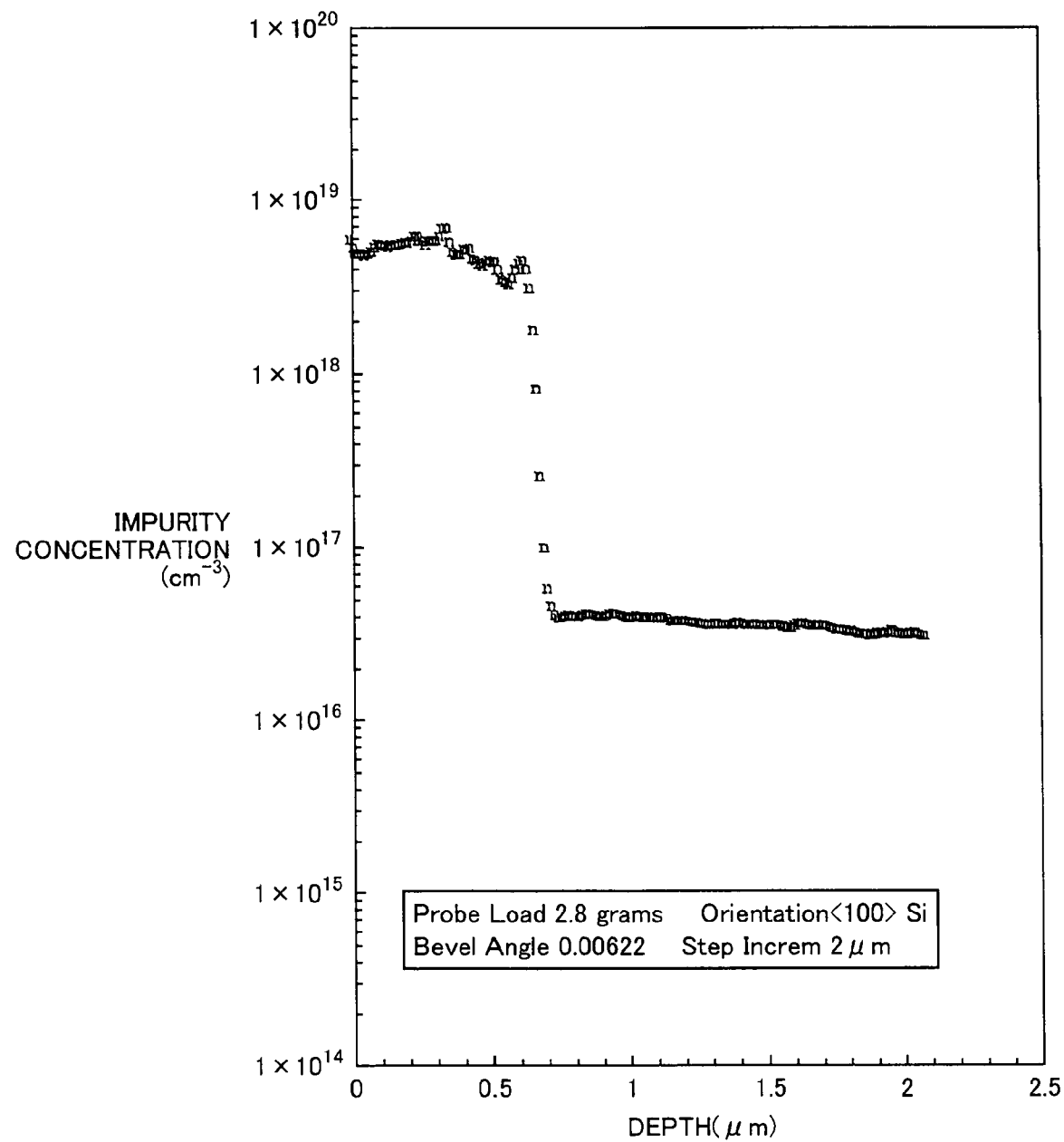
FIG. 35 represents a result of measuring an impurity concentration profile of the $n^+$ layer of the PIN diode in the first embodiment.
Figure 36:
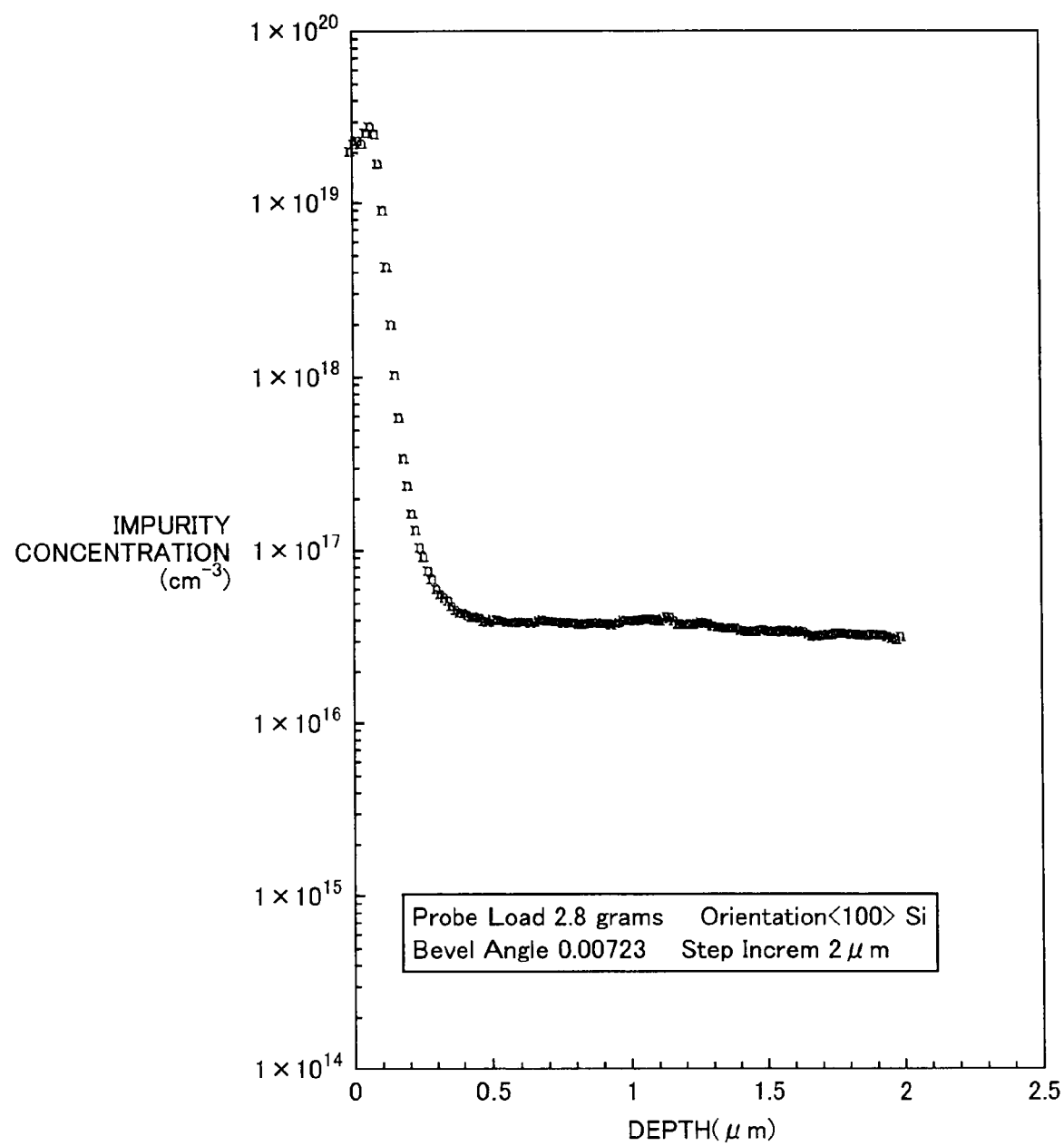
FIG. 36 represents a result of measuring an impurity concentration profile provided through thermal diffusion for comparison.

An $n^+$ layer thus provided has an impurity concentration, as measured as shown in FIG. 35. For comparison, an impurity concentration profile provided through typical thermal diffusion is measured as shown in FIG. 36. As shown in FIG. 35, melting region R provides a substantially fixed impurity concentration, as seen from a surface to a depth of approximately 0.6 μm, and it has been confirmed that a stepwise impurity profile is obtained. In contrast, it has been confirmed that typical thermal diffusion provides an impurity concentration decreasing to flare from a surface to a deep region, as shown in FIG. 36.

Thus the laser-annealing performed in fabricating the present PIN diode is different as a substantial annealing step from the laser-annealing that simply recovers a crystal defect caused by exposure to an electron beam in that the former laser-annealing melts a region in a semiconductor substrate that has a predetermined depth to provide a uniformed impurity concentration.

Furthermore, the present PIN diode's stepwise impurity concentration profile and an epitaxial diode's impurity concentration profile have a difference, as follows: First, epitaxial growth is followed by another step, i.e., a heat treatment, which allows impurity to mutually thermally diffuse and provide a concentration having a profile flaring between the semiconductor substrate and an epitaxially grown layer.

Furthermore, the semiconductor substrate and a portion of the epitaxial layer that is provided at an initial stage of the epitaxial growth are exposed to heat until the epitaxial growth ends, and this also allows impurity to mutually thermally diffuse between the semiconductor substrate and the portion of the epitaxial layer provided at the initial stage, and thus have a concentration having a flaring profile.

In the present PIN diode, in contrast, only an impurity that is present in region R melted as it is exposed to a laser beam of light is diffused and uniformed depthwise. Accordingly, the impurity hardly mutually thermally diffuse between region R melted and a region that is not melted. As such, there is not provided an impurity concentration profile flaring between a region that is melted and a region that is not melted.

The PIN diode described above has $n^+$ layer 16 provided by injecting phosphorus into a semiconductor substrate by way of example. Alternatively, it may have the layer that is provided for example by applying phosphorus deposition, phosphorus glass or the like to introduce phosphorus into a semiconductor substrate. Furthermore, it may have the layer that is provided by introducing arsenic (As).

Second Embodiment

Figure 37:
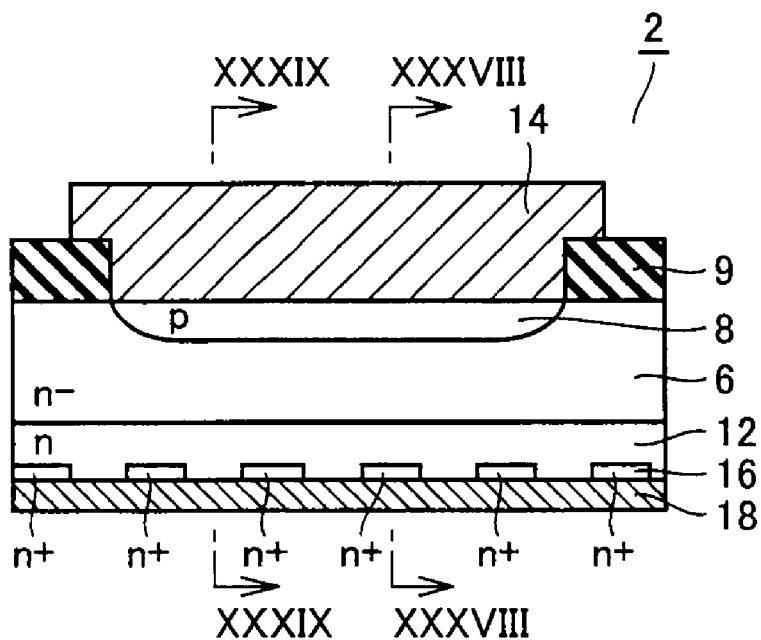
FIG. 37 is a cross section of a PIN diode of a second embodiment of the present invention.

Hereinafter will be described a PIN diode having an $n^+$ layer selectively provided. As shown in FIG. 37, the present PIN diode 2 has $n^+$ layer 16 selectively provided. Back surface electrode 18 is provided in contact with $n^+$ layer 16 and n buffer layer 12. The remainder in configuration is similar to the FIG. 2 PIN diode. Accordingly, identical components are identically denoted and will not be described repeatedly.

Figure 38:
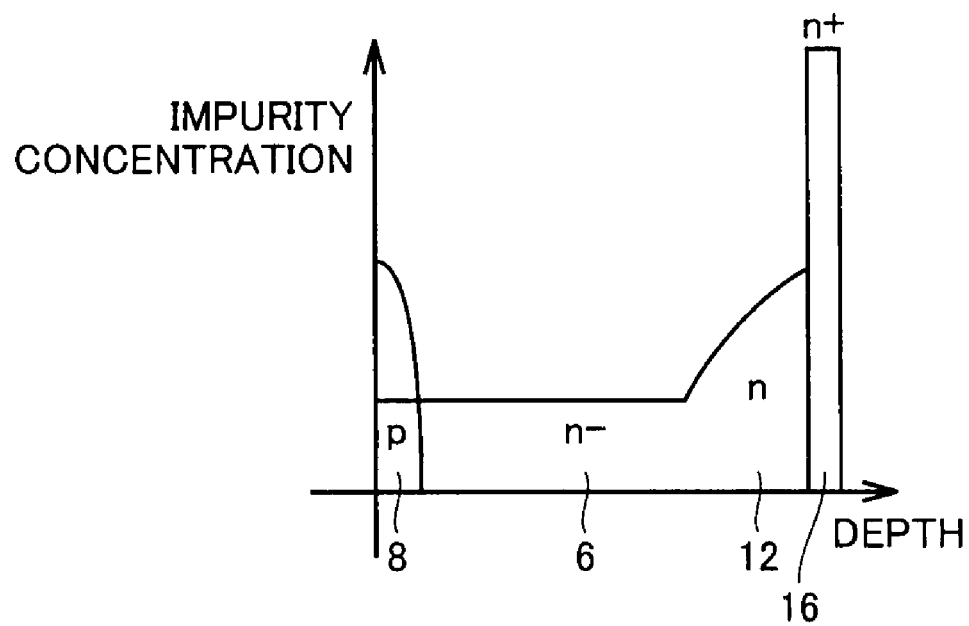
FIG. 38 shows an impurity concentration profile in the second embodiment at a cross sectional line XXXVIII-XXXVIII shown in FIG. 37.
Figure 39:
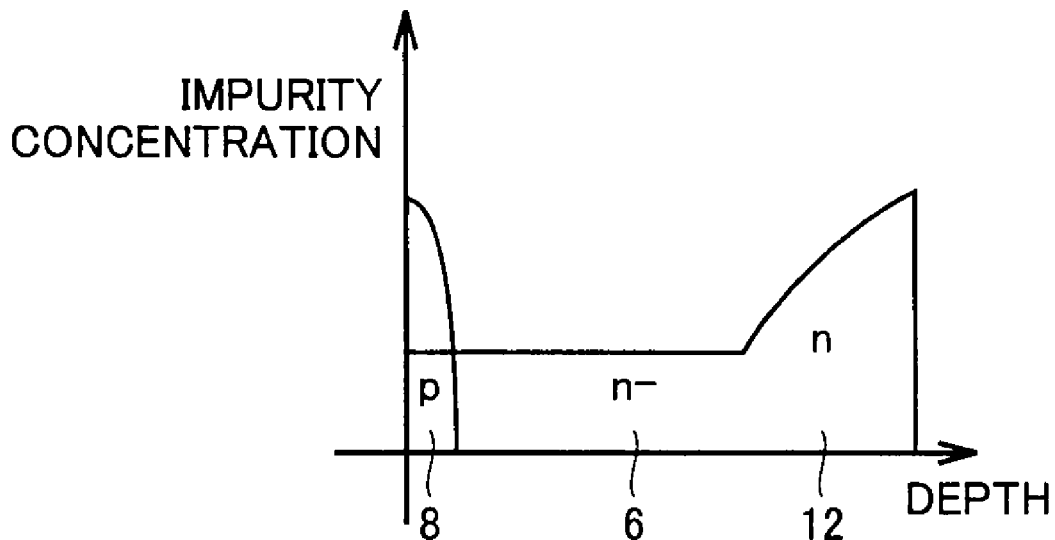
FIG. 39 shows an impurity concentration profile in the second embodiment at a cross sectional line XXXIX-XXXIX shown in FIG. 37.
Figure 40:
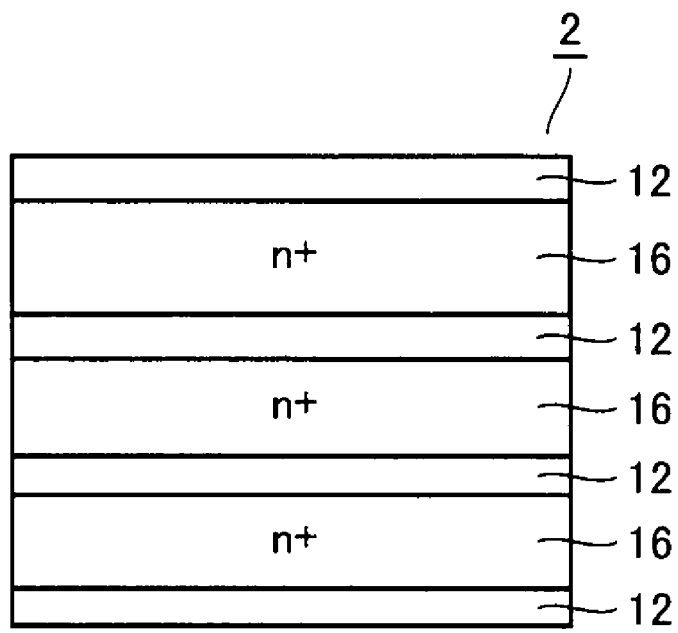
FIGS. 40 and 41 show a selectively provided $n^+$ layer in the second embodiment having one and another exemplary patterns, as shown in plan views, respectively.
Figure 41:
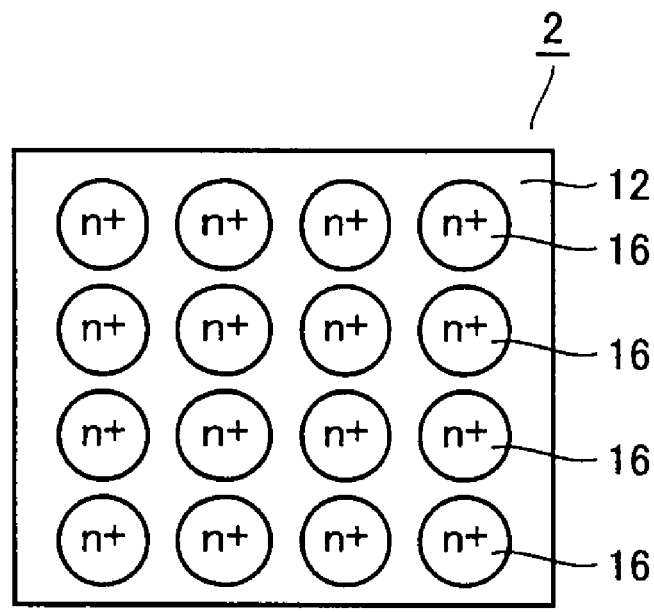

PIN diode 2 has an impurity concentration, as will be described hereinafter. As the present PIN diode 2 has an $n^+$ layer selectively provided, an impurity concentration along a cross sectional line passing through the $n^+$ layer has a stepwise profile attributed to the $n^+$ layer, as shown in FIG. 38. In contrast, an impurity concentration along a cross section that does not pass through the $n^+$ layer does not have a stepwise profile, as shown in FIG. 39. $N^+$ layer 16 thus selectively provided may have a pattern such as a strip as shown in FIG. 40 or in the form of an island as shown in FIG. 41.

The present PIN diode having $n^+$ layer 16 having a stepwise impurity concentration profile that is selectively provided, as will be described hereinafter, allows a modulation level or the like to be adjusted with precision.

Figure 42:
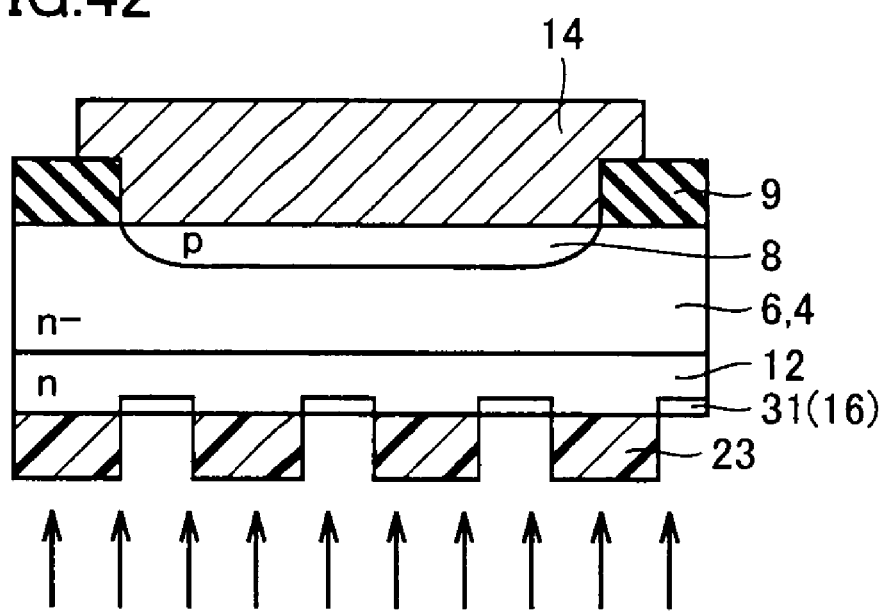
FIG. 42 is a cross section for illustrating a step of a method of fabricating the FIG. 37 PIN diode in the second embodiment.
Figure 43:
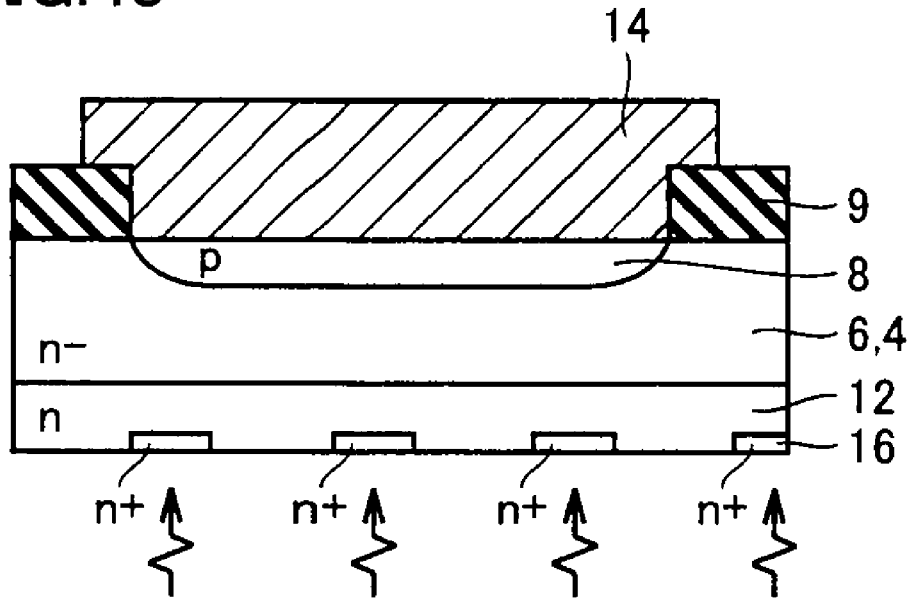
FIGS. 43-45 are cross sections for illustrating steps in the second embodiment following those shown in FIGS. 42-44, respectively.

The PIN diode described above is fabricated in a method, as will be described hereinafter. After the FIGS. 4-9 steps described above are similarly performed, a predetermined resist pattern 23 is deposited on a surface of n buffer layer 12, as shown in FIG. 42, for selectively providing an $n^+$ layer. Resist pattern 23 is used as a mask for example to inject phosphorus therethrough. Subsequently, resist pattern 23 is removed. Then, as shown in FIG. 43, the semiconductor substrate having phosphorus injected therein has the second major surface subjected to a laser annealing step to melt a region having a predetermined depth from the second major surface to include the phosphorus-injected region to uniform the phosphorus in concentration depthwise. $N^+$ layer 16 having a stepwise impurity concentration profile is thus selectively provided. Subsequently, back surface electrode 18 (see FIG. 37) is deposited to complete the PIN diode.

Figure 44:
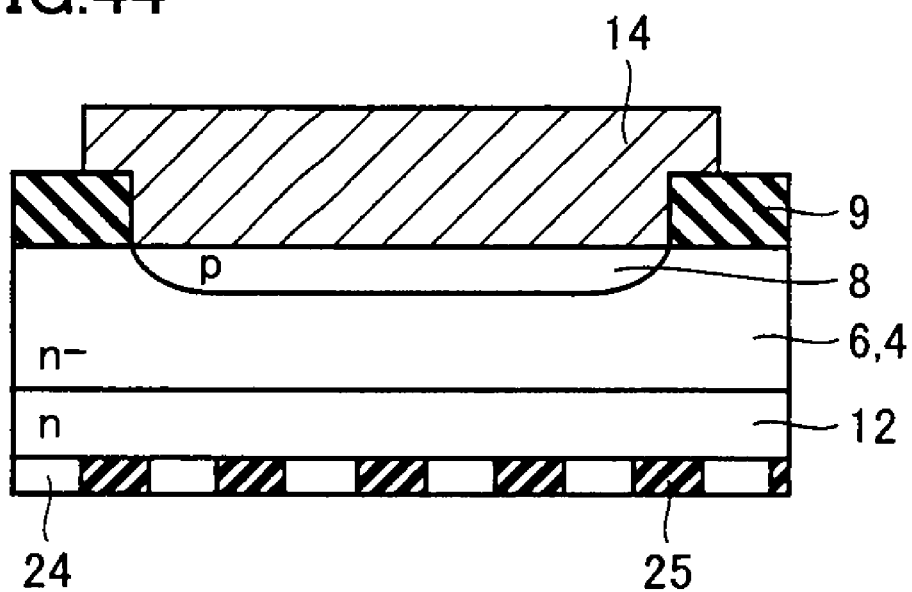
Figure 45:
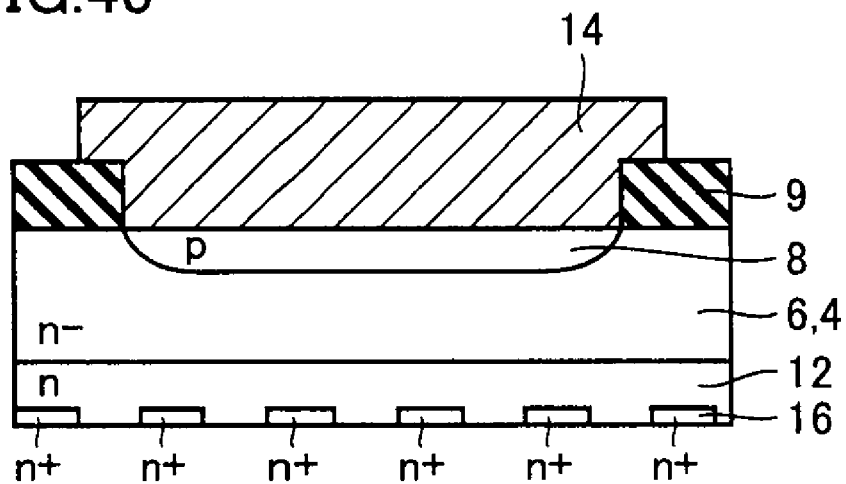

Other than introducing phosphorus, a phosphorus diffusion source may be applied to provide the layer. In that case, initially, as shown in FIG. 44, silicon oxide film 25 is used as a mask to apply phosphorus glass 24 on the semiconductor substrate at the second major surface. Then, phosphorus contained in phosphorus glass 24 is introduced into n buffer layer 12 and a laser annealing step is performed. Thus, as shown in FIG. 45, $n^+$ layer 16 is selectively provided.

The present PIN diode 2 at recovery has carriers behaving, as will be described hereinafter. The present PIN diode 2 has carriers behaving in substantially the same manner as a PIN diode having an n+ layer provided at the entirety of the second major surface (see FIG. 2) does (see FIGS. 29-32), in that n+ layer 16 is provided at a cathode.

In particular, as the present PIN diode has n+ layer 16 selectively provided, electrons and holes injected in the forward biased state (or at point T1 (see FIG. 28)) will have different distributions in density (or carrier density profiles) for a region that has n+ layer 16 and a region that does not have n+ layer 16, respectively.

Figure 46:
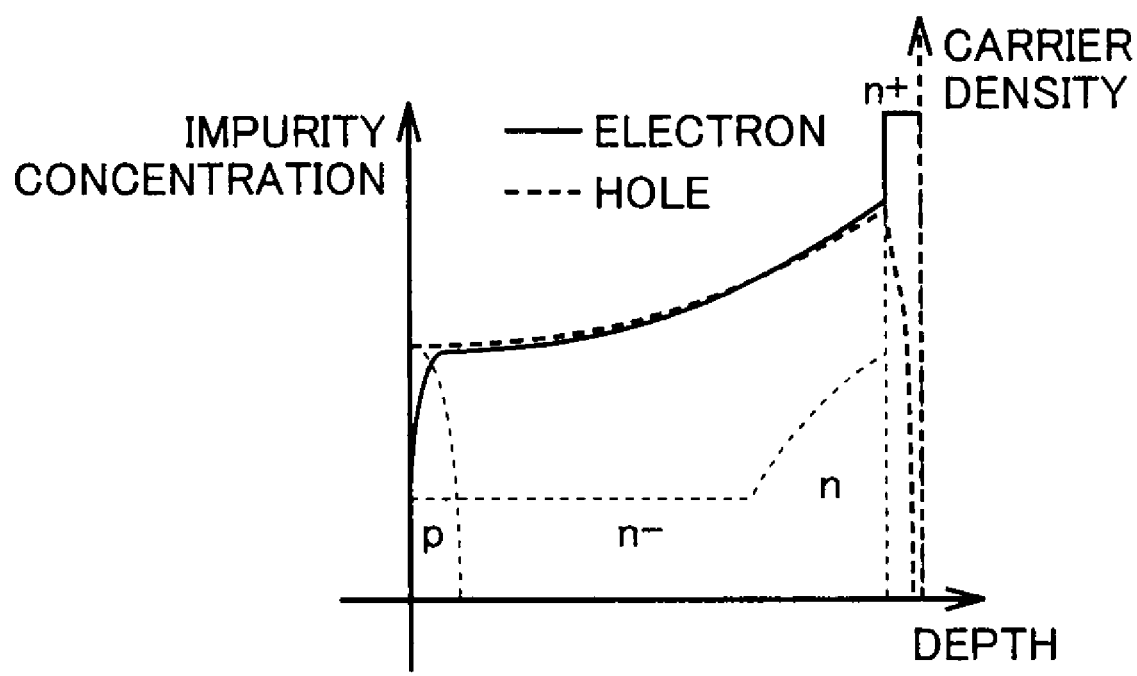
FIG. 46 shows a carrier density profile that the PIN diode in the second embodiment when it is forward biased has, as observed at a cross sectional line XXXVIII-XXXVIII shown in FIG. 37.
Figure 47:
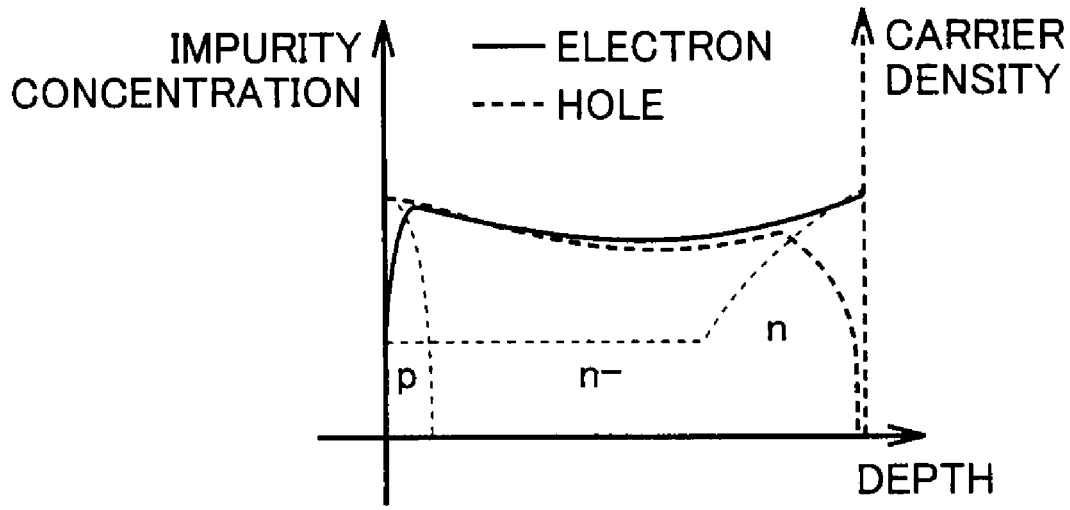
FIG. 47 shows a carrier density profile that the PIN diode in the second embodiment when it is forward biased has, as observed at a cross sectional line XXXIX-XXXIX shown in FIG. 37.

As shown in FIG. 46, a carrier density profile (a profile A) along a cross sectional line passing through the n+ layer has a carrier density at the cathode higher than that at the anode because of the n+ layer. In contrast, as shown in FIG. 47, a carrier density profile (a profile B) along a cross sectional line that does not pass through the n+ layer provides a carrier density at the cathode substantially equal to that at the anode.

Thus, carriers having profile A and profile B as a whole will be injected into PIN diode 2. This means that the amount of carriers (electrons) injected can be varied depending on the n+ layer's area to adjust forward voltage, recovery loss, and the like.

Figure 48:
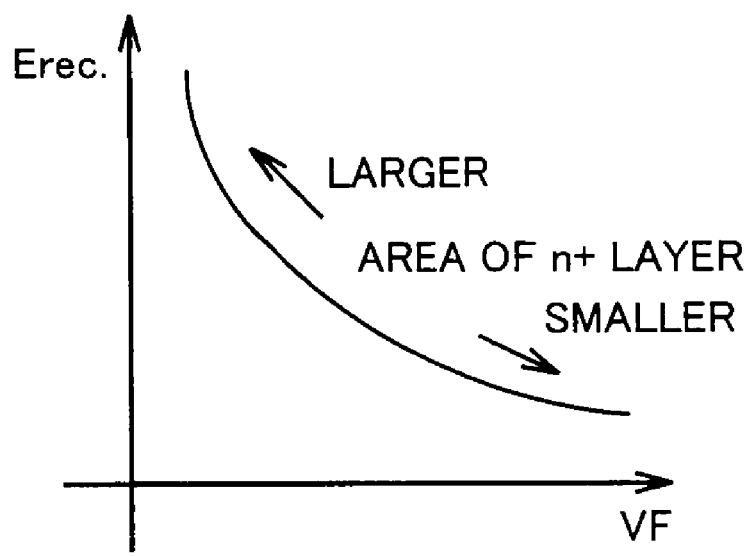
FIG. 48 is a graph showing a correlation between the $n^+$ layer's area and recovery loss and forward voltage in the second embodiment.

More specifically, as shown in FIG. 48, if the n+ layer is formed to have a relatively increased area, an increased amount of carriers is injected and forward voltage (VF) decreases. However, as more carriers are injected, recovery loss (Erec) also increases accordingly. In contrast, if the n+ layer is formed to have a relatively reduced area, a reduced amount of carriers is injected and recovery loss (Erec) decreases. However, forward voltage (VF) will increase. The present PIN diode with an n+ layer varied in area can thus adjust forward voltage, recovery loss and the like recovery characteristics, as desired, with precision to accommodate the inverter device applied.

Third Embodiment

Figure 49:
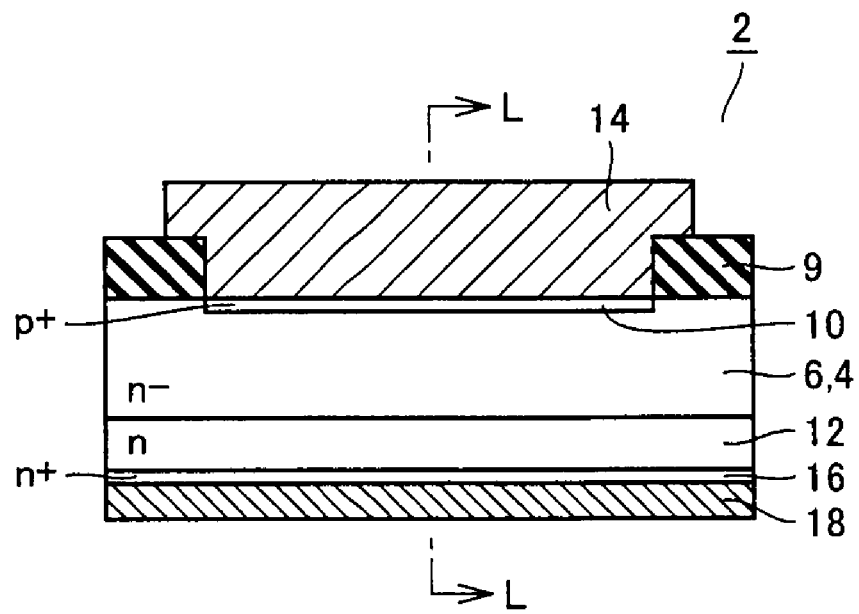
FIG. 49 is a cross section of a PIN diode in a third embodiment of the present invention.

Hereinafter will be described a PIN diode having at an anode a p+ layer having a stepwise impurity concentration profile. As shown in FIG. 49, PIN diode 2 includes n− drift layer 6, a p+ layer 10, n buffer layer 12, n+ layer 16, front surface electrode 14 and back surface electrode 18. P+ layer 10 is provided at n type semiconductor substrate 4 from a first major surface of the substrate to a predetermined depth of the substrate. P+ layer 10 is surrounded on the first major surface by silicon oxide film 9. Front surface electrode 14 is provided on a surface of p+ layer 10 in contact with the surface of p+ layer 10.

N+ layer 16 is provided at semiconductor substrate 4 from a second major surface of the substrate to a predetermined depth of the substrate. N buffer layer 12 is in contact with n+ layer 16 and has a further deeper region. N− drift layer 6 is provided in the semiconductor substrate at a region located between p+ layer 10 and n buffer layer 12. Back surface electrode 18 is provided on a surface of n+ layer 16 in contact with n+ layer 16.

Figure 50:
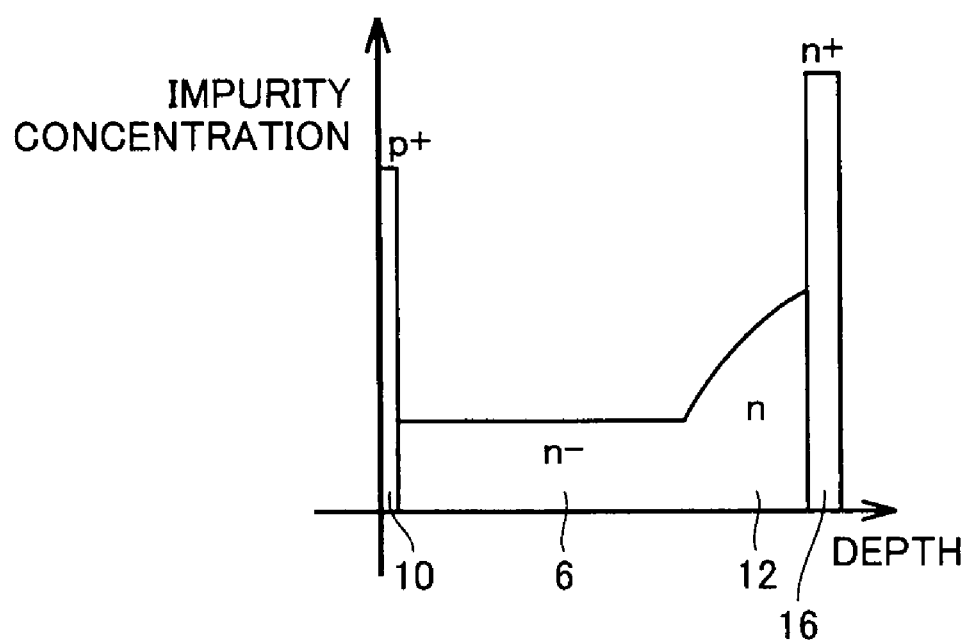
FIG. 50 shows an impurity concentration profile in the third embodiment at a cross sectional line L-L shown in FIG. 49.

PIN diode 2 has an impurity concentration, as will be described hereinafter. As shown in FIG. 50, p+ layer 10 has an impurity concentration having a stepwise profile substantially fixed for a predetermined depth measured from the first major surface. Furthermore, n+ layer 16 also has an impurity concentration having a stepwise profile substantially fixed for a predetermined depth measured from the second major surface. N buffer layer 12 has an impurity concentration gently decreasing as seen at n+ layer 16 toward n− drift layer 6. N− drift layer 6 has an impurity concentration reflecting that of semiconductor substrate 4 and thus substantially fixed depthwise.

The present PIN diode 2 having p+ and n+ layers 10 and 16 each having a stepwise impurity concentration profile allows electrons and in addition thereto holes to be injected from n+ layer 16 and p+ layer 10, respectively, more efficiently to achieve an increased modulation level, as will be described later.

Figure 51:
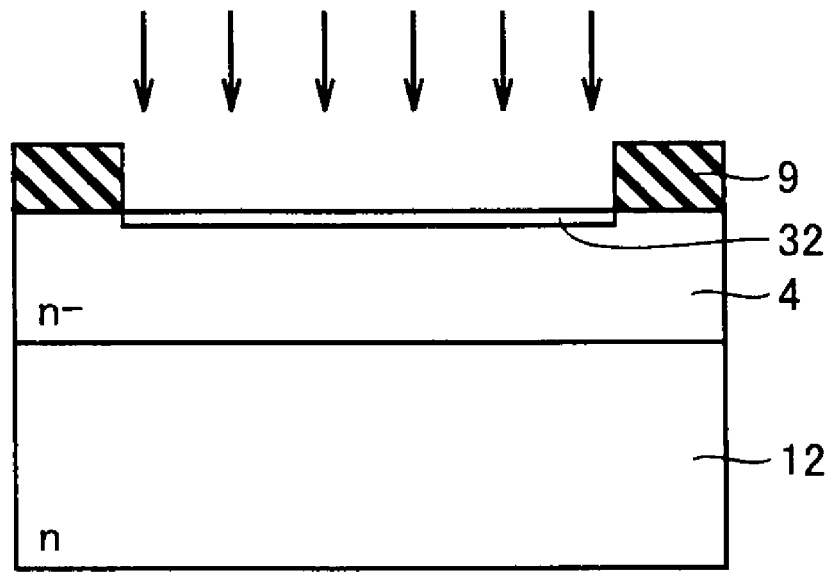
FIG. 51 is a cross section showing a step of a method of fabricating the FIG. 49 PIN diode in the third embodiment.
Figure 52:
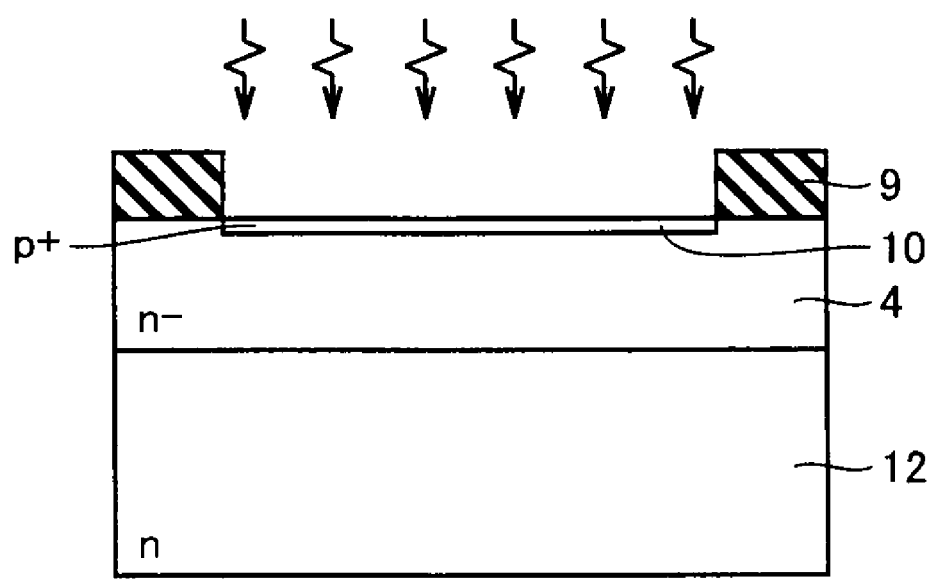
FIGS. 52 and 53 are cross sections for illustrating steps in the third embodiment following those shown in FIGS. 51 and 52, respectively.

The PIN diode described above is fabricated in a method, as will be described hereinafter. After the FIGS. 4 and 5 steps described above are similarly performed, silicon oxide film 9 is used as a mask to for example inject boron therethrough into the semiconductor substrate at the first major surface to provide an impurity layer 32, as shown in FIG. 51. Then, as shown in FIG. 52, a laser annealing step is performed. More specifically, for example, the semiconductor substrate's first major surface having boron injected therein is exposed to at least tens W of YAG laser light to melt a region having a predetermined depth from the first major surface to include the boron-injected impurity layer 32 to provide a uniform concentration of boron as seen depthwise.

P+ layer 10 having a stepwise impurity concentration profile is thus provided. Other than injecting boron to introduce boron into the semiconductor substrate, for example boron deposition or boron glass may be applied to introduce boron into the semiconductor substrate.

Figure 53:
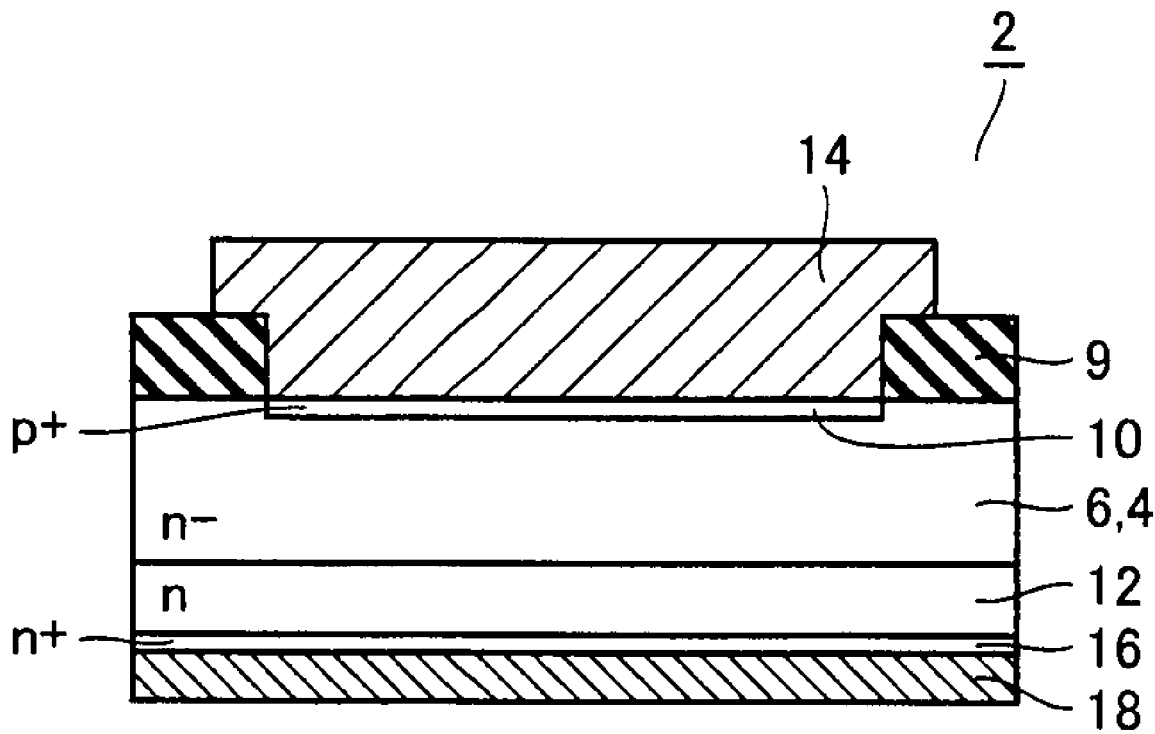

Subsequently, the FIGS. 7-9 steps are similarly performed to provide the semiconductor substrate at the first major surface with front surface electrode 14 and furthermore the FIGS. 10 and 11 steps are similarly performed to provide semiconductor substrate 4 at the second major surface with n+ layer 16 having a stepwise impurity concentration profile. Then, as shown in FIG. 53, back surface electrode 18 is deposited on a surface of n+ layer 16 to complete PIN diode 2.

Figure 54:
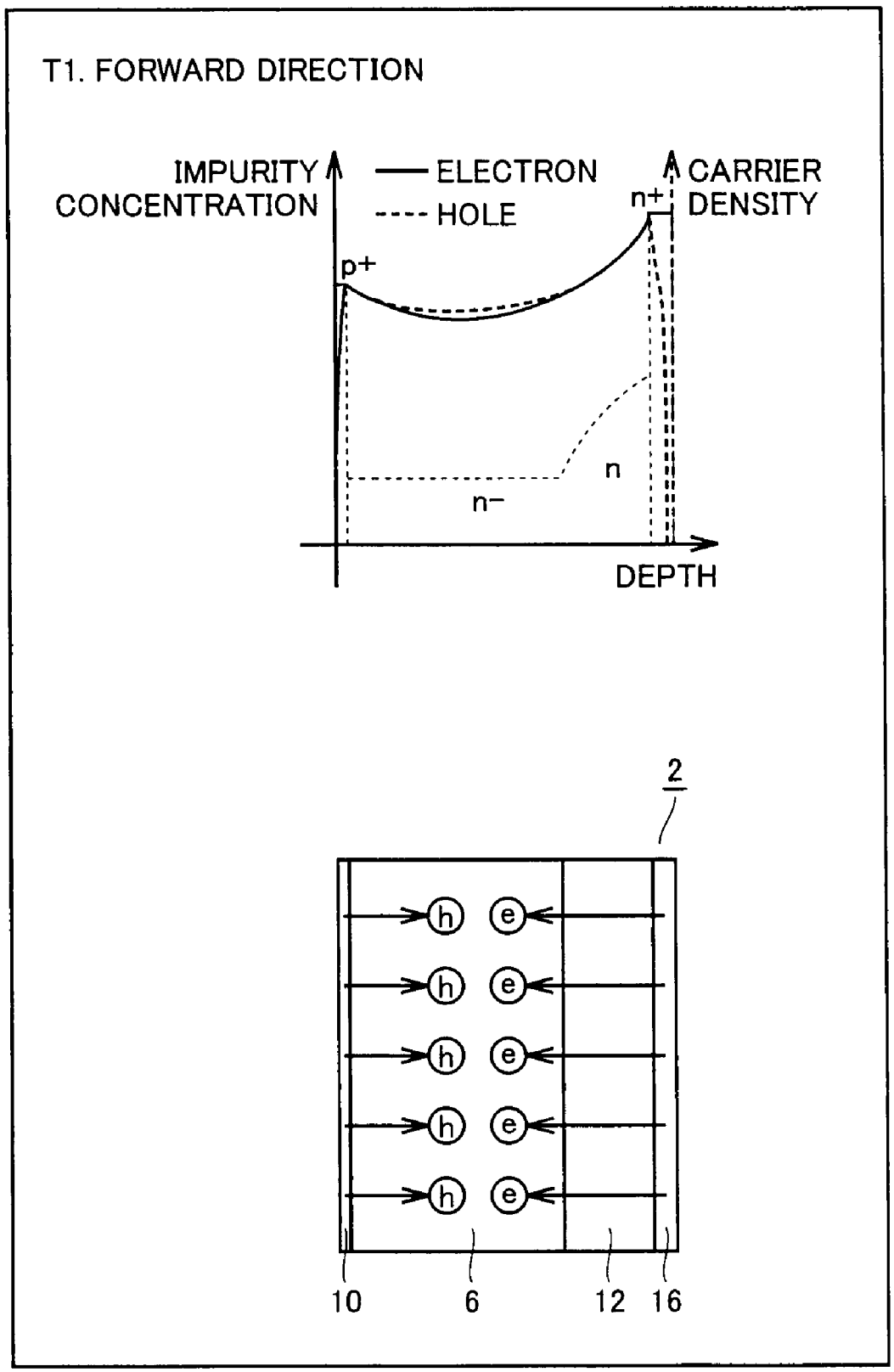
FIG. 54 represents the PIN diode's carrier concentration profile and behavior in the third embodiment at recovery in a first state.

The present PIN diode 2 at recovery has carriers behaving, as will be described hereinafter. Initially, when PIN diode 2 has a freewheeling current passing therethrough or is forward biased (or at point T1 (see FIG. 28)), electrons are injected from n+ layer 16 toward n− drift layer 6 and holes are injected from p+ layer 10 toward n− drift layer 6, as shown in FIG. 54.

Figure 55:
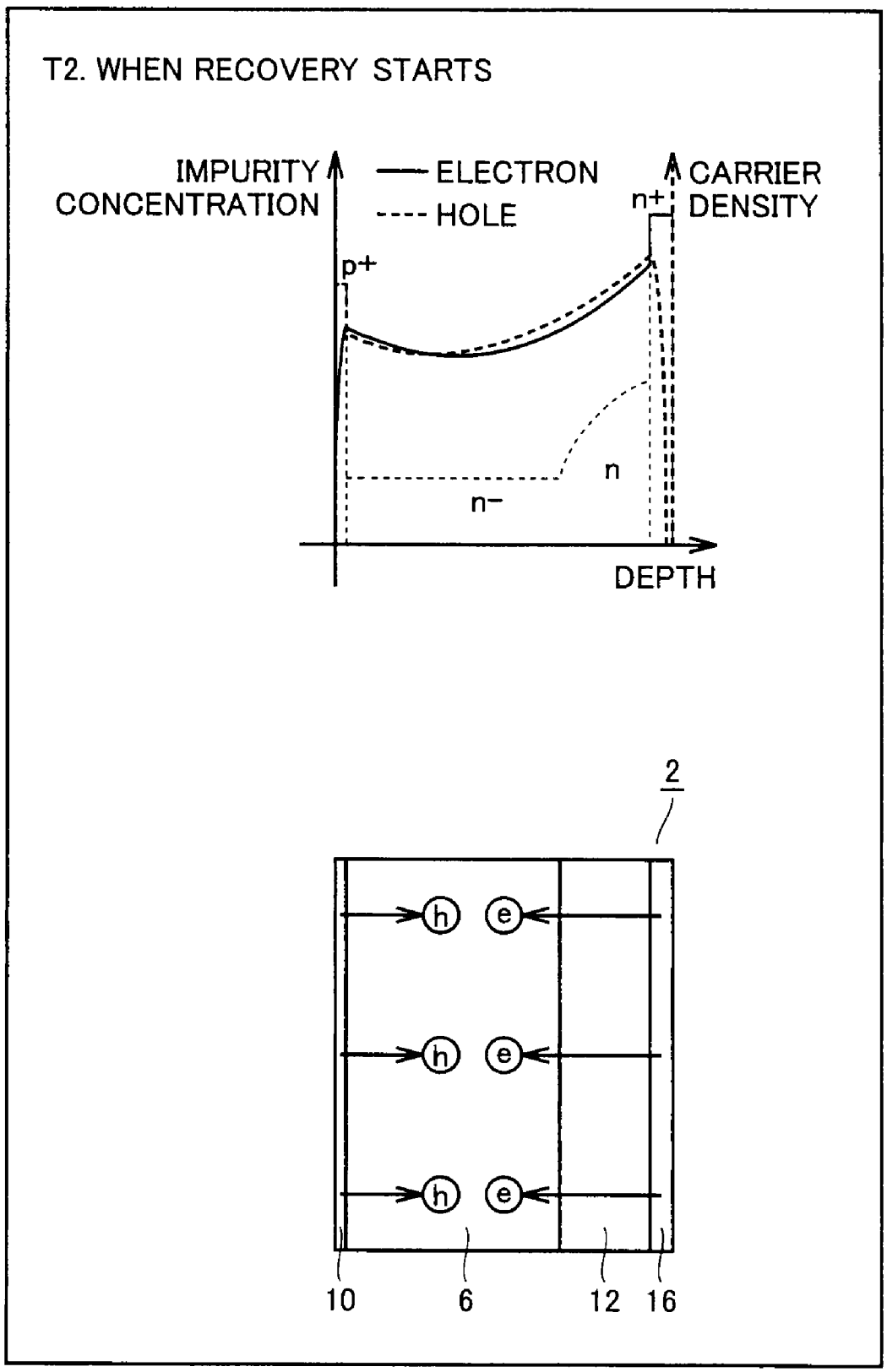
FIGS. 55-57 represent the PIN diode's carrier concentration profile and behavior in the third embodiment at recovery in second to fourth states following the first to third states, respectively.

Then, when PIN diode 2 forward biased is reverse biased and the current flowing through PIN diode 2 gradually decreases (or at point T2), the number of electrons injected from n+ layer 16 toward n− drift layer 6 decreases and that of holes injected from p+ layer 10 toward n− drift layer 6 also decreases, as shown in FIG. 55.

Then, as time elapses, depletion layer D expands from an interface between p+ layer 10 and n− drift layer 6, and of carriers stored in PIN diode 2, electrons are discharged toward the cathode and holes are discharged toward the anode and PIN diode 2 will have a reverse recovery current passing therethrough.

Figure 56:
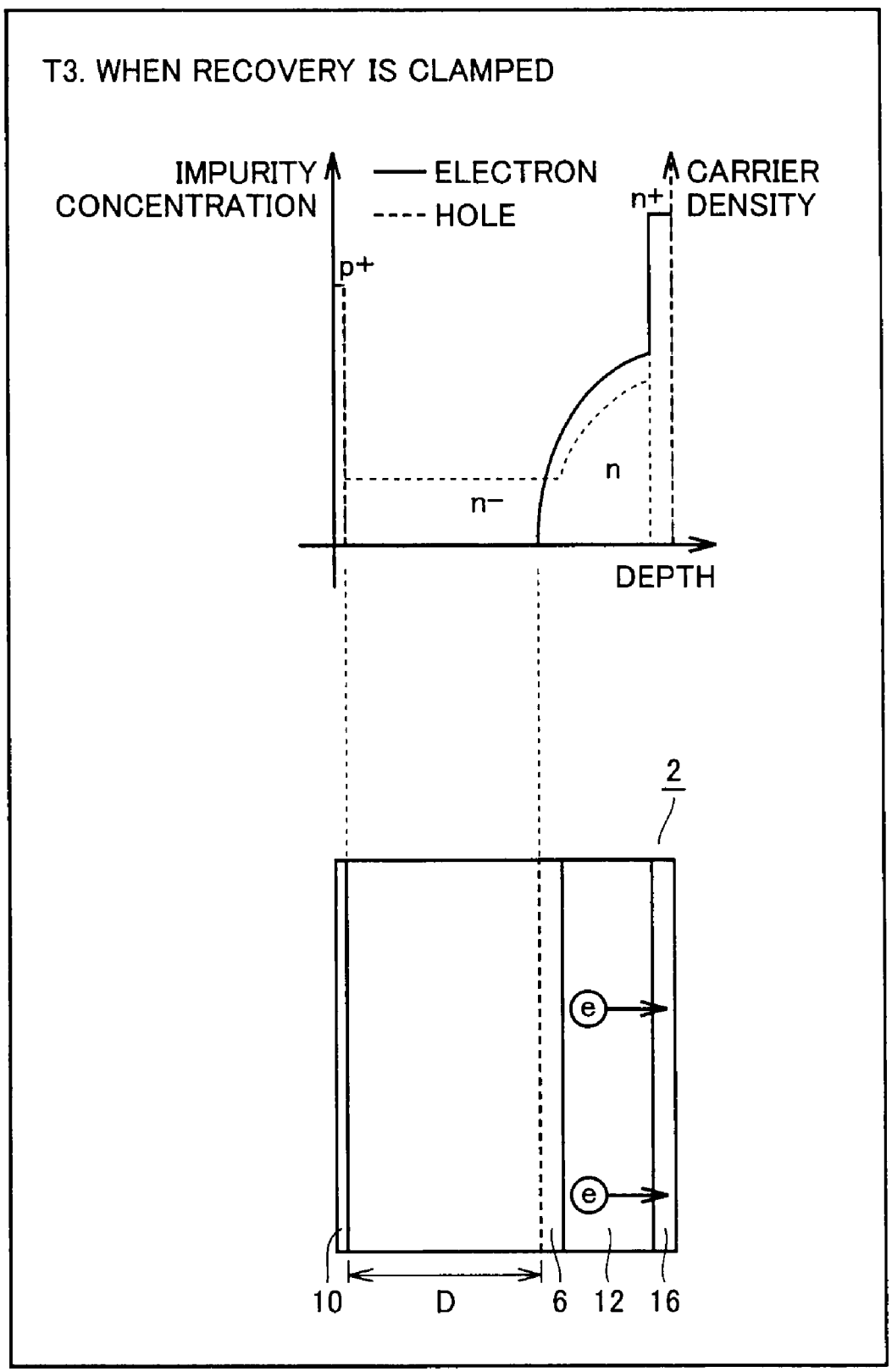
Figure 57:
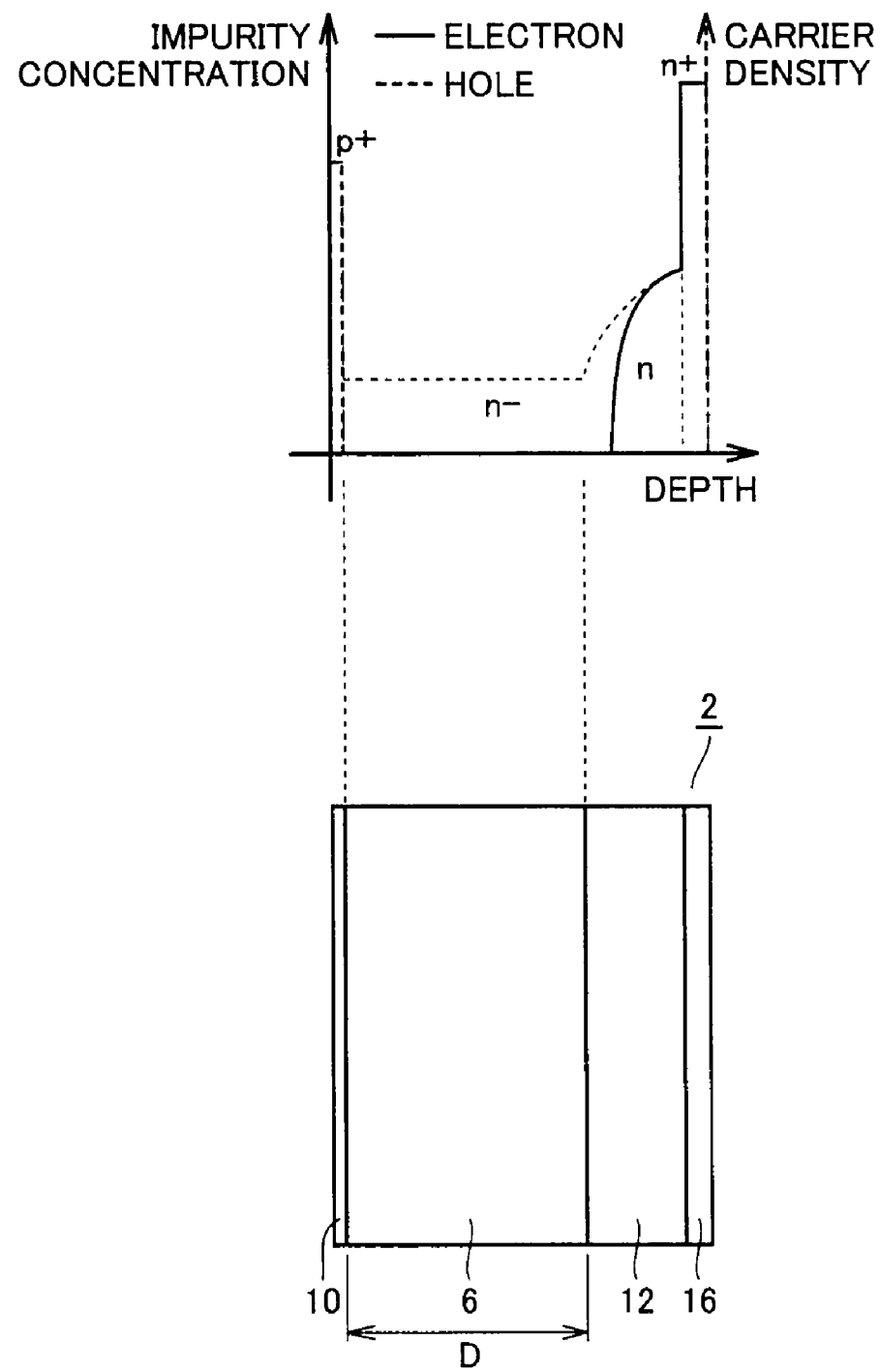

Then, when recovery is clamped (or at point T3), carriers remaining in a vicinity of a boundary between n buffer layer 12 and n− drift layer 6 are discharged or recombine and disappear, as shown in FIG. 56. Then, when recovery ends (or at point T4), depletion layer D expands to a vicinity of the boundary between n− drift layer 6 and n buffer layer 12 and remaining carriers mainly recombine and disappear, as shown in FIG. 57, and the diode is turned off.

The present PIN diode 2 has n+ layer 16 having a stepwise impurity concentration profile and, in addition thereto, p+ layer 10 having a stepwise impurity concentration profile. This can provide an effect of the FIG. 2 PIN diode and in addition thereto an effect, as follows: In the forward biased state holes that are injected from p+ layer 10 into n− drift layer 6 can be injected more efficiently and PIN diode 2's modulation level can further be increased. Furthermore, as carriers are injected more efficiently, a decreased on resistance can be achieved and an increased carrier density can be provided, and oscillation caused at recovery can be minimized or prevented.

The semiconductor device described above has $p^+$ layer 10 and $n^+$ layer 16 at an anode and a cathode, respectively. Alternatively, a PIN diode may be provided that does not have a stepwise impurity layer of an $n^+$ layer but of only a $p^+$ layer provided at an anode.

Fourth Embodiment

Figure 58:
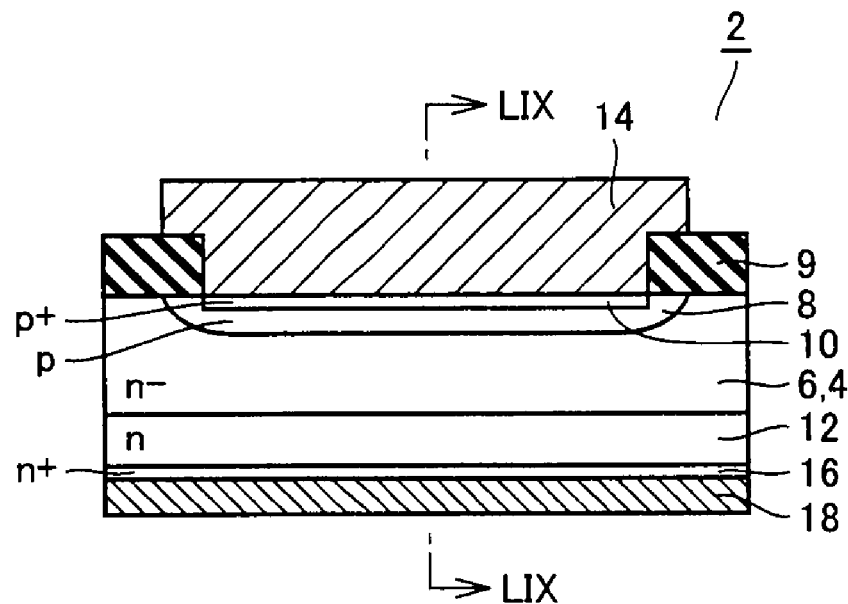
FIG. 58 is a cross section of a PIN diode in a fourth embodiment of the present invention.

Hereinafter will be described a PIN diode having at a p anode layer a $p^+$ layer having a stepwise impurity concentration profile. As shown in FIG. 58, the present PIN diode 2 has $p^+$ layer 10 provided in semiconductor substrate 4 at the first major surface and having a predetermined depth from the surface, and p anode layer 8 surrounding $p^+$ layer 10 sideways and thereunder. The remainder in configuration is similar to the FIG. 49 PIN diode. Accordingly, identical components are identically denoted and will not be described repeatedly.

Figure 59:
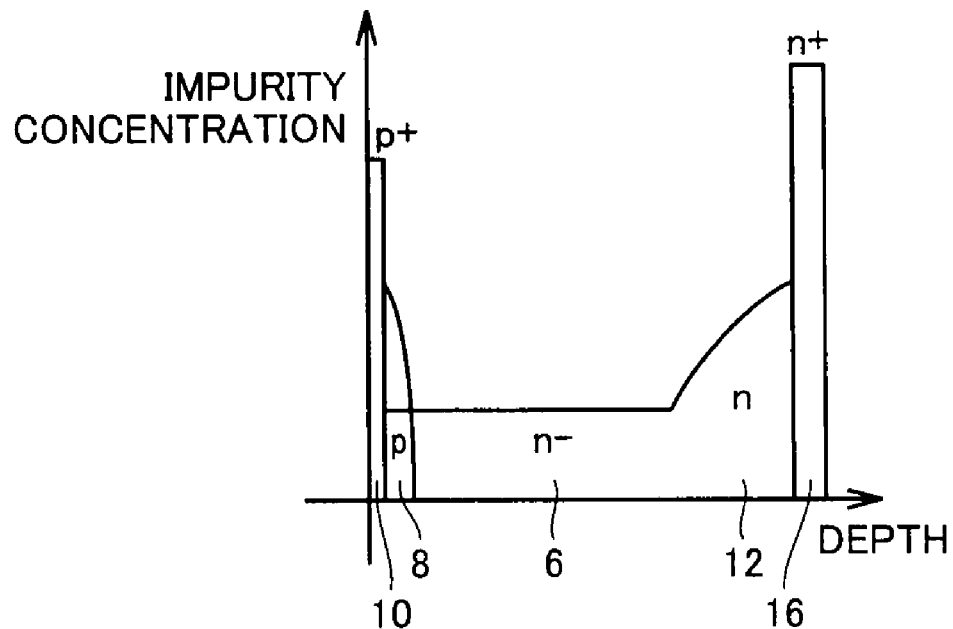
FIG. 59 shows an impurity concentration profile in the fourth embodiment at a cross sectional line LIX-LIX shown in FIG. 58.

PIN diode 2 has an impurity concentration, as will be described hereinafter. As shown in FIG. 59, $p^+$ layer 10 has an impurity concentration having a stepwise profile substantially fixed for a predetermined depth measured from the first major surface. Furthermore, $n^+$ layer 16 also has an impurity concentration having a stepwise profile substantially fixed for a predetermined depth measured from the second major surface. P anode layer 8 has an impurity concentration relatively steeply decreasing as seen at $p^+$ layer 10 toward $n^-$ drift layer 6. N buffer layer 12 has an impurity concentration gently decreasing as seen at $n^+$ layer 16 toward $n^-$ drift layer 6. $N^-$ drift layer 6 has an impurity concentration reflecting that of semiconductor substrate 4 and thus substantially fixed depthwise.

The present PIN diode 2 that has $p^+$ layer 10 can provide an increased modulation level, and the present PIN diode 2 that furthermore has $p^+$ layer 10 surrounded by p anode layer 8 can minimize or prevent oscillation, as will be described later.

Figure 60:
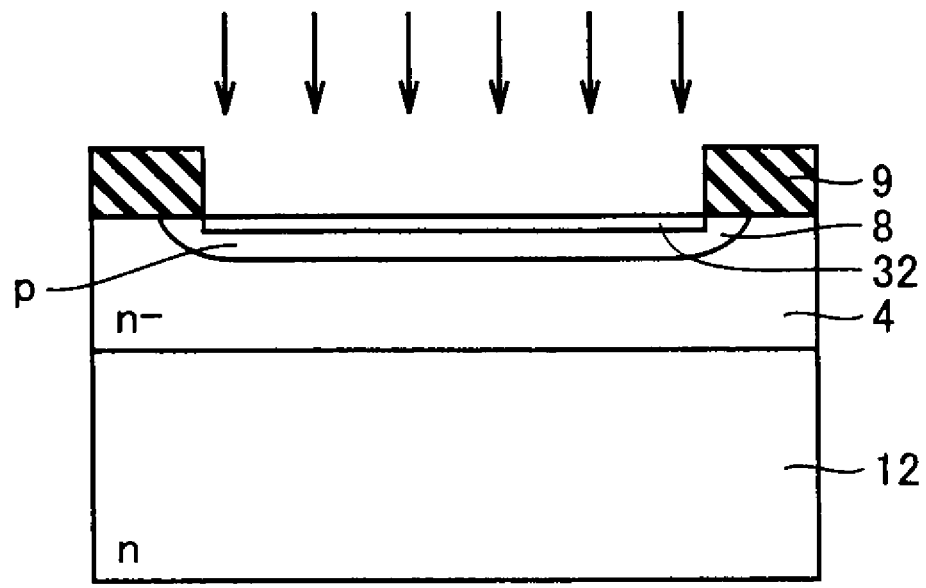
FIG. 60 is a cross section showing a step of a method of fabricating the FIG. 58 PIN diode in the fourth embodiment.
Figure 61:
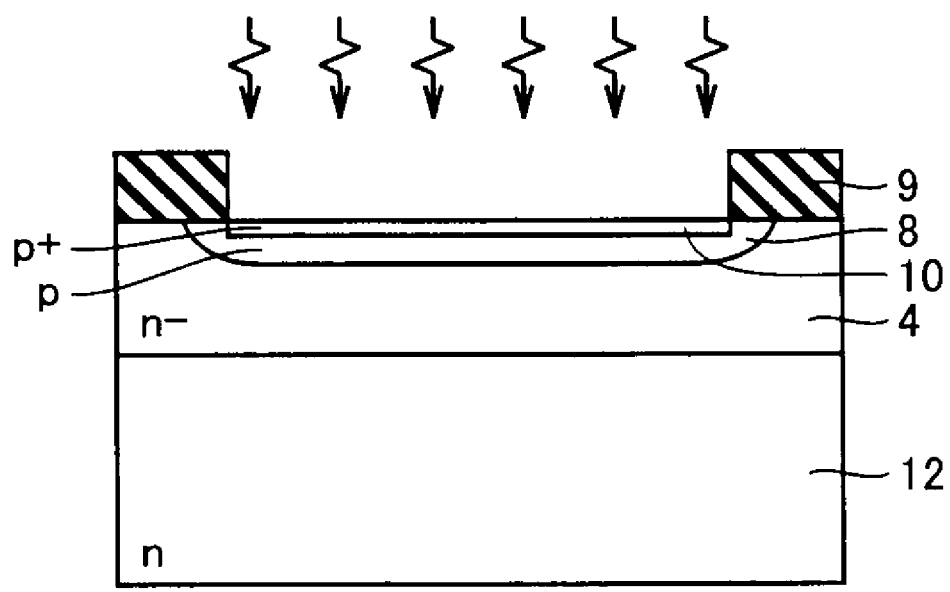
FIGS. 61 and 62 are cross sections for illustrating steps in the fourth embodiment following those shown in FIGS. 60 and 61, respectively.

The PIN diode described above is fabricated in a method, as will be described hereinafter. After the FIGS. 4-9 steps described above are similarly performed, silicon oxide film 9 is used as a mask to for example inject boron therethrough into semiconductor substrate 4 at the first major surface to provide impurity layer 32, as shown in FIG. 60. Then, as shown in FIG. 61, a laser annealing step is performed. More specifically, for example, the semiconductor substrate's first major surface having boron injected therein is exposed to at least tens W of YAG laser light to melt a region having a predetermined depth from the first major surface to include the boron-injected impurity layer 32 to provide a uniform concentration of boron as seen depthwise.

$P^+$ layer 10 having a stepwise impurity concentration profile is thus provided. Other than injecting boron to introduce boron into the semiconductor substrate, for example boron deposition or boron glass may be applied to introduce boron into the semiconductor substrate.

Figure 62:
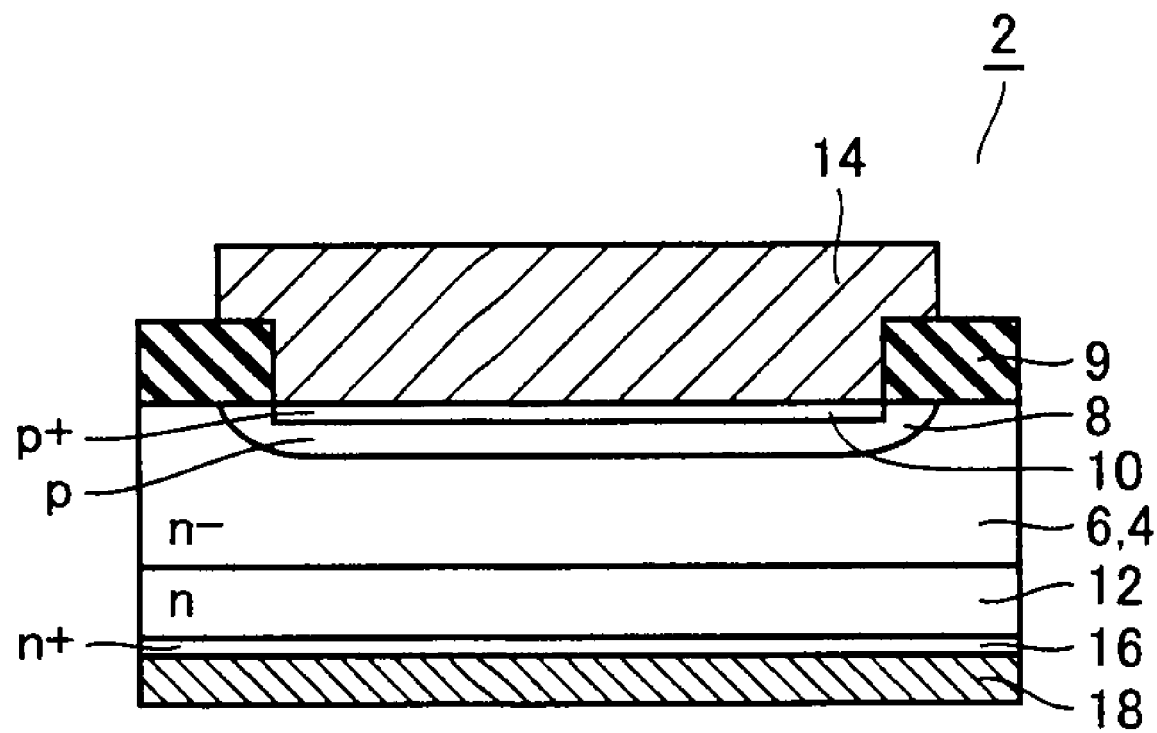

Subsequently, the FIGS. 7-9 steps are similarly performed to provide the semiconductor substrate at the first major surface with front surface electrode 14 and furthermore the FIGS. 10 and 11 steps are similarly performed to provide semiconductor substrate 4 at the second major surface with $n^+$ layer 16 having a stepwise impurity concentration profile. Then, as shown in FIG. 62, back surface electrode 18 is provided on a surface of $n^+$ layer 16 to complete PIN diode 2.

Figure 63:
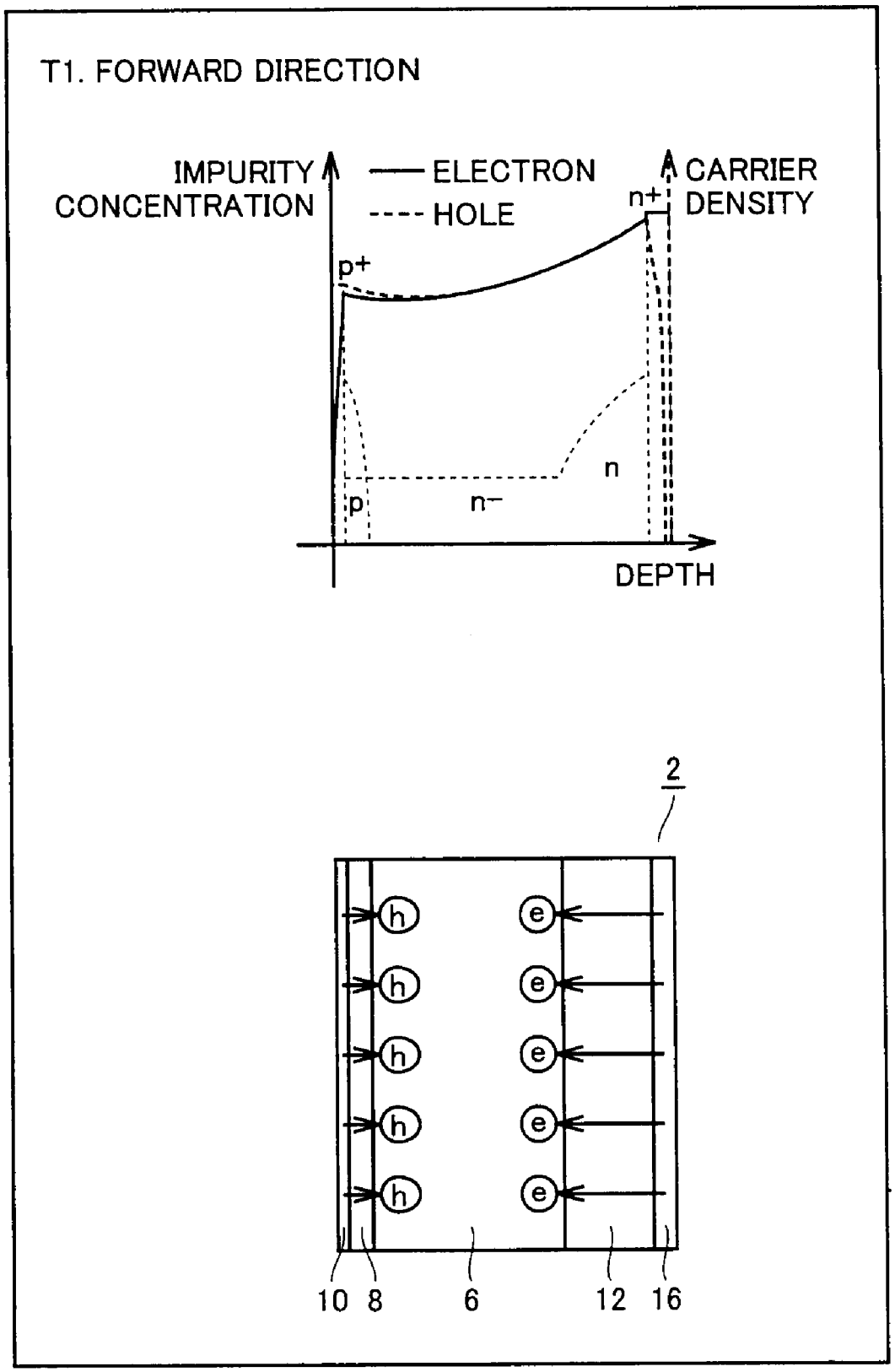
FIG. 63 represents the PIN diode's carrier concentration profile and behavior in the fourth embodiment at recovery in a first state.

The present PIN diode 2 at recovery has carriers behaving, as will be described hereinafter. Initially, when PIN diode 2 has a freewheeling current passing therethrough or is forward biased (or at point T1 (see FIG. 28)), electrons are injected from $n^+$ layer 16 toward $n^-$ drift layer 6 and holes are injected from $p^+$ layer 10 toward $n^-$ drift layer 6, as shown in FIG. 63.

Figure 64:
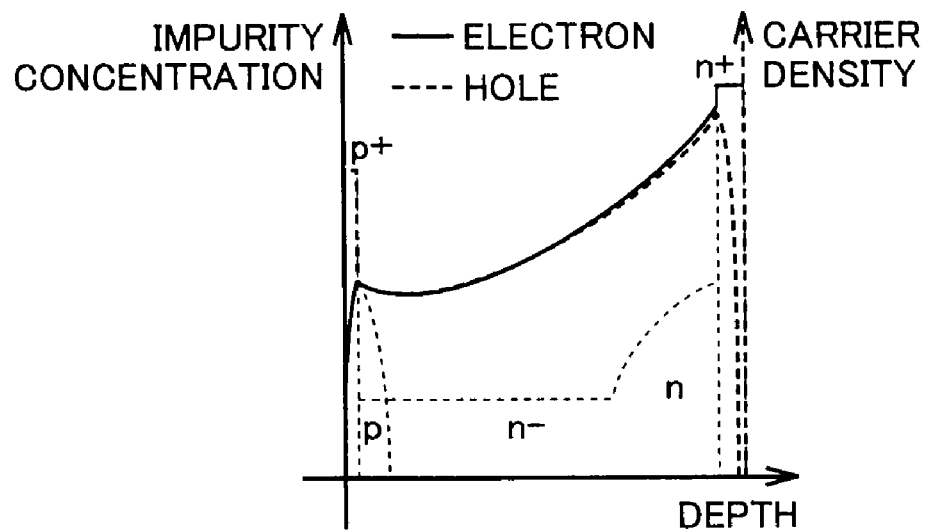
FIGS. 64-66 represent the PIN diode's carrier concentration profile and behavior in the fourth embodiment at recovery in second to fourth states following the first to third states, respectively.
Figure 64:
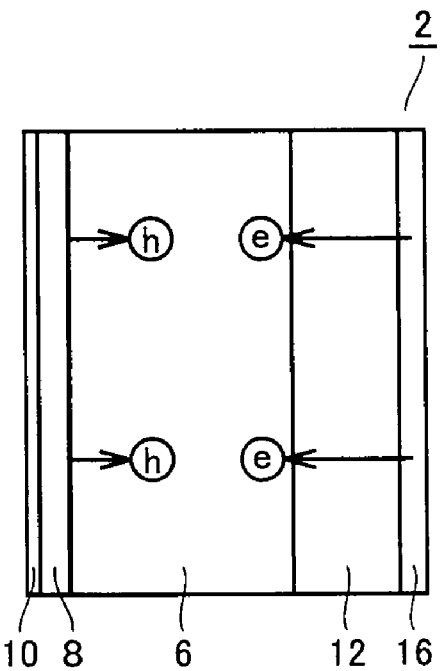

Then, when PIN diode 2 forward biased is reverse biased and the current flowing through PIN diode 2 gradually decreases (or at point T2 (see FIG. 28)), the number of electrons injected from $n^+$ layer 16 toward $n^-$ drift layer 6 decreases and that of holes injected from $p^+$ layer 10 toward $n^-$ drift layer 6 also decreases, as shown in FIG. 64.

Then, as time elapses, depletion layer D expands from an interface between $p^+$ layer 10 and $n^-$ drift layer 6, and of carriers stored in PIN diode 2, electrons are discharged toward the cathode and holes are discharged toward the anode and PIN diode 2 will have a reverse recovery current passing therethrough.

Figure 65:
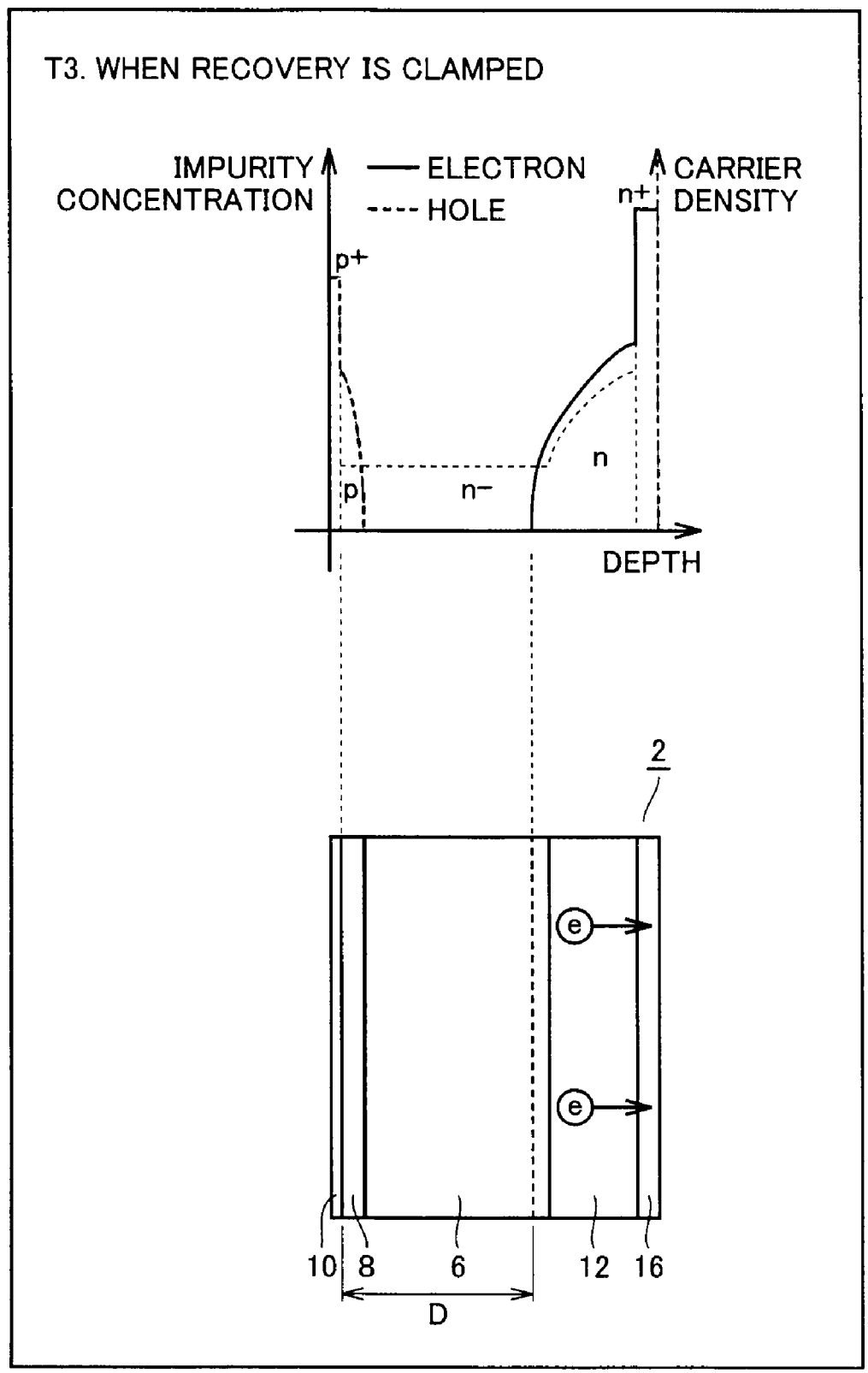
Figure 66:
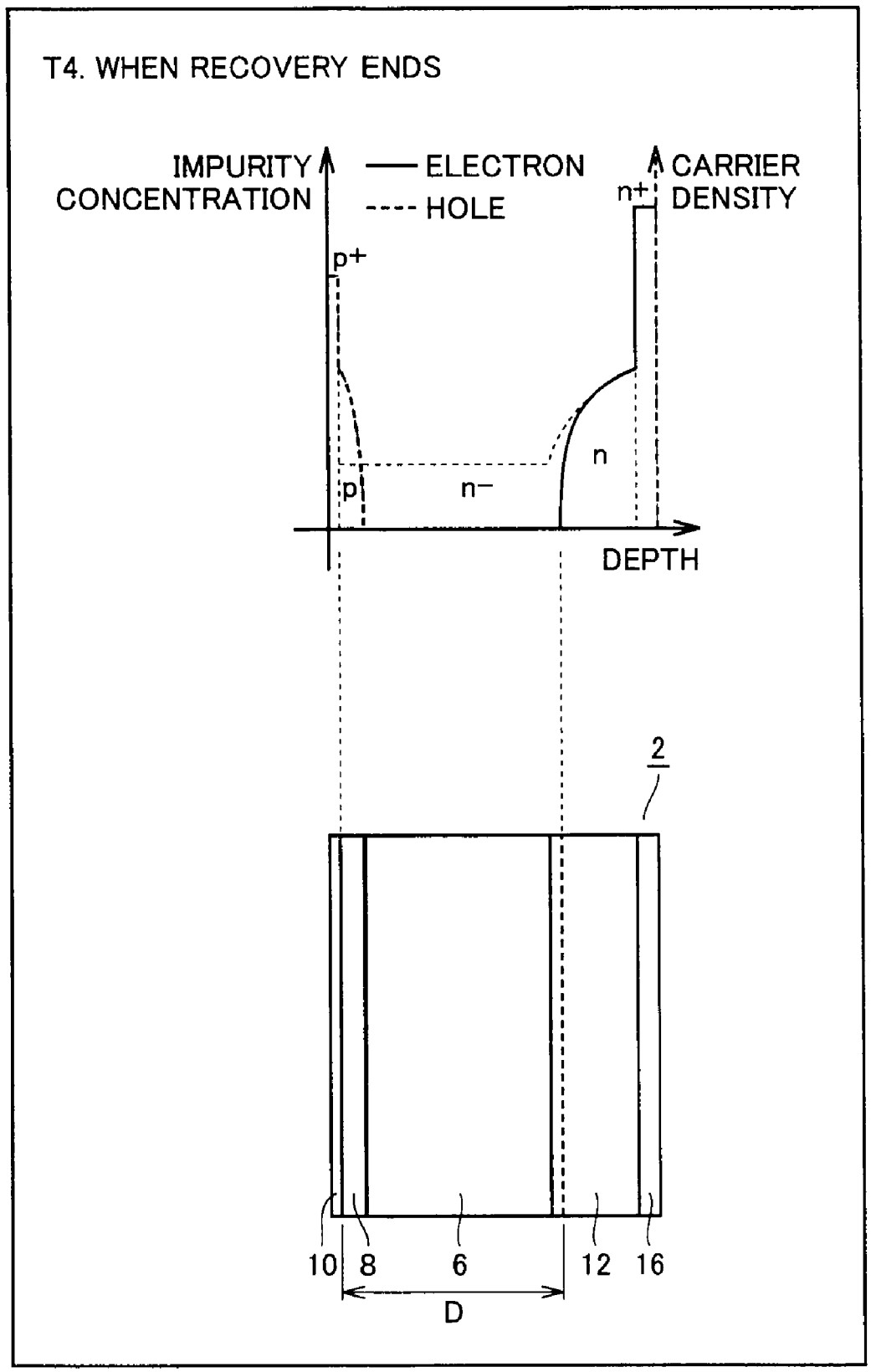

Then, when recovery is clamped (or at point T3 (see FIG. 28)), carriers remaining in a vicinity of a boundary between n buffer layer 12 and $n^-$ drift layer 6 are discharged or recombine and disappear, as shown in FIG. 65. Then, when recovery ends (or at point T4 (see FIG. 28)), depletion layer D expands to a vicinity of the boundary between $n^-$ drift layer 6 and n buffer layer 12 and remaining carriers mainly recombine and disappear, as shown in FIG. 66, and the diode is turned off.

The present PIN diode 2 has p anode layer 8, and $n^+$ and $p^+$ layers 16 and 10 each having a stepwise impurity concentration profile. Thus in the forward biased state electrons that are injected from $n^+$ layer 16 into $n^-$ drift layer 6 can be injected more efficiently and holes that are injected from $p^+$ layer 10 into $n^-$ drift layer 6 can be injected more efficiently and PIN diode 2's modulation level can further be increased. Furthermore, as carriers are injected more efficiently, a decreased on resistance can be achieved and an increased carrier density can be provided, and oscillation caused at recovery can be minimized or prevented. Furthermore, at recovery, the depletion layer expands slowly and a reverse recovery current can be gradually decreased to achieve so-called soft recovery.

Fifth Embodiment

Figure 67:
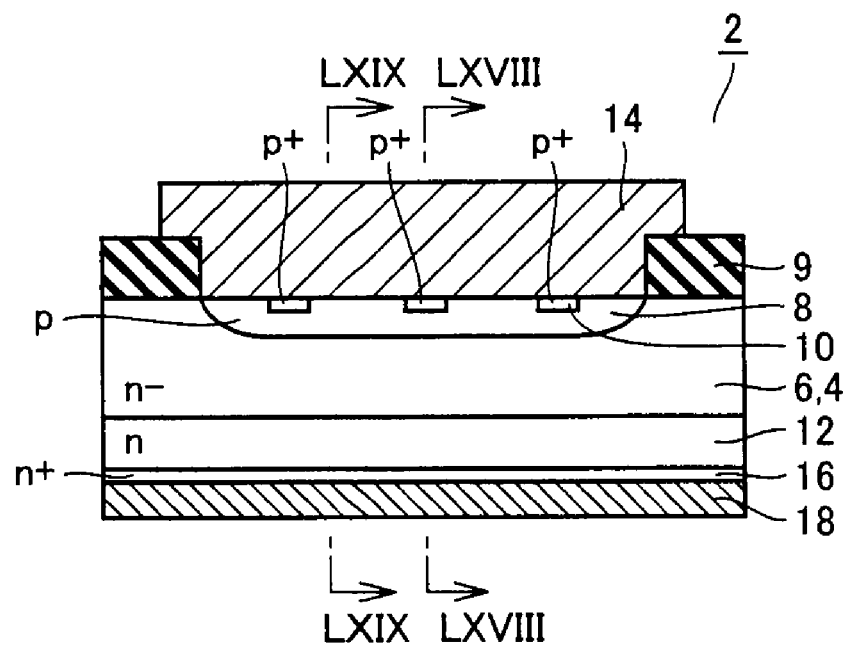
FIG. 67 is a cross section of a PIN diode of a fifth embodiment of the present invention.

Hereinafter will be described a PIN diode having a $p^+$ layer having a stepwise impurity concentration profile, that is selectively provided. As shown in FIG. 67, the present PIN diode 2 has $p^+$ layer 10 selectively provided. Front surface electrode 14 is provided in contact with $p^+$ layer 10 and p anode layer 8. The remainder in configuration is similar to the FIG. 62 PIN diode. Accordingly, identical components are identically denoted and will not be described repeatedly.

Figure 68:
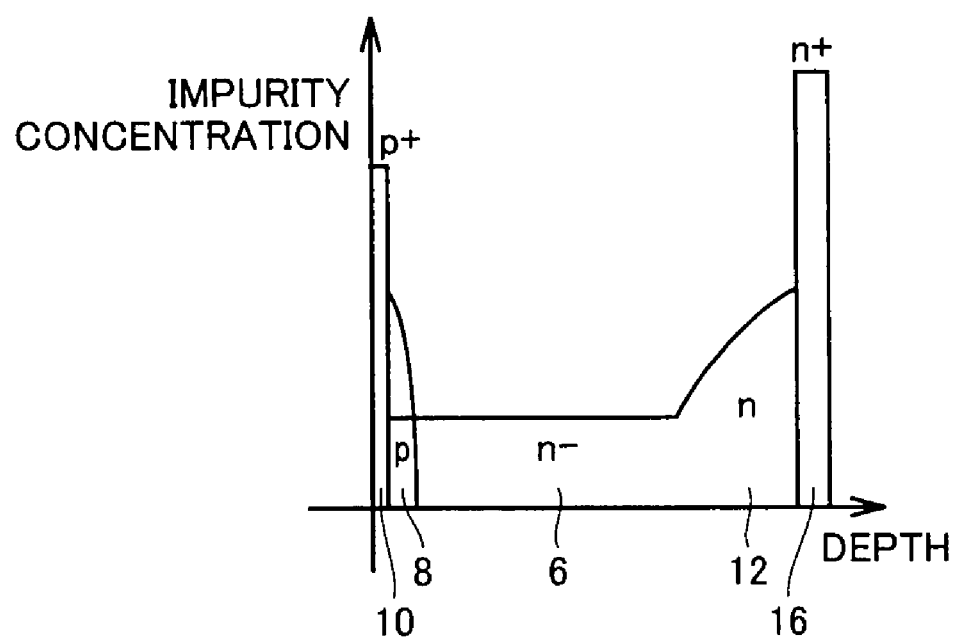
FIG. 68 shows an impurity concentration profile in the fifth embodiment at a cross sectional line LXVIII-LXVIII shown in FIG. 67.
Figure 69:
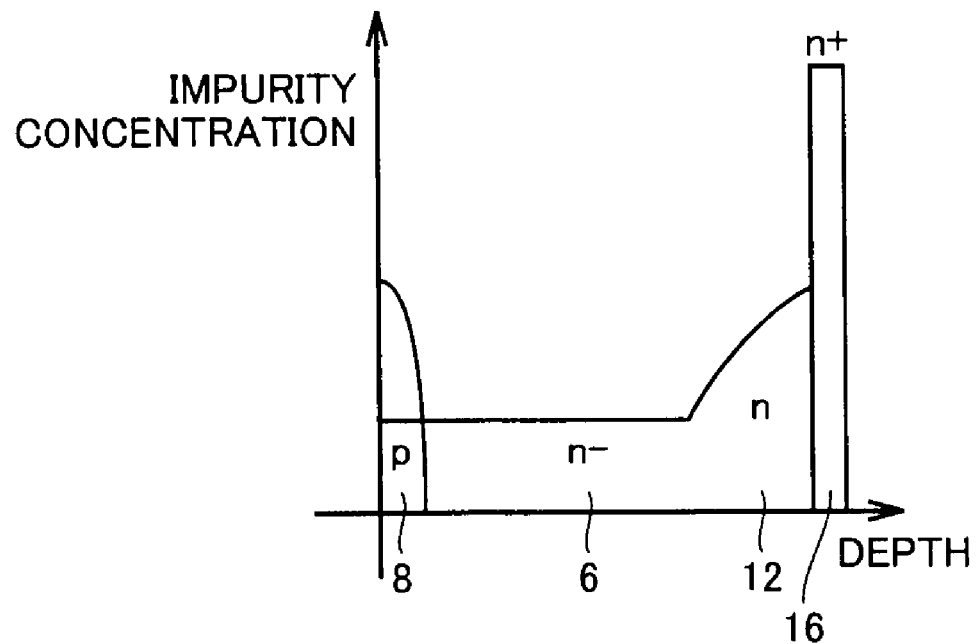
FIG. 69 shows an impurity concentration profile in the fifth embodiment at a cross sectional line LXIX-LXIX shown in FIG. 67.
Figure 70:
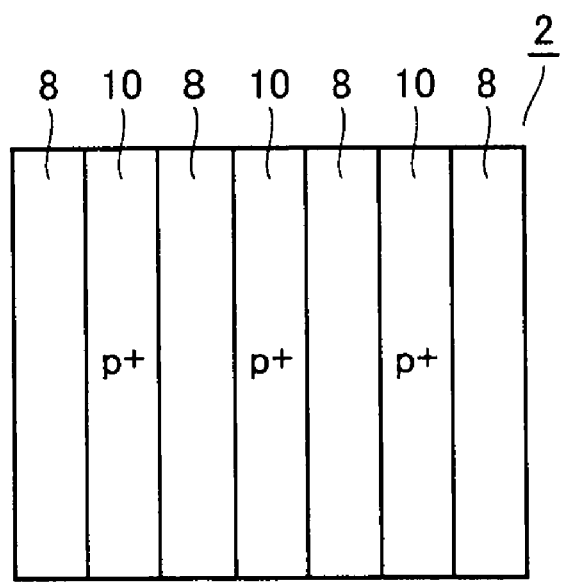
FIGS. 70 and 71 show a selectively provided $p^+$ layer in the fifth embodiment having one and another exemplary patterns, as shown in plan views, respectively.
Figure 71:
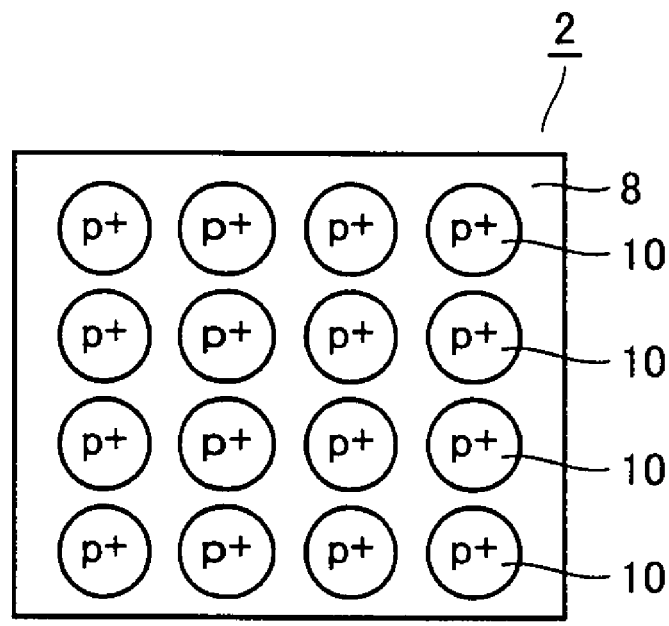

PIN diode 2 has an impurity concentration as will be described hereinafter. As the present PIN diode 2 has a $p^+$ layer selectively provided, an impurity concentration along a cross sectional line passing through the $p^+$ layer has a stepwise profile attributed to the $n^+$ layer and that attributed to the $p^+$ layer, as shown in FIG. 68. In contrast, an impurity concentration along a cross sectional line that does not pass through the $p^+$ layer only has a stepwise profile attributed to the $n^+$ layer, as shown in FIG. 69. $P^+$ layer 10 thus selectively provided may have a pattern such as a strip as shown in FIG. 70 or in the form of an island as shown in FIG. 71.

The present PIN diode 2 having $p^+$ layer 10 having a stepwise impurity concentration profile that is selectively provided, as will be described hereinafter, allows a modulation level or the like to be adjusted with precision.

Figure 72:
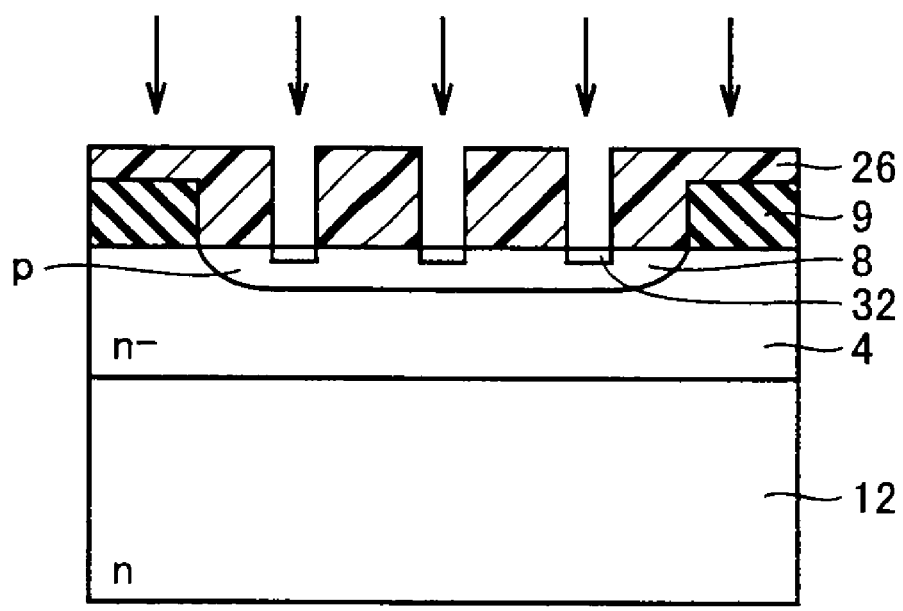
FIG. 72 is a cross section for illustrating a step of a method of fabricating the FIG. 67 PIN diode in the fifth embodiment.
Figure 73:
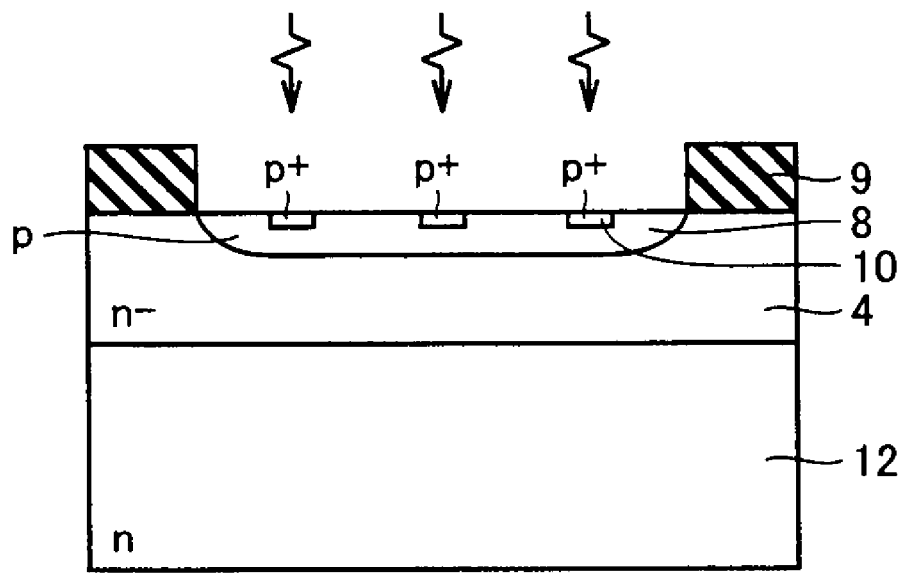
FIGS. 73 and 74 are cross sections for illustrating steps in the fifth embodiment following those shown in FIGS. 72 and 73, respectively.

The PIN diode described above is fabricated in a method, as will be described hereinafter. After the FIGS. 4-6 steps described above are similarly performed, a predetermined resist pattern 26 is deposited, as shown in FIG. 72, for selectively providing a $p^+$ layer. Resist pattern 26 is used as a mask for example to inject boron therethrough to provide impurity layer 32. Subsequently, resist pattern 26 is removed. Then, as shown in FIG. 73, the semiconductor substrate 4 first major surface having boron injected therein undergoes a laser annealing step to melt a region having a predetermined depth from the first major surface to include the boron-injected impurity layer 32 to uniform the boron in concentration depthwise.

P$^+$ layer 10 having a stepwise impurity concentration profile is thus provided. Other than injecting boron to introduce boron into the semiconductor substrate, for example boron deposition or boron glass may be applied to introduce boron into the semiconductor substrate.

Figure 74:
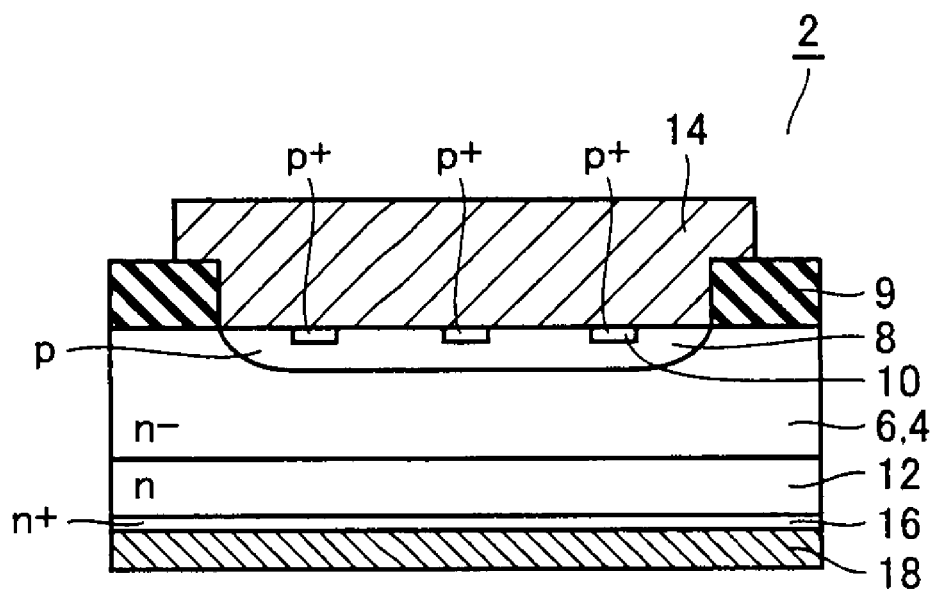

Subsequently, the FIGS. 7-9 steps are similarly performed to provide the semiconductor substrate at the first major surface with front surface electrode 14 (see FIG. 74) and furthermore the FIGS. 10 and 11 steps are similarly performed to provide semiconductor substrate 4 at the second major surface with n$^+$ layer 16 having a stepwise impurity concentration profile. Then, as shown in FIG. 74, back surface electrode 18 is provided on a surface of n$^+$ layer 16 to complete PIN diode 2.

The present PIN diode 2 at recovery has carriers behaving, as will be described hereinafter. The present PIN diode has carriers behaving substantially in the same manner as a PIN diode having p$^+$ layer 10 provided at the entirety of the first major surface contacting front surface electrode 14 (see FIG. 58) does (see FIGS. 63-66), in that p$^+$ layer 10 is provided at p anode 8.

In particular, as the present PIN diode has p$^+$ layer 10 selectively provided, electrons and holes injected in the forward biased state (or at point T1) will have different density distributions (or carrier density profiles) for a region that has p$^+$ layer 10 and a region that does not have p$^+$ layer 10, respectively.

Figure 75:
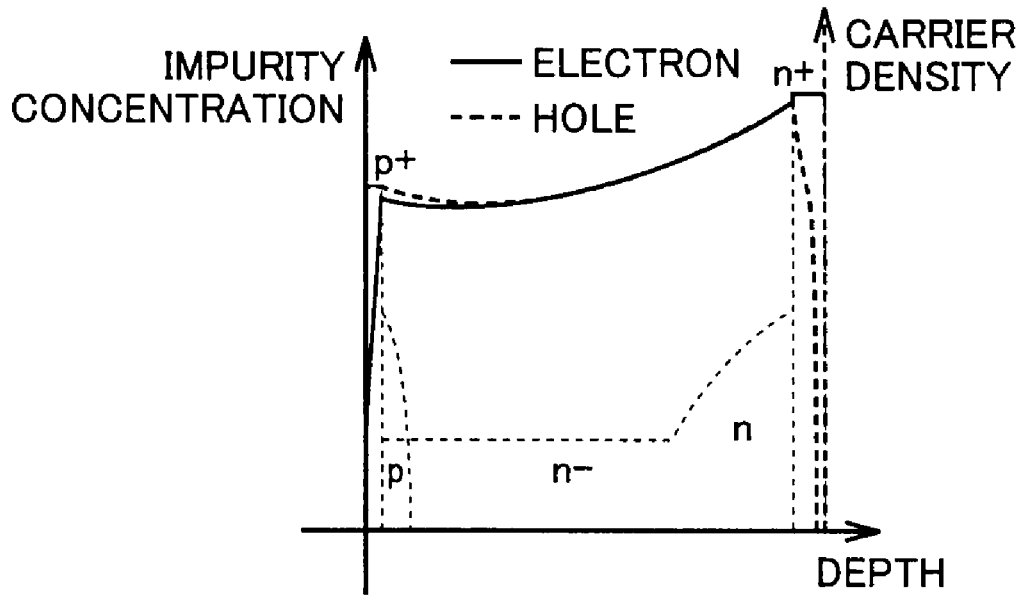
FIG. 75 shows a carrier density profile that the PIN diode in the fifth embodiment when it is forward biased has, as observed at a cross sectional line LXVIII-LXVIII shown in FIG. 67.
Figure 76:
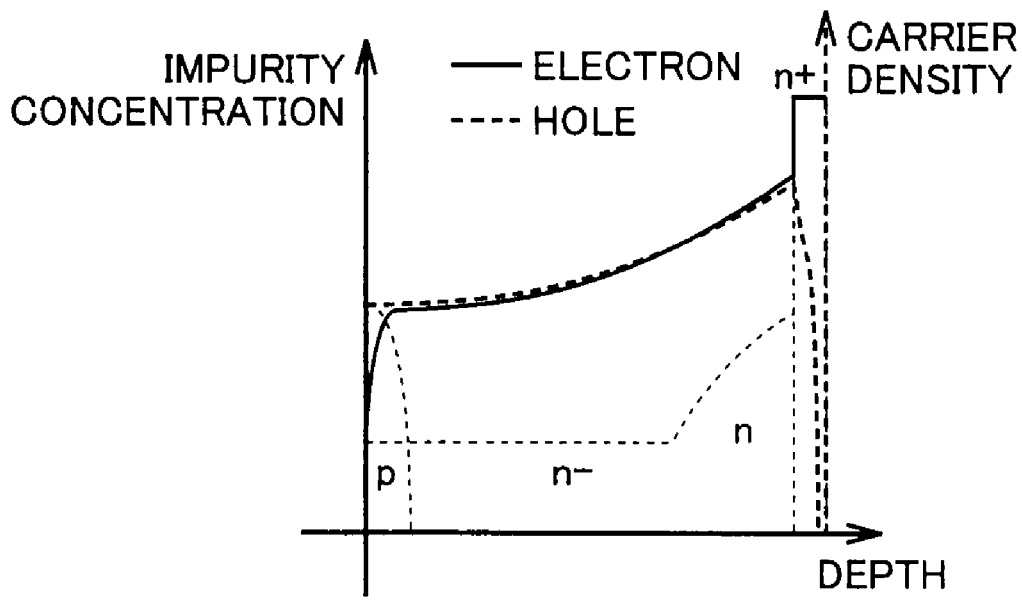
FIG. 76 shows a carrier density profile that the PIN diode in the fifth embodiment when it is forward biased has, as observed at a cross sectional line LXIX-LXIX shown in FIG. 67.

As shown in FIG. 75, a carrier density profile (profile A) along a cross sectional line passing through the p$^+$ layer indicates that the p$^+$ layer allows an increased carrier density associated with the anode, and also indicates that the n$^+$ layer allows an increased carrier density associated with the cathode. In contrast, as shown in FIG. 76, a carrier density profile (profile B) along a cross sectional line that does not pass through the p$^+$ layer indicates that the n$^+$ layer allows a carrier density associated with the cathode to be higher than that associated with the anode.

Thus, carriers having profile A and profile B as a whole will be injected into PIN diode 2. This means that the amount of carriers (holes) injected can be varied depending on the p$^+$ layer's area to adjust forward voltage, recovery loss, and the like.

More specifically, similarly as has been described for the PIN diode having a selectively provided n$^+$ layer (see FIG. 37), if the p$^+$ layer is formed to have a relatively increased area, an increased amount of carriers is injected and forward voltage (VF) decreases. However, as more carriers are injected, recovery loss (Erec) also increases accordingly. In contrast, if the p$^+$ layer is formed to have a relatively reduced area, a reduced amount of carriers is injected and recovery loss (Erec) decreases. However, forward voltage (VF) will increase (see FIG. 48). The present PIN diode 2 with a p$^+$ layer varying in area can thus adjust forward voltage, recovery loss and the like recovery characteristics, as desired, with precision to accommodate the inverter device applied.

Figure 77:
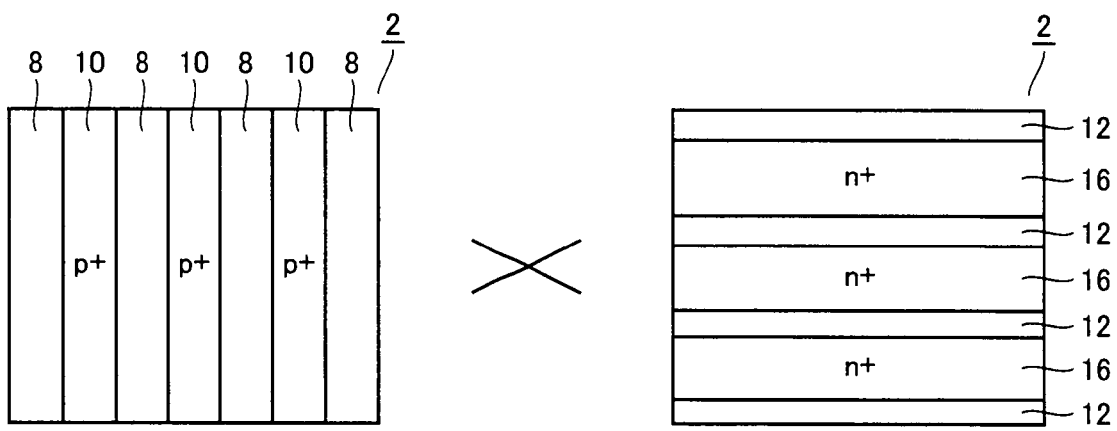
FIGS. 77 and 78 show in the fifth embodiment one and another examples, respectively, of combining selectively provided p$^+$ and n$^+$ layers each having various patterns.
Figure 78:
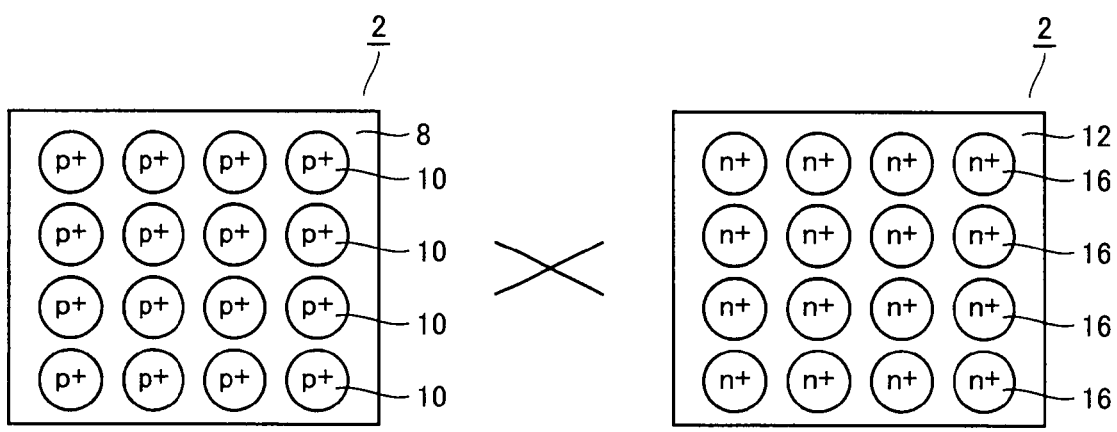

Furthermore, the PIN diode may have p$^+$ layer 10 and n$^+$ layer 16 both selectively provided. In that case, as shown in FIG. 77, p$^+$ layer 10 and n$^+$ layer 16 each provided for example in the form of a strip may have their respective strips combined in terms of width, number, or a direction in which each strip extends. Furthermore, as shown in FIG. 78, p$^+$ layer 10 and n$^+$ layer 16 each provided for example in the form of an island may have their respective islands combined in terms of geometry, area, or a ratio in area to a surface of an electrode. This can adjust forward voltage, recovery loss and the like recovery characteristics, as desired, with high precision to accommodate the inverter device applied.

The PIN diode thus obtained to accommodate the product applied can achieve longer life, reduced energy consumption, or reduced burden on environment. Furthermore, when the present diode is compared with an epitaxial diode, the former can be formed of reduced source material and fabricated through a simplified production process.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device, comprising:
a semiconductor substrate of a first conduction type having a first major surface and a second major surface opposite to each other;
an anode portion of a second conduction type adjacent to said first major surface of said semiconductor substrate;
a cathode portion of said first conduction type adjacent to said second major surface of said semiconductor substrate; and
a stepwise impurity layer provided at one of said anode portion and said cathode portion by introducing an impurity of a predetermined conduction type from one of said first major surface and said second major surface of said semiconductor substrate through to a first depth to provide a first region of said semiconductor substrate having said impurity of said predetermined conduction type introduced therein, said predetermined conduction type being a same conduction type as a conduction type of the one of said anode portion and said cathode portion, and by melting a second, predetermined region of said semiconductor substrate having a second depth deeper than said first depth and including said first region to make uniform said impurity of said predetermined conduction type in a concentration from said one of said first major surface and said second major surface through to said second depth to provide a uniform stepwise impurity concentration profile.

2. The semiconductor device according to claim 1, wherein said stepwise impurity layer is provided at said cathode portion.

3. The semiconductor device according to claim 2, having an on resistance in a forward biased state, adjusted by an impurity concentration of said anode portion and the concentration of said stepwise impurity layer.

4. The semiconductor device according to claim 2, having the concentration adjusted to allow said cathode portion to have a carrier density larger than that of said anode portion when the semiconductor device is turned on.

5. The semiconductor device according to claim 2, wherein said stepwise impurity layer is provided at said second major surface selectively.

6. The semiconductor device according to claim 2, wherein said cathode portion includes a buffer layer provided between said stepwise impurity layer and a region of said semiconductor substrate of said first conduction type and containing an impurity of said first conduction type gradually decreasing in a concentration as seen from said stepwise impurity layer to said region of said semiconductor substrate.

7. The semiconductor device according to claim 6, having a carrier density at a boundary between said region of said semiconductor substrate and said buffer layer, set to be maximized relative to an impurity concentration of said boundary when the semiconductor device is turned on.

8. The semiconductor device according to claim 2, wherein said anode portion is provided to have an impurity concentration gradually decreasing as seen from said first major surface to a predetermined depth.

9. The semiconductor device according to claim 1, wherein said stepwise impurity layer is provided at said anode portion.

10. The semiconductor device according to claim 9, wherein said anode portion includes an anode layer provided between said stepwise impurity layer and a region of said semiconductor substrate of said first conduction type and containing an impurity of said second conduction type gradually decreasing in a concentration as seen from said stepwise impurity layer to said region of said semiconductor substrate.

11. The semiconductor device according to claim 9, wherein said stepwise impurity layer is provided at said first major surface selectively.

12. The semiconductor device according to claim 1, wherein said stepwise impurity layer is provided at said cathode portion as a cathode-associated stepwise impurity layer and at said anode portion as an anode-associated stepwise impurity layer.

13. The semiconductor device according to claim 12, wherein:
said anode portion includes an anode layer provided between said anode-associated stepwise impurity layer and a region of said semiconductor substrate of said first conduction type and containing an impurity of said second conduction type gradually decreasing in a concentration as seen from said anode-associated stepwise impurity layer to said region of said semiconductor substrate; and
said cathode portion includes a buffer layer provided between said cathode-associated stepwise impurity layer and said region of said semiconductor substrate of said first conduction type and containing an impurity of said first conduction type gradually decreasing in a concentration as seen from said cathode-associated stepwise impurity layer to said region of said semiconductor substrate.

14. A semiconductor device, comprising:
a semiconductor substrate of a first conduction type having a first major surface and a second major surface opposite to each other;
an anode portion of a second conduction type adjacent to said first major surface of said semiconductor substrate;
a cathode portion of said first conduction type adjacent to said second major surface of said semiconductor substrate; and
a stepwise impurity layer at one of said anode portion and said cathode portion, and of a predetermined conduction type that is a same conduction type as a conduction type of the one of said anode portion and said cathode portion, the stepwise impurity layer having a uniform concentration of an impurity of said predetermined conduction type from said one of said first major surface and said second major surface to a predetermined depth.

15. The semiconductor device according to claim 14, wherein the stepwise impurity layer is provided at said one of said anode portion and said cathode portion by introducing the impurity from said one of said first major surface and said second major surface of said semiconductor substrate through to a first depth to provide a first region of said semiconductor substrate having said impurity introduced therein and by melting a second, predetermined region having a second depth deeper than said first depth and including said first region to make the uniform concentration of said impurity from said one of said first major surface and said second major surface through to said second depth to provide a uniform stepwise impurity concentration profile.

* * * * *